United States Patent
Kato et al.

(10) Patent No.: US 7,648,817 B2
(45) Date of Patent: Jan. 19, 2010

(54) POSITIVE WORKING RESIST COMPOSITION AND PATTERN FORMING METHOD

(75) Inventors: Takayuki Kato, Shizuoka (JP); Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 3 days.

(21) Appl. No.: 12/037,135

(22) Filed: Feb. 26, 2008

(65) Prior Publication Data
US 2008/0206669 A1 Aug. 28, 2008

(30) Foreign Application Priority Data
Feb. 27, 2007 (JP) ............................. 2007-047554

(51) Int. Cl.
*G03F 7/004* (2006.01)
*G03F 7/30* (2006.01)
*C08F 8/34* (2006.01)
*C08F 220/28* (2006.01)
*C08F 2/42* (2006.01)

(52) U.S. Cl. ................. 430/270.1; 430/326; 525/330.4; 525/350; 525/386; 526/84; 526/85; 526/281

(58) Field of Classification Search ............. 430/270.1, 430/326, 905, 910; 526/84, 85, 280, 281; 525/330.4, 350, 386
See application file for complete search history.

(56) References Cited

U.S. PATENT DOCUMENTS

| 4,491,628 | A | * | 1/1985 | Ito et al. ..................... 430/176 |
| 7,252,924 | B2 | * | 8/2007 | Yamanaka et al. ........ 430/270.1 |
| 2006/0068324 | A1 | * | 3/2006 | Mita ....................... 430/270.1 |
| 2007/0190449 | A1 | * | 8/2007 | Momose et al. .......... 430/270.1 |

FOREIGN PATENT DOCUMENTS

| JP | 11-119434 A | 4/1999 |
| JP | 2000-214587 A | 8/2000 |
| JP | 2001-98034 A | 4/2001 |
| JP | 2003-167347 A | 6/2003 |
| JP | 2003-223001 A | 8/2003 |
| JP | 2005-37893 A | 2/2005 |
| JP | 2006-91762 A | 4/2006 |
| WO | 2005/085301 A1 | 9/2005 |

* cited by examiner

*Primary Examiner*—John S Chu
(74) *Attorney, Agent, or Firm*—Sughrue Mion, PLLC

(57) ABSTRACT

A positive working resist composition comprises a specific resin. The specific resin comprises: a repeating unit having a first specific group; and a repeating unit having a second specific group, the first specific group being different from the second specific group; and a specific structure in an end terminal of the resin. The specific resin decomposes by action of an acid to increase its solubility in an alkaline developer.

5 Claims, No Drawings

POSITIVE WORKING RESIST COMPOSITION AND PATTERN FORMING METHOD

BACKGROUND OF THE INVENTION

1. Field of the Invention

The present invention relates to a positive working resist composition which causes a reaction upon irradiation with actinic rays or radiation to change properties, to a pattern forming method using the positive working resist composition and to a compound to be used in the positive working resist composition. In more detail, the invention relates to a positive working resist composition which is used in a manufacturing step of a semiconductor device such as IC, in the manufacture of a circuit board of a liquid crystal, a thermal head and the like and other fabrication steps, lithographic printing plates and acid-curable compositions, to a pattern forming method using the positive working resist composition and to a compound to be used in the positive working resist composition.

2. Description of the Related Art

In recent years, in an integrated circuit, the degree of integration is increasing more and more. In the manufacture of a semiconductor substrate such as VLIS, processing of an ultrafine pattern composed of a line width of not more than a half-micron has become necessary. In order to fulfill its necessity, the wavelength to be used in an exposure apparatus which is used for the photolithography is shortened more and more, and nowadays, it is studied to use an excimer laser beam (for example, XeCl, KrF and ArF) having a short wavelength among far ultraviolet lights. As a material which is used for the pattern formation of lithography in this wavelength region, a chemical amplification system resist is exemplified.

In the case where a KrF excimer laser is used as an exposure light source, since a resin having small absorption chiefly in a region of 248 nm and having poly(hydroxystyrene) as a basic skeleton is used as the major component, a satisfactory pattern with high sensitivity and high resolution is formed, and a satisfactory system is revealed as compared with a related-art naphthoquinone/novolak resin system.

On the other hand, in the case where a light source having a shorter wavelength, for example, an ArF excimer laser (193 nm) is used as an exposure light source, since a compound having an aromatic group exhibits large absorption essentially in a 193 nm region, it was not sufficient even in the foregoing chemical amplification system.

For that reason, a resist used for ArF excimer laser containing a resin having an alicyclic hydrocarbon structure has been developed.

For example, JP-A-2003-167347 and JP-A-2003-223001 describe a composition containing a resin having a polycyclic acid-decomposable repeating unit and a non-acid-decomposable repeating unit. Such a resin is a chemical amplification type resist having a protective group which is dissociable by an acid and is instable against an acid. Under a circumstance that the realization of a much finer resist pattern is demanded, however, it has become difficult to obtain sufficient resist performance only by using such a protective group singly.

Then, for example, JP-A-11-119434 discloses a positive working resist composition containing a resin having two kinds of repeating units having an acid-decomposable group.

Also, as described in JP-A-2005-37893, JP-A-2001-98034 and JP-A-2000-214587, a resist polymer in which a crosslinking site which is dissociable by an acid is introduced into a side chain of a resin containing a repeating unit having an acid-dissociable protective group is studied.

This resides in the matter that when a crosslinking bond is cleaved by an acid catalyst, a dissolution contrast between an exposed area and an unexposed area is enhanced. However, in polymerization of the polymer, a bifunctional monomer such as diacrylates is used, and a crosslinking reaction in a side chain of a high-molecular weight chain follows. Therefore, the molecular weight distribution of a formed polymer is extremely large, the solubility is poor, and a polymer having an ultrahigh molecular weight is easily formed. Thus, there was a problem that even after the decomposition with an acid, a sparingly soluble high-molecular weight component which is hardly dissolved in an alkaline developer is present, whereby pattern collapse is easily generated due to the presence of this foregoing substance.

Also, as described in JP-A-2001-98034, in the case where a crosslinked polymer having a crosslinking site having an acetal skeleton which is instable against an acid in a high-molecular weight side chain thereof is used as a resist polymer, there was a tendency that the storage stability is poor because of very high sensitivity to an acid.

On the other hand, for example, as described in JP-A-2006-91762 and WO 2005/085301A1, a positive working photosensitive resin having an acid-dissociable structure introduced in a high-molecular weight principal chain thereof is proposed. Though such a proposal is a proposal for solving the foregoing problem of a side chain crosslinking type polymer, its effect was still insufficient.

SUMMARY OF THE INVENTION

In view of the foregoing background, the invention has been made, and its object is to provide a positive working resist composition to be used for the formation of a fine pattern in, for example, the manufacture of semiconductors, which has high sensitivity as compared with products of the related art and which is able to make pattern collapse properties and scattering properties in line width (LWR) compatible with each other and a pattern forming method using this positive working resist composition.

The present inventors made extensive and intensive investigations regarding constitutional materials of a positive working chemical amplification system resist composition. As a result, it has been found that the object of the invention is achieved by using a resin having a specified end terminal structure and plural kinds of specified acid-decomposable groups, leading to accomplishment of the invention. That is, the foregoing object is achieved by the following configurations.

(1) A positive working resist composition comprising:

(A) a resin comprising: a repeating unit having a first group represented by any of general formulae (pI) to (pV); and a repeating unit having a second group represented by any of general formulae (pI) to (pV), the first group being different from the second group; and a structure represented by formula (1) in an end terminal of the resin, in which the resin decomposes by action of an acid to increase its solubility in an alkaline developer, (B) a compound capable of generating an acid upon irradiation with actinic rays or radiation, and (C) a solvent.

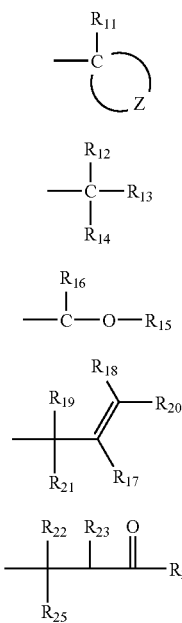

(pI)

(pII)

(pIII)

(pIV)

(pV)

wherein $R_{11}$ represents an alkyl group or a cycloalkyl group,

Z represents an atomic group necessary for forming a cycloalkyl group together with a carbon atom, $R_{12}$ to $R_{16}$ each independently represents an alkyl group or a cycloalkyl group, provided that at least one of $R_{12}$ to $R_{14}$ represents a cycloalkyl group and that either $R_{15}$ or $R_{16}$ represents a cycloalkyl group, $R_{17}$ to $R_{21}$ each independently represents a hydrogen atom, an alkyl group or a cycloalkyl group, provided that at least one of $R_{17}$ to $R_{21}$ represents a cycloalkyl group and that either $R_{19}$ or $R_{21}$ represents an alkyl group or a cycloalkyl group, and $R_{22}$ to $R_{25}$ each independently represents a hydrogen atom, an alkyl group or a cycloalkyl group, provided that at least one of $R_{22}$ to $R_{25}$ represents a cycloalkyl group and that $R_{23}$ and $R_{24}$ may be taken together to form a ring.

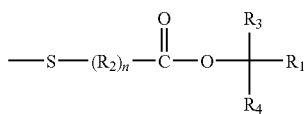

(1)

wherein $R_1$ represents an alkyl group, a cycloalkyl group or an aryl group, $R_2$ represents an alkylene group, a cycloalkylene group or an arylene group, $R_3$ and $R_4$ each independently represents a hydrogen atom, an alkyl group, a cycloalkyl group, an alkenyl group or an aryl group, provided that at least one of $R_3$ and $R_4$ is not a hydrogen atom and that $R_3$ or $R_4$ may be bound to adjacent $R_1$ to form a ring structure, and n represents 0 or 1.

(2) The positive working resist composition as set forth in (1), wherein the resin (A) further has a lactone group-containing repeating unit.

(3) The positive working resist composition as set forth in (1) or (2), wherein the resin (A) further has a repeating unit having a polar group-substituted alicyclic hydrocarbon structure.

(4) The positive working resist composition as set forth in any one of (1) to (3), wherein the component (A) further has an alkali-soluble group-containing repeating unit.

(5) A pattern forming method comprising: forming a film by the positive working resist composition as set forth in any one of (1) to (4); and exposing and developing the film.

DETAILED DESCRIPTION OF THE INVENTION

Components used in the embodiments of the invention are hereunder described.

In this specification, with respect to the expressions of a group (atomic group), any expression not explicitly showing "substituted" or "unsubstituted" includes both one not having a substituent and one having a substituent. For example, the term "alkyl group" includes not only an alkyl group not having a substituent (unsubstituted alkyl group) but an alkyl group having a substituent (substituted alkyl group).

[1] (A) Resin which decomposes by action of an acid to increase its solubility in an alkaline developer:

The resin (A) has a structure represented by the following general formula (1) in an end terminal thereof.

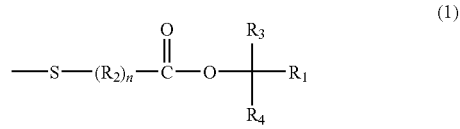

(1)

In the general formula (1), $R_1$ represents an alkyl group, a cycloalkyl group or an aryl group, $R_2$ represents an alkylene group, a cycloalkylene group or an arylene group, $R_3$ and $R_4$ each independently represents a hydrogen atom, an alkyl group, a cycloalkyl group, an alkenyl group or an aryl group, provided that at least one of $R_3$ and $R_4$ is not a hydrogen atom and that $R_3$ or $R_4$ may be bound to adjacent $R_1$ to form a ring structure, and n represents 0 or 1.

In the general formula (1), $R_1$ is preferably an alkyl group having from 1 to 20 carbon atoms, a cycloalkyl group having from 3 to 20 carbon atoms or an aryl group having from 1 to 20 carbon atoms; more preferably an alkyl group having from 6 to 20 carbon atoms or a cycloalkyl group having from 6 to 20 carbon atoms; and especially preferably a cycloalkyl group having from 6 to 20 carbon atoms, for example, a norbornane group and an adamantane group. The aryl group may have a hetero atom. Examples of the aryl group having a hetero atom include a monovalent thiazoline ring group (a group formed when one hydrogen atom is eliminated from a thiazoline ring, hereinafter the same), a monovalent oxazoline ring group and a monovalent imidazoline ring group.

$R_2$ is preferably an alkylene group having from 1 to 10 carbon atoms, a cycloalkylene group having from 3 to 10 carbon atoms or an arylene group having from 1 to 10 carbon atoms; and more preferably an alkylene group having from 6 to 10 carbon atoms or a cycloalkylene group having from 6 to 10 carbon atoms. The arylene group may have a hetero atom. Examples of the arylene group having a hetero atom include a divalent thiazoline ring group (a group formed when two hydrogen atoms are eliminated from a thiazoline ring, hereinafter the same), a divalent oxazoline ring group and a divalent imidazoline ring group.

$R_3$ and $R_4$ are each preferably independently a methyl group, an ethyl group, a propyl group or an isobutyl group.

Each of $R_1$, $R_2$, $R_3$ and $R_4$ may have a substituent such as a hydroxyl group, an alkoxy group and a halogen atom.

Examples of the ring structure which $R_3$ or $R_4$ is bound to adjacent $R_1$ to form include an adamantyl group and a cyclohexyl group.

The ring structure which $R_3$ or $R_4$ is bound to adjacent $R_1$ to form may have a substituent such as a hydroxyl group, an alkoxy group and a halogen atom.

The resin (A) is a resin which decomposes by action of an acid to increase its solubility in an alkaline developer and has a group which decomposes by action of an acid to become an alkali-soluble group (hereinafter also referred to as "acid-decomposable group") in either one or both of the principal chain and the side chain of the resin. Above all, a resin having an acid-decomposable group in a side chain thereof is more preferable.

The acid-decomposable group is preferably a group resulting from substitution of a hydrogen atom of an alkali-soluble group such as a —COOH group and an —OH group with a group capable of being split off by an acid.

Examples of the group capable of being split off by an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, $R_{36}$ to $R_{39}$ each independently represents an alkyl group, a cycloalkyl group, an aryl group, an aralkyl group or an alkenyl group. $R_{36}$ and $R_{37}$, $R_{36}$ and $R_{39}$ may be taken together to form a ring.

$R_{01}$ to $R_{02}$ each independently represents a hydrogen atom, an alkyl group, a cycloalkyl group, an aryl group, an aralkyl group or an alkenyl group.

In the invention, the acid-decomposable group is preferably an acetal group or a tertiary ester group.

The resin (A) has a repeating unit having a first group selected among the following general formulae (pI) to (pV) and a repeating unit having a second group selected among the following general formulae (pI) to (pV) but different from the first group.

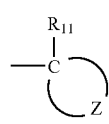
(pI)

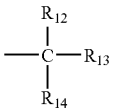
(pII)

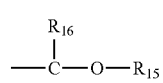
(pIII)

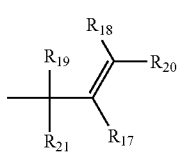
(pIV)

-continued

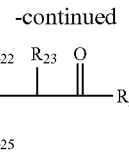
(pV)

In the general formulae (pI) to (pV), $R_{11}$ represents an alkyl group or a cycloalkyl group, Z represents an atomic group necessary for forming a cycloalkyl group together with a carbon atom, $R_{12}$ to $R_{16}$ each independently represents an alkyl group or a cycloalkyl group, provided that at least one of $R_{12}$ to $R_{14}$ represents a cycloalkyl group and that either $R_{15}$ or $R_{16}$ represents a cycloalkyl group, $R_{17}$ to $R_{21}$ each independently represents a hydrogen atom, an alkyl group or a cycloalkyl group, provided that at least one of $R_{17}$ to $R_{21}$ represents a cycloalkyl group and that either $R_{19}$ or $R_{21}$ represents an alkyl group or a cycloalkyl group, and $R_{22}$ to $R_{25}$ each independently represents a hydrogen atom, an alkyl group or a cycloalkyl group, provided that at least one of $R_{22}$ to $R_{25}$ represents a cycloalkyl group and that $R_{23}$ and $R_{24}$ may be taken together to form a ring.

In the general formulae (pI) to (pV), the alkyl group represented by $R_{11}$ to $R_{25}$ is preferably a linear or branched alkyl group having from 1 to 8 carbon atoms, for example, a methyl group, an ethyl group, a propyl group, an n-butyl group, a sec-butyl group and a t-butyl group.

In $R_{11}$ to $R_{25}$, the cycloalkyl group or the cycloalkyl group formed by Z and a carbon atom may be monocyclic or polycyclic. Specific examples thereof include groups having a monocyclo, bicyclo, tricyclo or tetracyclo structure having 5 or more carbon atoms. The carbon atom number is preferably from 6 to 30, and especially preferably from 7 to 25. The cycloalkyl group may have an unsaturated double bond in the ring thereof. The cycloalkyl group may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Of these, an adamantyl group, a norbornyl group, a cyclohexyl group, a cyclopentyl group, a tetracyclododecanyl group and a tricyclodecanyl group are more preferable.

Each of these alkyl group and cycloalkyl group may further have a substituent. Examples of the substituent which each of the alkyl group and the cycloalkyl group may further have include an alkyl group (having from 1 to 4 carbon atoms), a halogen atom, a hydroxyl group, an alkoxy group (having from 1 to 4 carbon atoms), a carboxyl group and an alkoxycarbonyl group (having from 2 to 6 carbon atoms). Each of the foregoing alkyl group, alkoxy group and alkoxycarbonyl group or the like may further have a substituent. Examples of the substituent which each of the foregoing alkyl group, alkoxy group and alkoxycarbonyl group or the like may further have include a hydroxyl group, a halogen atom and an alkoxy group.

In the resin (A), the first group selected among the general formulae (PI) to (pV) and the second group selected among the general formulae (pI) to (pV) are different from each other.

What the first group and the second group are different from each other includes not only the case where these groups are represented by a different general formula from each other but the case where these groups are represented by the same general formula but have a different substituent, with the former being more preferable. For example, in the groups represented by the general formula (pI), $R_{11}$ or Z may be different; and in the groups represented by the general formula (pII), at least one of $R_{12}$, $R_{13}$ and $R_{14}$ may be different. In these cases, it is more preferable that one of the groups is a group represented by the general formula (pI), with the other being a group represented by the general formula (pII).

In the invention, it is preferable that at least one of the first group and the second group has not more than 10 carbon atoms; and it is more preferable that both the first group and the second group have not more than 10 carbon atoms, respectively.

The combination of the first group selected among the general formulae (pI) to (pV) and the second group selected among the general formulae (pI) to (pV) is preferably a combination of two kinds in which at least one of the first group and the second group is selected among the general formulae (pI), (pII) and (pV); more preferably a combination of two kinds in which both the first group and the second group are selected among the general formulae(pI), (pII) and (pV); and further preferably a combination of two kinds in which the first group and the second group are selected from the general formulae (pI) and (pII), respectively.

The groups represented by the general formulae (pI) to (pV) in the foregoing resin can be used for protecting the alkali-soluble group. Examples of the alkali-soluble group include various groups which are known in this technical field.

Specific examples thereof include structures resulting from substitution of a hydrogen atom of a carboxylic group, a sulfonic group, a phenol group or a thiol group with the group represented by any of the general formulae (pI) to (pV). Of these, structures resulting from substitution of a hydrogen atom of a carboxylic group or a sulfonic group with the group represented by any of the general formulae (pI) to (pV) are preferable.

The repeating unit having an alkali-soluble group protected by the group represented by any of the general formulae (pI) to (pV) is preferably a repeating unit represented by the following general formula (pA).

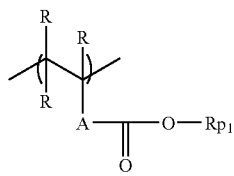

(pA)

In the general formula (pA),

R represents a hydrogen atom, a halogen atom or a linear or branched alkyl group having from 1 to 4 carbon atoms. Plural Rs may be the same or different.

A represents a single group selected from the group consisting of a single bond, an alkylene group, an ether group, a thioether group, a carbonyl group, an ester group, an amide group, a sulfonamide group, a urethane group and a urea group or a combination of two or more of these groups. A is preferably a single bond.

$Rp_1$ represents a group represented by any of the general formulae (pI) to (pV).

The repeating unit represented by the general formula (pA) is most preferably a repeating unit derived from a 2-alkyl-2-adamantyl(meth)acrylate or a dialkyl-(1-adamantyl)methyl (meth)acrylate.

Specific examples of the repeating unit represented by the general formula (pA) are given below.

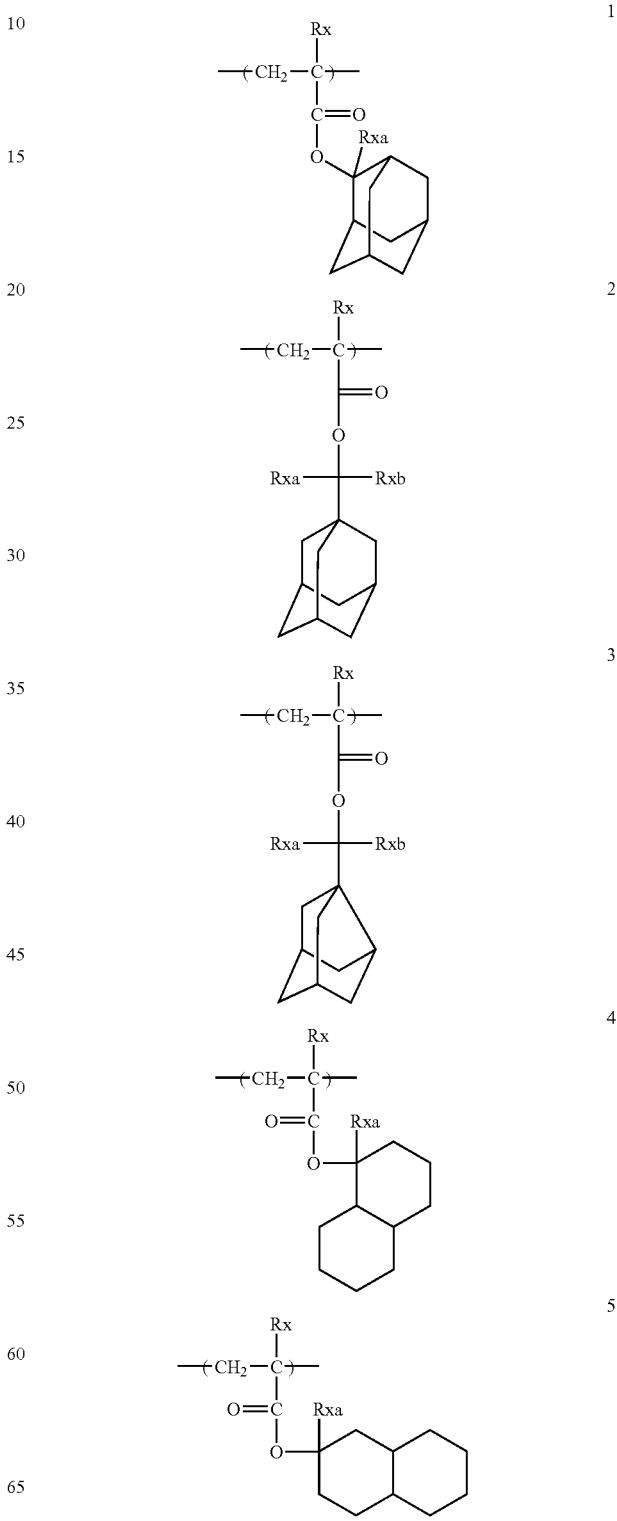

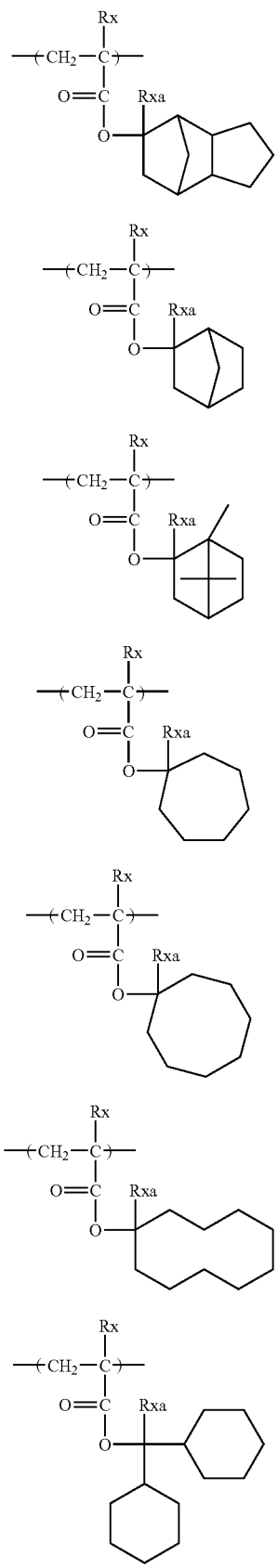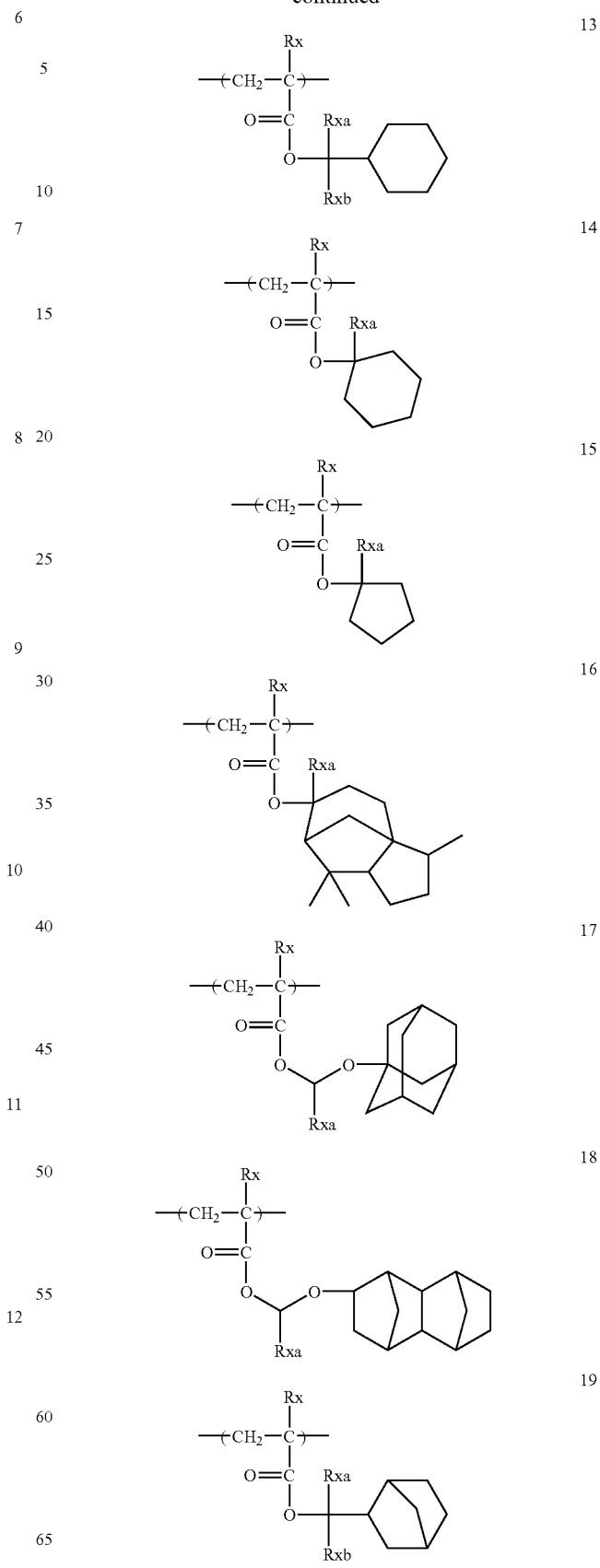

-continued

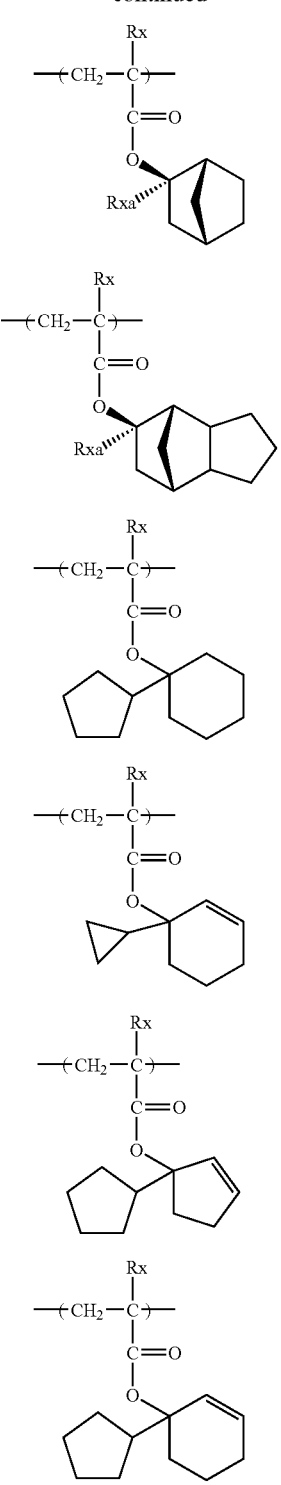

In the foregoing respective structural formulae, Rx represents H, $CH_3$, $CF_3$ or $CH_2OH$; and Rxa and Rxb each independently represents an alkyl group having from 1 to 4 carbon atoms.

Also, it is preferable that a high-molecular weight compound manufactured by the manufacturing method of the invention has a lactone group. Any group is useful as the group having a lactone structure so far as it has a lactone structure. Preferred examples thereof include a group having a 5-membered to 7-membered ring lactone structure, and a group in which a 5-membered to 7-membered ring lactone structure is fused with other ring structure in a form of forming a bicyclo structure or a spiro structure is preferable. As the group having a lactone structure, a group having a lactone structure represented by any of the following general formulae (LC1-1) to (LC1-16) is more preferable. Also, the group having a lactone structure may be bound directly to the principal chain. Above all, (LC1-1), (LC1-4), (LC1-5), (LC1-6), (LC1-13) and (LC1-14) are preferable as the lactone structure, and by using a specified lactone structure, the line edge roughness and development defect become satisfactory.

LC1-1
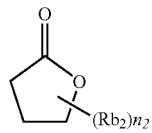

LC1-2
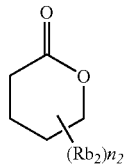

LC1-3
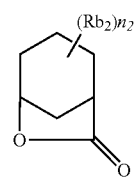

LC1-4
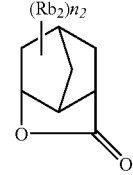

LC1-5
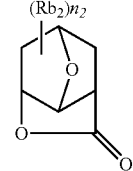

LC1-6
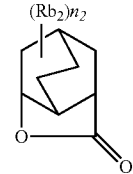

LC1-7
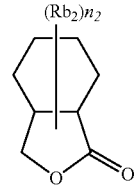

-continued

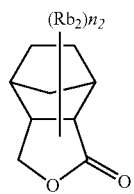
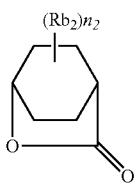
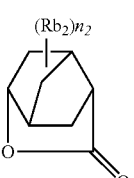
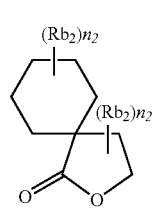
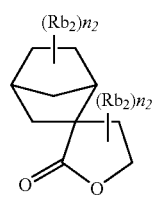
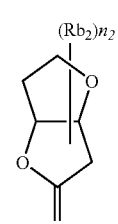
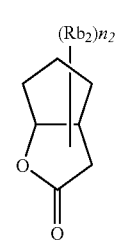
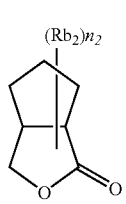

-continued

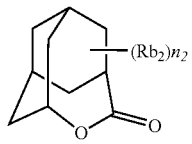

The lactone structure moiety may or may not have a substituent ($Rb_2$). Preferred examples of the substituent ($Rb_2$) include an alkyl group having from 1 to 8 carbon atoms, a cycloalkyl group having from 4 to 7 carbon atoms, an alkoxy group having from 1 to 8 carbon atoms, an alkoxycarbonyl group having from 1 to 8 carbon atoms, a carboxyl group, a halogen atom, a hydroxyl group, a cyano group and an acid-decomposable group. $n_2$ represents an integer of from 0 to 4. When $n_2$ is 2 or more, the plural existing substituents ($Rb_2$) may be the same or different; and the plural existing substituents ($Rb_2$) may be taken together to form a ring.

Examples of the repeating unit having a group having a lactone structure represented by any of the general formulae (LC1-1) to (LC1-16) include a repeating unit in which at least one of $R_{13}'$ to $R_{16}'$ in the foregoing general formula (II-AB1) or (II-AB2) is a group having a lactone structure represented by any of the general formulae (LC1-1) to (LC1-16) (for example, $R_5$ of —$COOR_5$ is a group having a lactone structure represented by any of the general formulae (LC1-1) to (LC1-16)) and a repeating unit represented by the following general formula (AI).

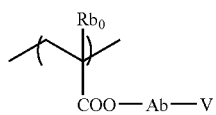

(AI)

In the general formula (AI), $Rb_0$ represents a hydrogen atom, a halogen atom or an alkyl group having from 1 to 4 carbon atoms. Preferred examples of a substituent which the alkyl group represented by $Rb_0$ may have include a hydroxyl group and a halogen atom.

Examples of the halogen atom represented by $Rb_0$ include a fluorine atom, a chlorine atom, a bromine atom and an iodine atom.

$Rb_0$ is preferably a hydrogen atom or a methyl group.

Ab represents a single bond, an alkylene group, a divalent connecting group having a monocyclic or polycyclic alicyclic hydrocarbon structure, an ether group, an ester group, a carbonyl group, a carboxyl group or a divalent group composed of a combination thereof. Ab is preferably a single bond or a connecting group represented by -$Ab_1$-$CO_2$—. $Ab_1$ represents a linear or branched alkylene group or a monocyclic or polycyclic cycloalkylene group, and preferably a methylene group, an ethylene group, a cyclohexyl group, an adamantyl group or a norbornyl group.

V represents a group having a lactone structure represented by any of the general formulae (LC1-1) to (LC1-16).

With respect to the repeating unit having a lactone structure, optical isomers usually exist, and any optical isomer is useful. Also, one kind of an optical isomer may be used singly, and a mixture of plural optical isomers may be used. In the case of chiefly using one kind of an optical isomer, its optical purity (ee) is preferably 90 or more, and more preferably 95 or more.

The content of the constitutional unit having a lactone structure is preferably from 15 to 60% by mole, more preferably from 20 to 50% by mole, and further preferably from 30 to 50% by mole relative to the whole of the constitutional units in the polymer.

Specific examples of the repeating unit having a lactone structure are given below, but it should not be construed that the invention is limited thereto.

(In the formulae, Rx represents H, CH₃, CH₂OH or CF₃.)

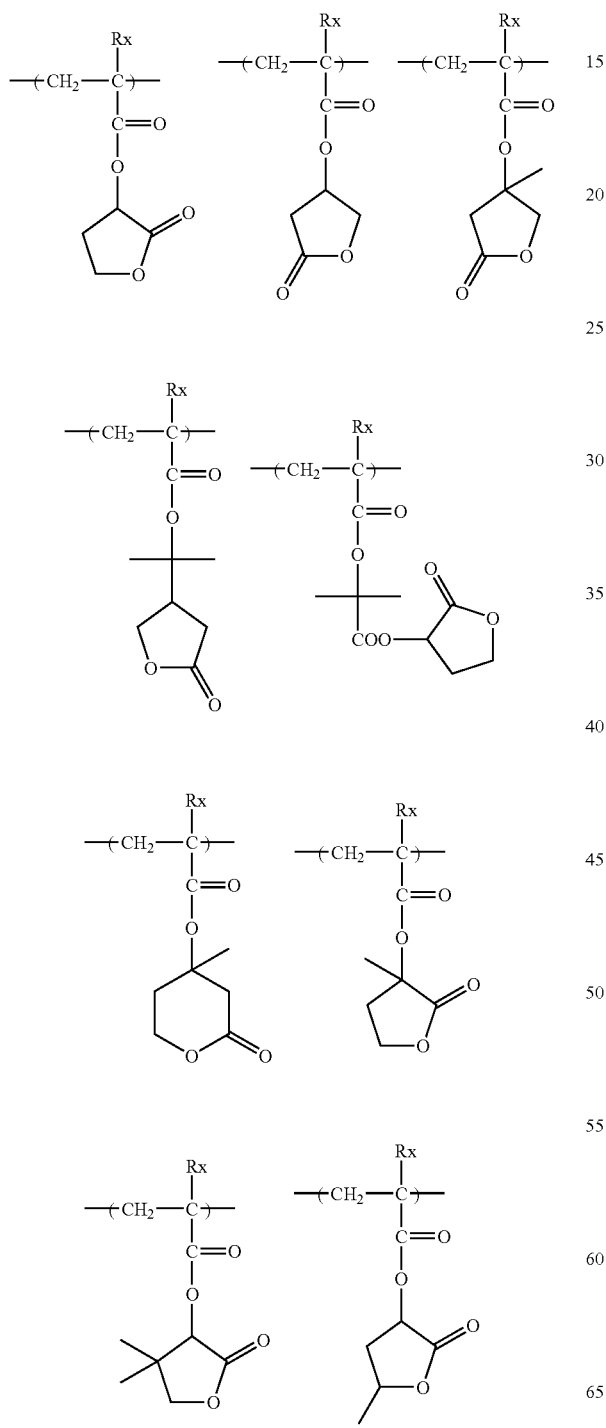
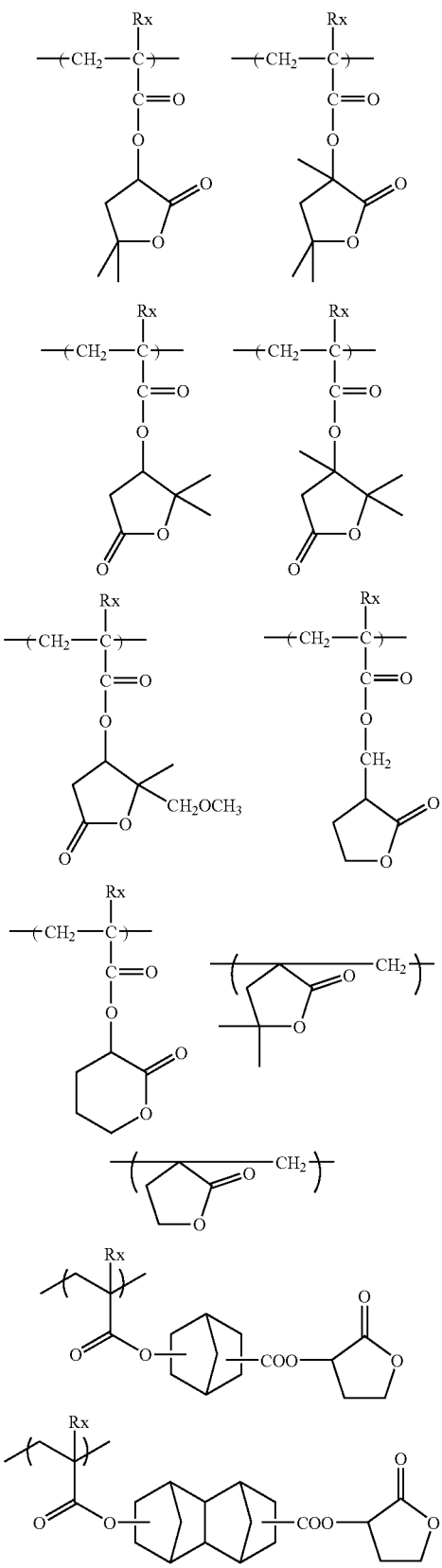

-continued
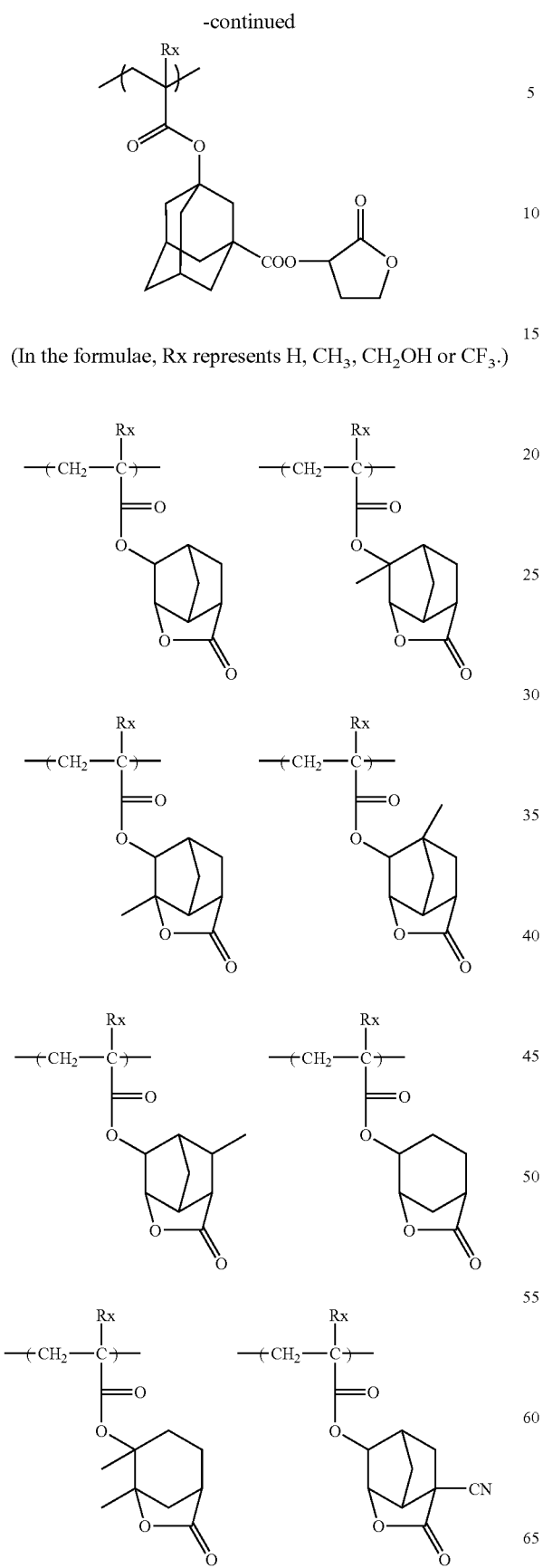
(In the formulae, Rx represents H, CH$_3$, CH$_2$OH or CF$_3$.)
-continued
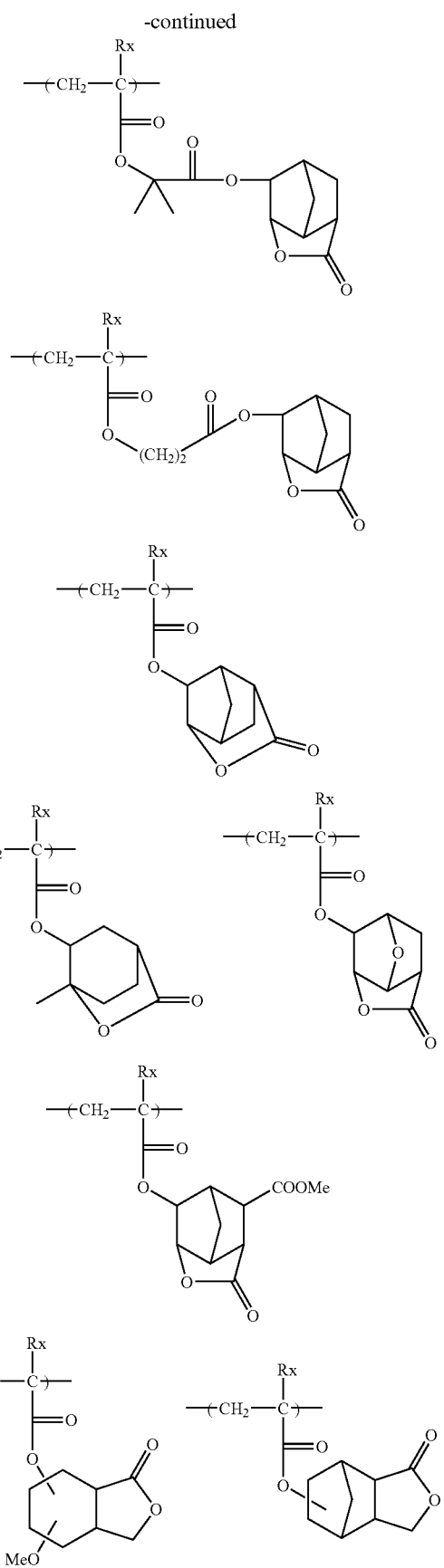

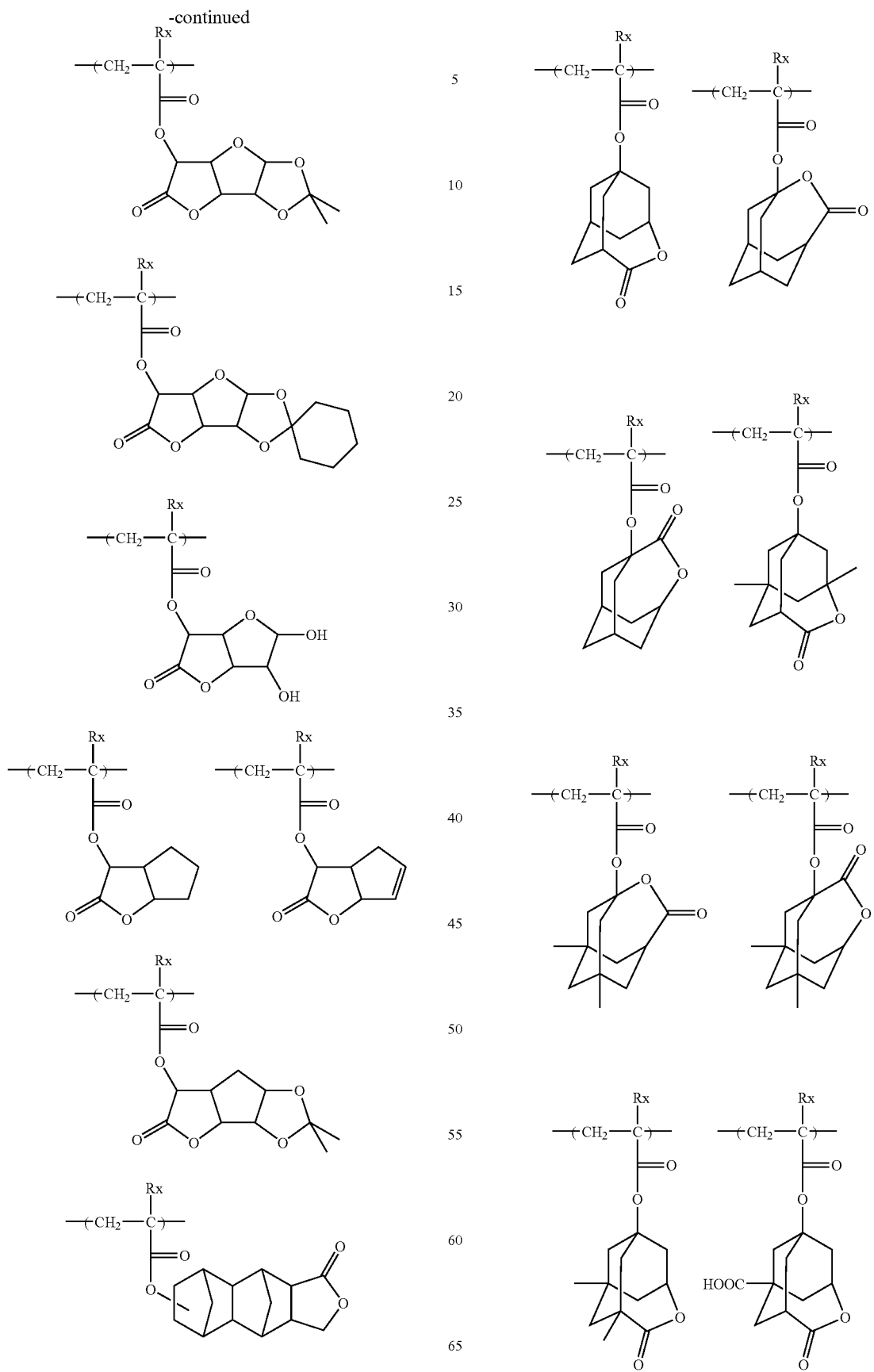
(In the formulae, Rx represents H, CH$_3$, CH$_2$OH or CF$_3$.)

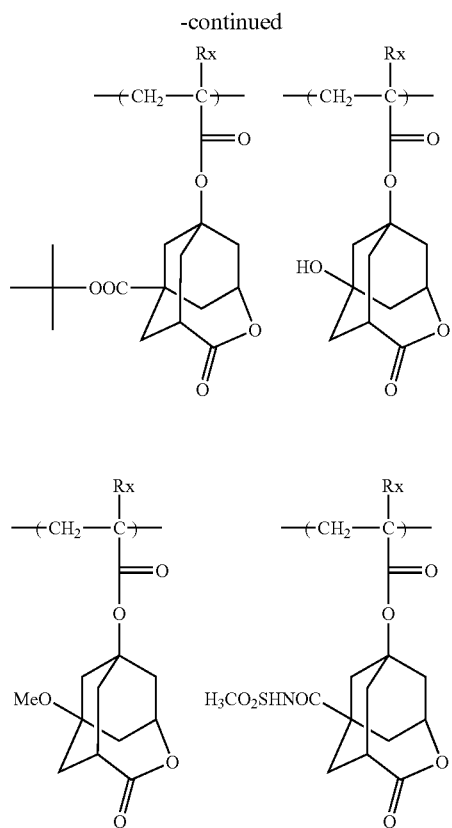

As the especially preferred constitutional unit having a lactone group, the following constitutional units are exemplified. By choosing an optimal lactone structure, the pattern profile and density distribution dependency become satisfactory.

(In the formulae, Rx represents H, $CH_3$, $CH_2OH$ or $CF_3$.)

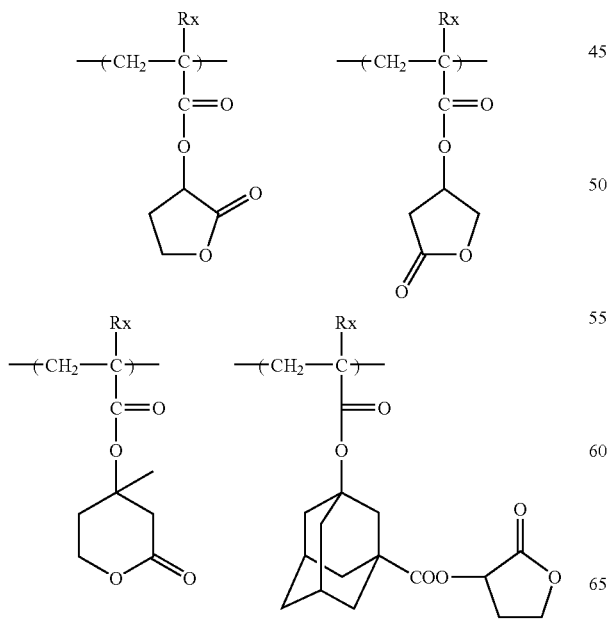

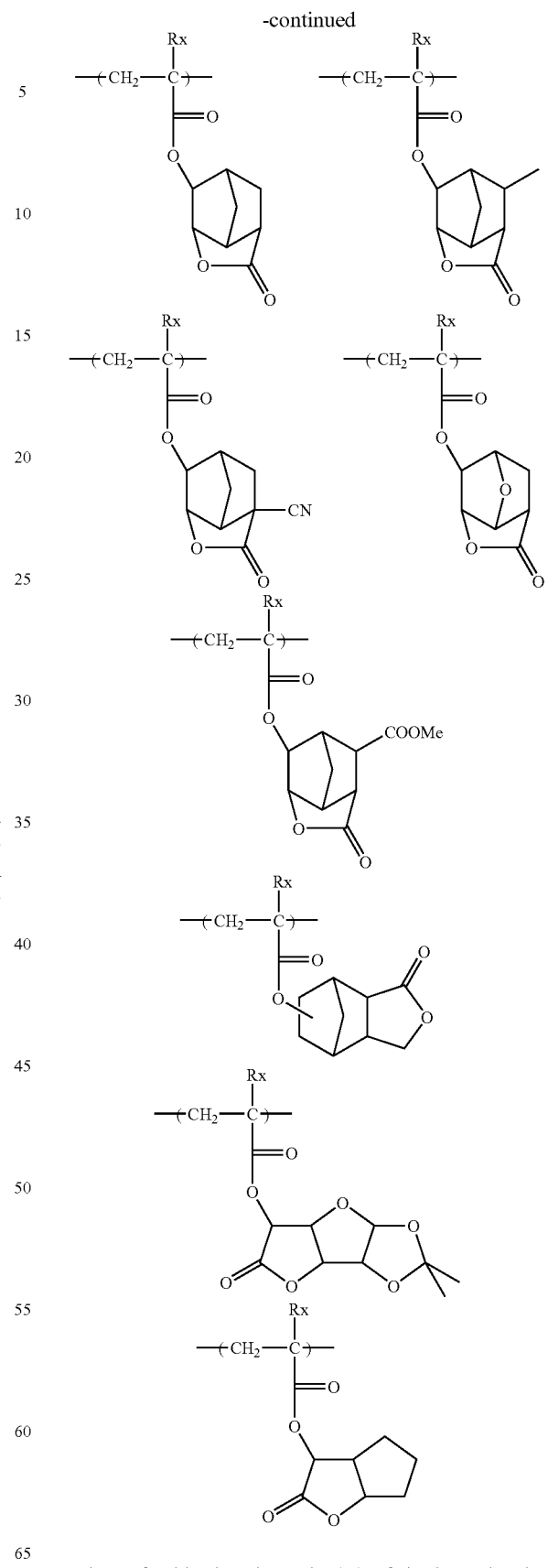

It is preferable that the resin (A) of the invention has a repeating unit having a group having a polar group-substituted alicyclic hydrocarbon structure. According to this, the adhesiveness to a substrate and the affinity with a developer are enhanced. The polar group is preferably a hydroxyl group or a cyano group.

Preferred examples of the polar group-substituted alicyclic hydrocarbon structure include structures represented by the following general formula (VIIa) or (VIIb).

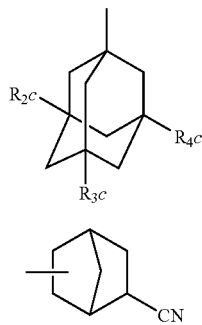

In the general formula (VIIa), $R_{2C}$ to $R_{4C}$ each independently represents a hydrogen atom, a hydroxyl group or a cyano group, provided that at least one of $R_{2C}$ to $R_{4C}$ represents a hydroxyl group or a cyano group. It is preferable that one or two of $R_{2C}$ to $R_{4C}$ are a hydroxyl group, with the remainder being a hydrogen atom. It is more preferable that two of $R_{2C}$ to $R_{4C}$ are a hydroxyl group, with the remainder being a hydrogen atom.

The group represented by the general formula (VIIa) is preferably a dihydroxy body or a monohydroxy body, and more preferably a dihydroxy body.

Examples of the repeating unit represented by the general formula (VIIa) or (VIIb) include a repeating unit in which at least one of $R_{13}'$ to $R_{16}'$ in the following general formula (II-AB1) or (II-AB2) is the group represented by the foregoing general formula (VIIa) or (VIIb) (for example, $R_5$ of —$COOR_5$ is the group represented by the general formulae (VIIa) or (VIIb)) and a repeating unit represented by the following general formula (AIIa) or (AIIb).

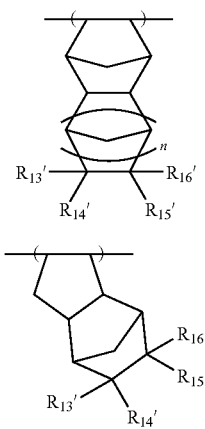

In the general formulae (II-AB1) and (II-AB2), $R_{13}'$ to $R_{16}'$ each independently represents a hydrogen atom, a halogen atom, a cyano group, —COOH, —$COOR_5$, a group which decomposes by action of an acid, —C(=O)—X—A'—$R_{17}'$, an alkyl group or a cycloalkyl group, provided that at least two of $R_{13}'$ to $R_{16}'$ may be taken together to form a ring.

Here, $R_5$ represents an alkyl group, a cycloalkyl group or a group having a lactone structure, X represents an oxygen atom, a sulfur atom, —NH—, —$NHSO_2$— or —$NHSO_2NH$—, A' represents a single bond or a divalent connecting group, $R_{17}'$ represents —COOH, —$COOR_5$, —CN, a hydroxyl group, an alkoxy group, —CO—NH—$R_6$, —CO—NH—$SO_2$—$R_6$ or a group having a lactone structure, $R_6$ represents an alkyl group or a cycloalkyl group, and n represents 0 or 1.

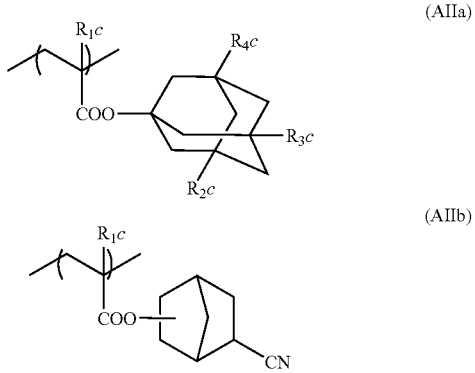

In the general formulae (AIIa) and (AIIb), $R_{1c}$ represents a hydrogen atom, a methyl group, a trifluoromethyl group or a hydroxymethyl group, and $R_{2c}$ to $R_{4c}$ are synonymous with $R_{2c}$ to $R_{4c}$ in the general formula (VIIa).

Specific examples of the repeating unit of a polar group-substituted alicyclic hydrocarbon structure represented by the general formula (AIIa) or (AIIb) are given below, but it should not be construed that the invention is limited thereto.

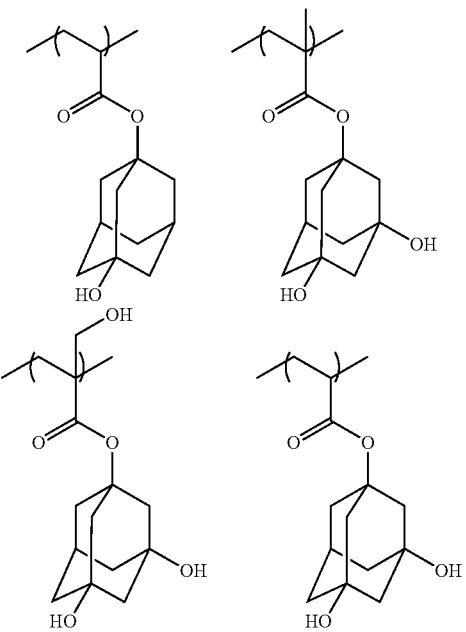

-continued

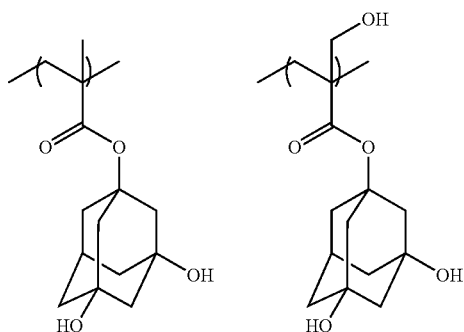

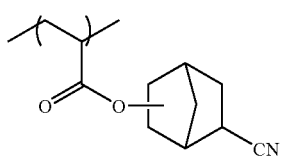

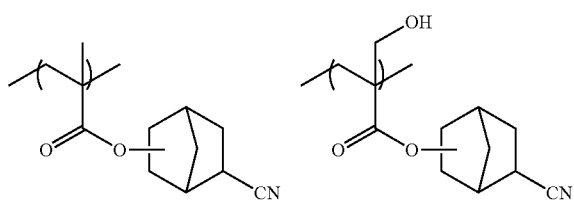

The resin (A) of the invention may have a repeating unit represented by the following general formula (VIII).

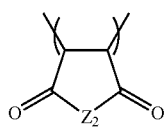

(VIII)

In the general formula (VIII), $Z_2$ represents —O— or —N($R_{41}$)—; $R_{41}$ represents a hydrogen atom, a hydroxyl group, an alkyl group or —OSO$_2$—$R_{42}$; and $R_{42}$ represents an alkyl group, a cycloalkyl group or a camphor residue. The alkyl group represented by $R_{41}$ and $R_{42}$ may be substituted with a halogen atom (preferably a fluorine atom) or the like.

Specific examples of the repeating unit represented by the general formula (VIII) are given below, but it should not be construed that the invention is limited thereto.

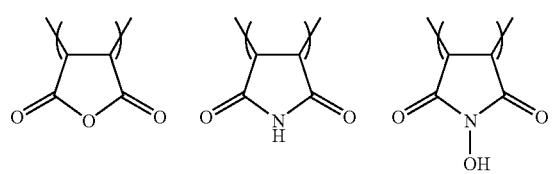

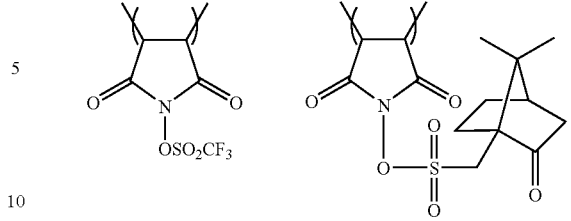

The resin (A) of the invention preferably has a repeating unit having an alkali-soluble group, and more preferably has a repeating unit having a carboxyl group. When the resin as the component (A) contains such a repeating unit, the resolution in a contact hole application increases. As the repeating unit having a carboxyl group, any of a repeating unit in which a carboxyl group is bound directly to the principal chain of the resin, for example, a repeating unit derived from acrylic acid or methacrylic acid; and a repeating unit in which a carboxyl group is bound to the principal chain of the resin via a connecting group is preferable. The connecting group may have a monocyclic or polycyclic hydrocarbon structure. Above all, a repeating unit derived from acrylic acid or methacrylic acid is the most preferable.

The resin (A) of the invention may further have a repeating unit having from one to three groups represented by the following general formula (F1). According to this, the line edge roughness performance is enhanced.

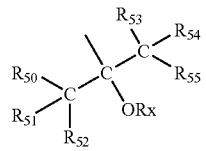

(F1)

In the general formula (F1), $R_{50}$ to $R_{55}$ each independently represents a hydrogen atom, a fluorine atom or an alkyl group, provided that at least one of $R_{50}$ to $R_{55}$ represents a fluorine atom or an alkyl group in which at least one hydrogen atom is substituted with a fluorine atom.

Rx represents a hydrogen atom or an organic group (preferably an acid-decomposable protective group, an alkyl group, a cycloalkyl group, an acyl group or an alkoxycarbonyl group).

The alkyl group represented by $R_{50}$ to $R_{55}$ may be substituted with a halogen atom such as a fluorine atom, a cyano group or the like and is preferably an alkyl group having from 1 to 3 carbon atoms, for example, a methyl group and a trifluoromethyl group.

It is preferable that $R_{50}$ to $R_{55}$ are all a fluorine atom.

Preferred examples of the organic group represented by Rx include an alkyl group, a cycloalkyl group, an acyl group, an alkylcarbonyl group, alkoxycarbonyl group, an alkoxycarbonylmethyl group, an alkoxymethyl group and a 1-alkoxyethyl group, each of which may have an acid-decomposable protective group or a substituent.

The repeating unit having the general formula (F1) is preferably a repeating unit represented by the following general formula (F2).

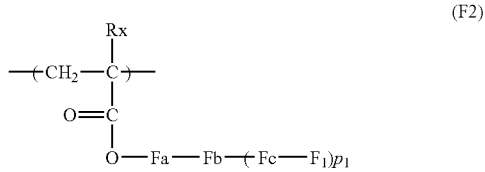

In the general formula (F2),

Rx represents a hydrogen atom, a halogen atom or an alkyl group having from 1 to 4 carbon atoms. Examples of a substituent which the alkyl group represented by Rx may have include a hydroxyl group and a halogen atom.

Fa represents a single bond or a linear or branched alkylene group, and preferably a single bond.

Fb represents a monocyclic or polycyclic cyclic hydrocarbon group.

Fc represents a single bond or a linear or branched alkylene group, and preferably a single bond or a methylene group.

$F_1$ represents a group represented by the general formula (F1).

$p_1$ represents from 1 to 3.

Preferred examples of the cyclic hydrocarbon group represented by Fb include a cyclopentyl group, a cyclohexyl group and a norbornyl group.

Specific examples of the repeating unit having the group represented by the general formula (F1) are given below.

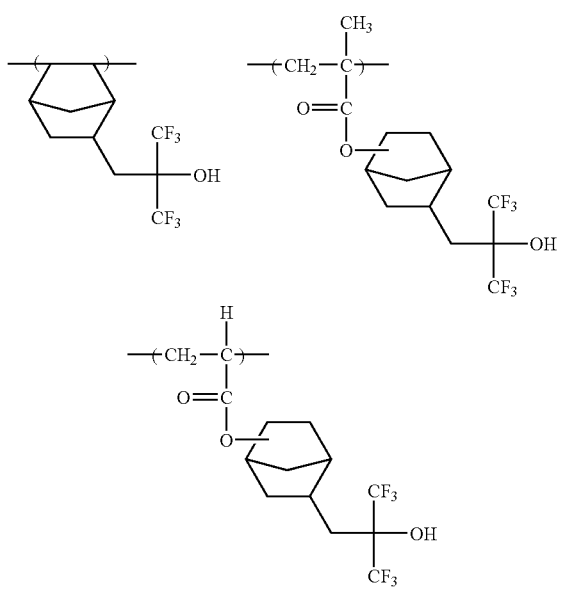

The resin (A) of the invention can have various repeating structural units for the purposes of adjusting the dry etching resistance, aptitude with a standard developer, adhesiveness to a substrate and resist profile and additionally characteristics generally required for the resist, for example, resolving power, heat resistance and sensitivity, in addition to the foregoing repeating structural units.

Examples of such a repeating structural unit include repeating structural units corresponding to the following monomers, but it should not be construed that the invention is limited thereto.

According to this, performances which are required for the resin (A), especially (1) solubility in a coating solvent, (2) fabrication properties (glass transition point), (3) alkali developability, (4) film thinning (selection of a hydrophilic or hydrophobic or alkali-soluble group), (5) adhesiveness to a substrate in an unexposed area, (6) dry etching resistance and the like can be finely adjusted.

Examples of such a monomer include compounds having one addition polymerizable unsaturated bond selected among acrylic esters, methacrylic esters, acrylamides, methacrylamides, allyl compounds, vinyl ethers, vinyl esters and so on.

Besides, an addition polymerizable unsaturated compound may be copolymerized so far as it is copolymerizable with a monomer corresponding to each of the foregoing various repeating structural units.

In the resin (A), the molar content ratio of the respective repeating structural units is properly set up for the purpose of adjusting the dry etching resistance, aptitude with a standard developer, adhesiveness to a substrate and resist profile and additionally characteristics generally required for the resist, for example, resolving power, heat resistance and sensitivity.

In the resin (A), the content of the repeating unit having an acid-decomposable group is preferably from 10 to 60% by mole, more preferably from 20 to 50% by mole, and further preferably from 25 to 40% by mole in the whole of the repeating units.

In the resin (A), the content of total of the repeating units (A1) and (A2) is preferably from 10 to 90% by mole, more preferably from 20 to 80% by mole, and further preferably from 30 to 70% by mole in the whole of the repeating units.

A molar ratio of (A1) to (A2) is preferably in the range of from 1/99 to 99/1, more preferably in the range of from 5/95 to 95/5, and further preferably in the range of from 10/90 to 90/10.

In the resin (A), the content of the repeating unit having the group represented by any of the general formulae (pI) to (pV) is preferably from 25 to 70% by mole, more preferably from 35 to 65% by mole, and further preferably from 40 to 60% by mole in the whole of the repeating units.

A ratio (molar ratio) of the repeating unit having the first group to the repeating unit having the second group is preferably from 10/90 to 90/10, more preferably from 15/85 to 85/15, and further preferably from 20/80 to 80/20.

Also, though the content of the repeating structural unit on the basis of a monomer of the foregoing additional copolymerization component in the resin can be properly set up depending upon the desired performance of a resist, it is generally not more than 99% by mole, more preferably not more than 90% by mole, and further preferably not more than 80% by mole relative to the total molar number of the sum of the repeating structural units each having the group represented by any of the foregoing general formulae (PI) to (pV).

When the composition of the invention is used for ArF exposure, it is preferable that the resin (A) does not have an aromatic group in view of the transparency to ArF light.

The resin (A) which is used in the invention is preferably one constituted of repeating units all of which are a (meth)acrylate repeating unit. In that case, any of a resin in which all of the repeating units are of a methacrylate, a resin in which all of the repeating units are of an acrylate and a resin in which all of the repeating units are of a methacrylate/acrylate mixture can be used, and a resin in which the acrylate repeating unit is not more than 50% by mole in the whole of the repeating units.

The resin (A) having the structure represented by the general formula (1) in an end terminal thereof is a novel compound.

The resin (A) having the structure represented by the general formula (1) in an end terminal thereof can be synthesized according to the usual way (for example, radical polymerization). Examples of the general synthesis method include a batchwise polymerization method in which a monomer species, a compound represented by the following general formula (2) and an initiator are dissolved in a solvent and the solution is polymerized upon heating; and a dropwise polymerization method in which a solution of a monomer species, a compound represented by the following general formula (2) and an initiator is added dropwise in a heated solvent over from 1 to 10 hours, with a dropwise polymerization method being preferable. Examples of the reaction solvent include ethers (for example, tetrahydrofuran, 1,4-dioxane and diisopropyl ether), ketones (for example, methyl ethyl ketone and methyl isobutyl ketone), ester solvents (for example, ethyl acetate), amide solvents (for example, dimethylformamide and dimethylacetamide) and solvents capable of dissolving the composition of the invention therein as described later (for example, propylene glycol monomethyl ether acetate, propylene glycol monomethyl ether and cyclohexanone). It is more preferable that the polymerization is carried out by using the same solvent as the solvent used in the resist composition of the invention. According to this, it is possible to inhibit the generation of a particle at the preservation.

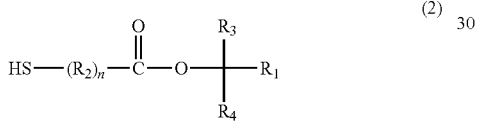

(2)

In the general formula (2), $R_1$ represents an alkyl group, a cycloalkyl group or an aryl group, $R_2$ represents an alkylene group, a cycloalkylene group or an arylene group, $R_3$ and $R_4$ each independently represents a hydrogen atom, an alkyl group, a cycloalkyl group, an alkenyl group or an aryl group, provided that at least one of $R_3$ and $R_4$ is not a hydrogen atom and that $R_3$ or $R_4$ may be bound to adjacent $R_1$ to form a ring structure, and n represents 0 or 1.

In the general formula (2), $R_1$ to $R_4$ and n are synonymous with $R_1$ to $R_4$ and n in the general formula (1).

The compound represented by the general formula (2) is a novel compound.

The compound represented by the general formula (2) can be synthesized by a method as described in, for example, JP-A-2006-91762 or WO 2005/085301A1.

Specific examples of the compound represented by the general formula (2) are given below, but it should not be construed that the invention is limited thereto.

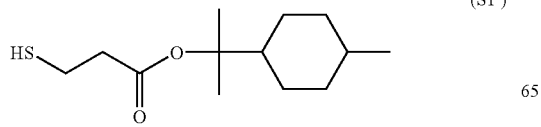

(S1')

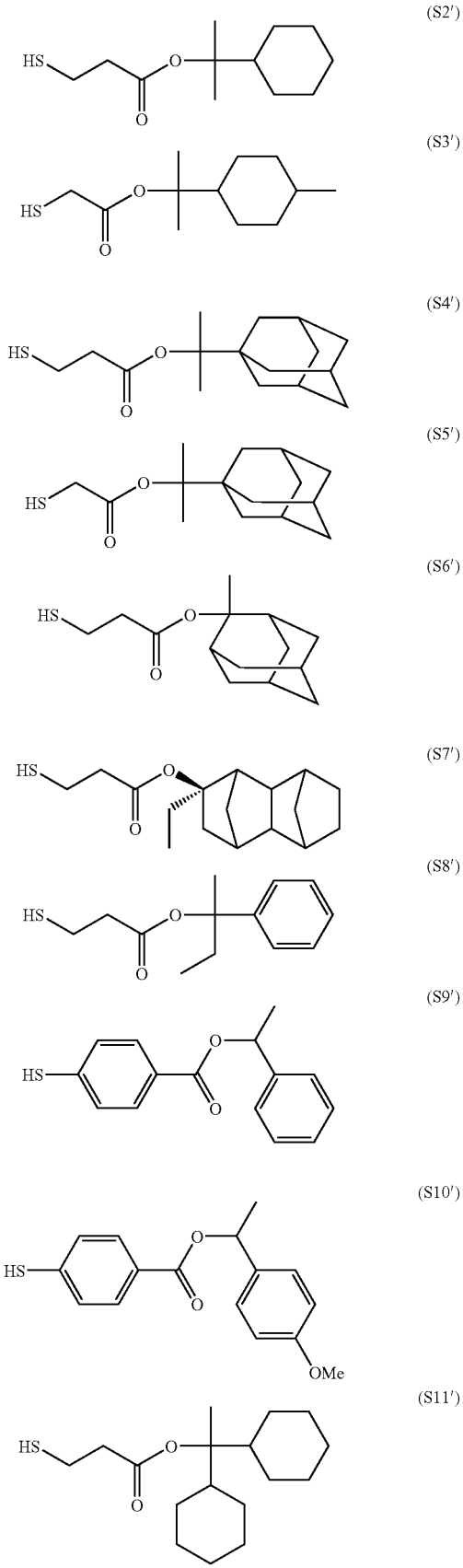

-continued

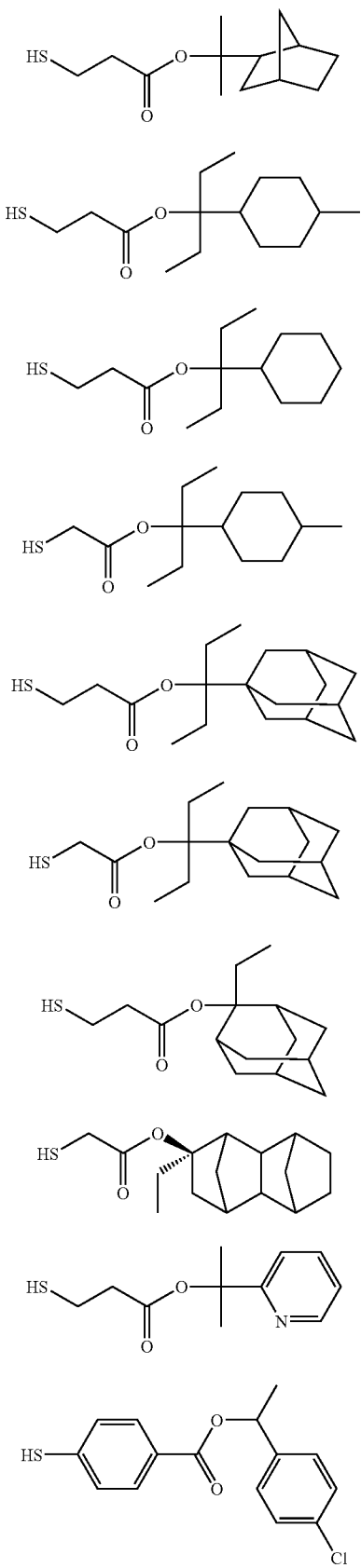

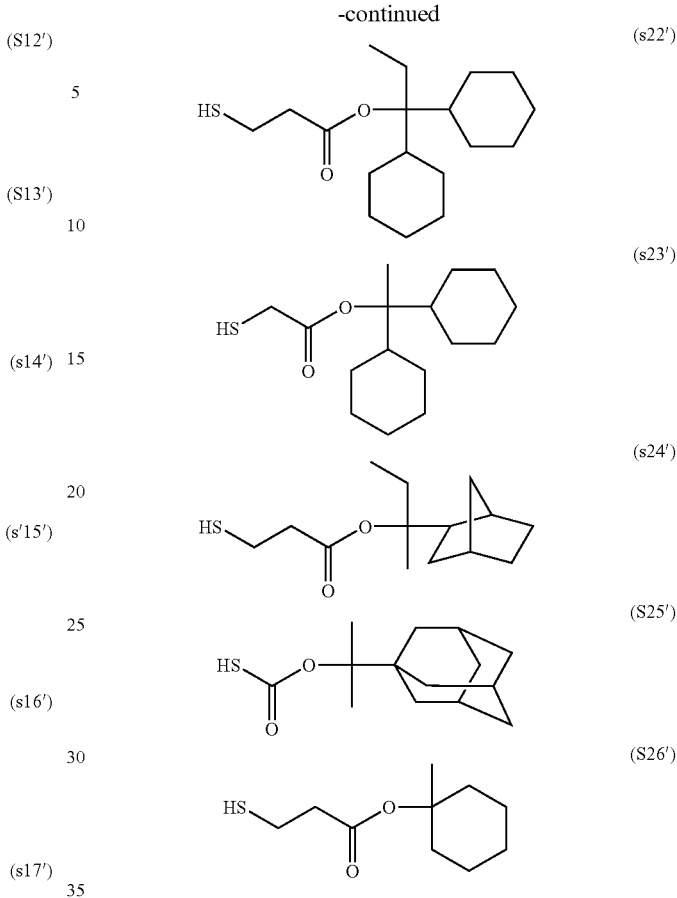

It is preferable that the polymerization reaction is carried out in an inert gas atmosphere such as nitrogen and argon. The polymerization is initiated by using a commercially available radical initiator (for example, an azo based initiator and a peroxide) as the polymerization initiator. An azo based initiator is preferable as the radical initiator, and an azo based initiator having an ester group, a cyano group or a carboxyl group is preferable. Preferred examples of the initiator include azobisisobutyronitrile, azobisdimethylvaleronitirle and dimethyl 2,2'-azobis(2-methylpropionate). If desired, the initiator is added supplementarily or dividedly; and after completion of the reaction, the reaction mixture is thrown into a solvent, and a desired high-molecular weight compound is recovered by a method such as powder or solid recovery. The reaction concentration is from 5 to 50% by mass, and preferably from 10 to 30% by mass. The reaction temperature is usually from 10° C. to 150° C., preferably from 30° C. to 120° C., and more preferably from 60° C. to 100° C.

A weight average molecular weight of the high-molecular weight compound according to the invention is preferably from 1,000 to 200,000, more preferably from 3,000 to 20,000, and most preferably from 5,000 to 15,000 in terms of a value as reduced into polystyrene by the GPC method. By setting up the weight average molecular weight at from 1,000 to 200,000, not only the deterioration in heat resistance and dry etching resistance can be prevented, but the deterioration in developability and fabrication properties to be caused due to an increase of the viscosity can be prevented.

A degree of dispersion (molecular weight distribution) of the high-molecular weight compound is usually in the range of from 1 to 5, preferably from 1 to 3, and more preferably from 1 to 2. When the molecular weight distribution is small, the resolution and resist shape are excellent, the side wall of a resist pattern is smooth, and the roughness properties are excellent.

In the case where the composition of the invention is used in an upper layer resist of a multilayered resist, it is preferable that the resin (A) has a silicon atom.

As the resin having a silicon atom, which decomposes by action of an acid to increase its solubility in an alkaline developer, a resin having a silicon atom in at least one of a principal chain and a side chain thereof can be used. Examples of a resin having a siloxane structure in a side chain thereof include olefin based monomers having a silicon atom in a side chain thereof and copolymers of maleic anhydride and a (meth)acrylic acid based monomer having an acid-decomposable group in a side chain thereof. As the resin having a silicon atom, resins having a trialkylsilyl structure or a monocyclic or polycyclic cyclic siloxane structure are preferable; resins having a repeating unit having a structure represented by any of the following general formulae (SS-1) to (SS-4) are more preferable; and resins having a (meth)acrylic ester based repeating unit, a vinyl based repeating unit or an allyl based repeating unit each having a structure represented by any of the following general formulae (SS-1) to (SS-4) are further preferable.

having from 5 to 10 silicon atoms; and further preferably a resin having at least one repeating unit having the structure represented by any of the general formulae (SS-1) to (SS-3) and a repeating unit represented by the structure represented by the general formula (SS-4).

In the case where the positive working resist composition of the invention is irradiated with an $F_2$ excimer laser beam, the resin (A) is preferably a resin having a structure in which a fluorine atom is substituted in a principal chain and/or a side chain of the polymer skeleton and which decomposes by action of an acid to increase its solubility in an alkaline developer; more preferably a resin containing a hydroxyl group substituted with a fluorine atom or a fluoroalkyl group at a 1-position thereof or a group in which a hydroxyl group substituted with a fluorine atom or a fluoroalkyl group at a 1-position thereof is protected by an acid-decomposable group; and especially preferably a resin containing a hexafluoro-2-propanol structure or a structure in which a hydroxyl group of hexafluoro-2-propanol is protected by an acid-decomposable group. By introducing a fluorine atom, it is possible to enhance the transparency to far ultraviolet light, especially $F_2$ light (157 nm).

Preferred examples of the resin (A) having a fluorine atom include resins having at least one repeating unit represented by the following general formulae (FA) to (FG).

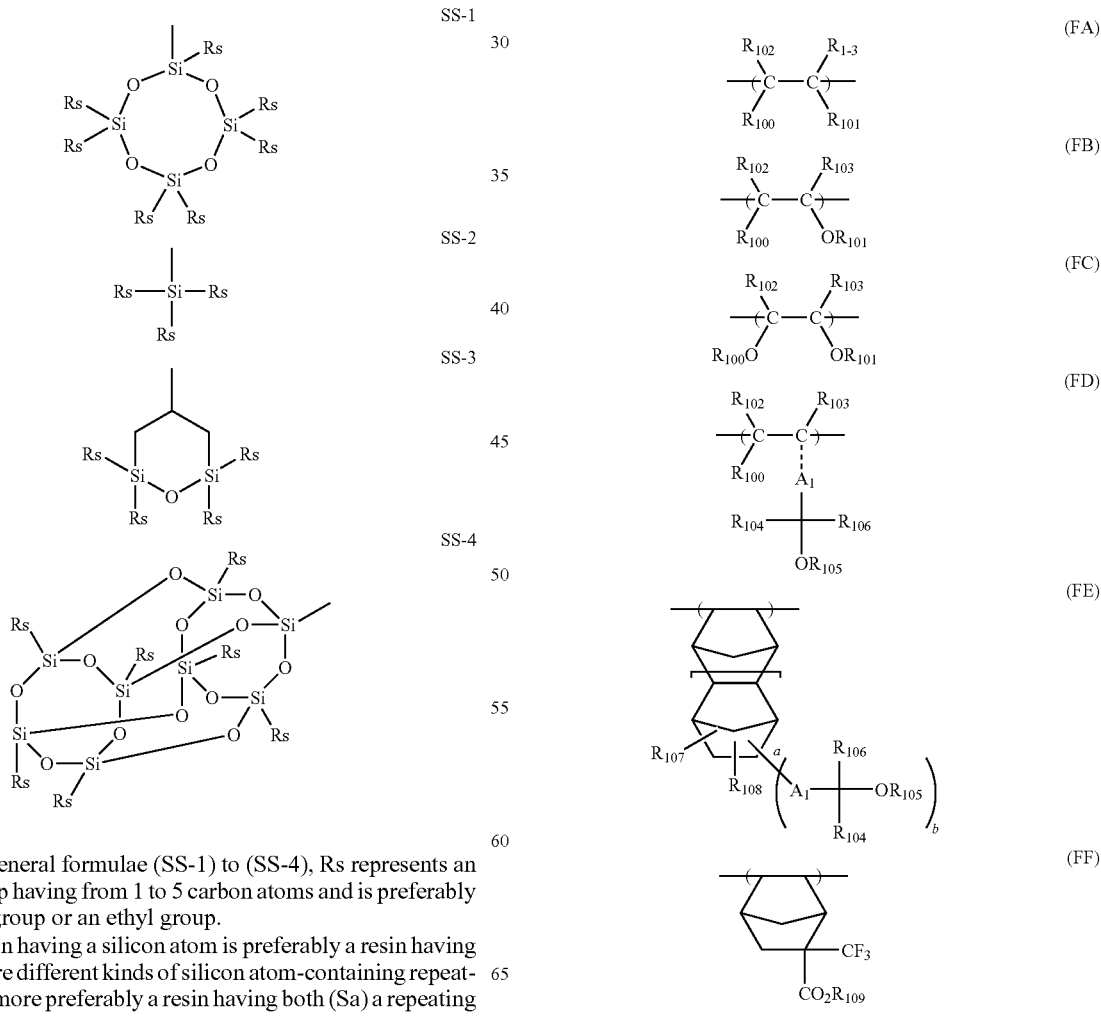

In the general formulae (SS-1) to (SS-4), Rs represents an alkyl group having from 1 to 5 carbon atoms and is preferably a methyl group or an ethyl group.

The resin having a silicon atom is preferably a resin having two or more different kinds of silicon atom-containing repeating units; more preferably a resin having both (Sa) a repeating unit having from 1 to 4 silicon atoms and (Sb) a repeating unit -continued

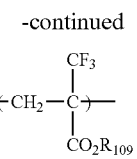
(FG)

In the general formulae (FA) to (FG), $R_{100}$ to $R_{103}$ each independently represents a hydrogen atom, a fluorine atom, an alkyl group or an aryl group.

$R_{104}$ and $R_{106}$ each independently represents a hydrogen atom, a fluorine atom or an alkyl group; at least one of $R_{104}$ and $R_{106}$ represents a fluorine atom or a fluoroalkyl group; and both $R_{104}$ and $R_{106}$ are preferably a trifluoromethyl group.

$R_{105}$ represents a hydrogen atom, an alkyl group, a cycloalkyl group, an acyl group, an alkoxycarbonyl group or a group which decomposes by action of an acid.

$A_1$ represents a single bond or a divalent connecting group, for example, a linear, branched or cyclic alkylene group, an alkenylene group, an arylene group, —OCO—, —COO— or —CON($R_{24}$)— and a connecting group resulting from binding of plural members thereof. $R_{24}$ represents a hydrogen atom or an alkyl group.

$R_{107}$ and $R_{108}$ each independently represents a hydrogen atom, a halogen atom, an alkyl group, an alkoxy group, an alkoxycarbonyl group or a group which decomposes by action of an acid.

$R_{109}$ represents a hydrogen atom, an alkyl group, a cycloalkyl group or group which decomposes by action of an acid.

a is 0 or 1.

b is 0, 1 or 2.

Also, $R_{100}$ and $R_{101}$ in the general formulae (FA) and (FC) may be taken together to form a ring via an alkylene group (having from 1 to 5 carbon atoms) which may be substituted with fluorine.

Each of the repeating units represented by the general formulae (FA) to (FG) contains at least one fluorine atom, and preferably three or more fluorine atoms per repeating unit.

In the positive working resist composition of the invention, a blending amount of the resin (A) according to the invention is preferably from 40 to 99.9% by mass, more preferably from 50 to 99% by mass, and further preferably from 80 to 96% by mass in the whole of the solids of the composition.

[2] (B) Compound capable of generating an acid upon irradiation with actinic rays or radiation:

A compound capable of generating an acid upon irradiation with actinic rays or radiation (hereinafter also referred to as "acid generator") which is used in the positive working resist composition of the invention is hereunder described.

The acid generator which is used in the invention can be chosen among compounds which are generally used as an acid generator.

That is, a photoinitiator for photo cationic polymerization, a photoinitiator of photo radical polymerization, a photo-decoloring agent for dyes, a photo-discoloring agent, a known compound capable of generating an acid upon irradiation with actinic rays or radiation (for example, far ultraviolet light and X-rays) as used in micro resists or the like and a mixture thereof can be properly chosen and used.

Examples thereof include a diazonium salt, a phosphonium salt, a sulfonium salt, an iodonium salt, imide sulfonate, oxime sulfonate, diazosulfone, disulfone and o-nitrobenzyl sulfonate.

Also, a compound in which such a group or compound capable of generating an acid upon irradiation with actinic rays or radiation is introduced into the principal chain or side chain of a polymer, for example, compounds described in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853, JP-A-63-146029 and so on can be used.

Furthermore, compounds capable of generating an acid by light, as described in U.S. Pat. No. 3,779,778, European Patent No. 126,712 and so on can be used.

As a preferred compound of the acid generator, compounds represented by the following general formulae (ZI), (ZII) and (ZIII) can be exemplified.

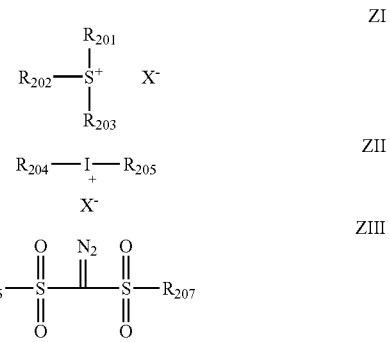

In the foregoing general formula (ZI), $R_{201}$, $R_{202}$ and $R_{203}$ each independently represents an organic group.

$X^-$ represents a non-nucleic anion.

The carbon atom number of the organic group represented by $R_{201}$, $R_{202}$ and $R_{203}$ is generally from 1 to 30, and preferably from 1 to 20.

Also, two of $R_{201}$ to $R_{203}$ may be taken together to form a ring structure and may contain an oxygen atom, a sulfur atom, an ester bond, an amide bond or a carbonyl group in the ring.

Examples of the group which two of $R_{201}$ to $R_{203}$ are taken to form include an alkylene group (for example, a butylene group and a pentylene group).

Specific examples of the organic group represented by $R_{201}$, $R_{202}$ and $R_{203}$ include corresponding groups in compounds (ZI-1), (ZI-2) and (ZI-3) as described later.

The compound may be a compound having a plural number of structures represented by the general formula (ZI). For example, the compound may be a compound having a structure in which at least one of $R_{201}$ to $R_{203}$ of a compound represented by the general formula (ZI) is bound to at least one of $R_{201}$ to $R_{203}$ of another compound represented by the general formula (ZI).

More preferred examples of the component (ZI) include compounds (ZI-1), (ZI-2) and (ZI-3) as described below.

The compound (ZI-1) is an aryl sulfonium compound in which at least one of $R_{201}$ to $R_{203}$ in the foregoing general formula (ZI) is an aryl group, namely a compound having an aryl sulfonium as a cation.

In the aryl sulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the aryl sulfonium compound include a triaryl sulfonium compound, a diarylalkyl sulfonium compound, an aryldialkyl sulfonium compound, a diarylcycloalkyl sulfonium compound and an aryldicycloalkyl sulfonium compound.

The aryl group of the aryl sulfonium compound is preferably a phenyl group or a naphthyl group, and more preferably a phenyl group. The aryl group may be an aryl group having a heterocyclic structure having an oxygen atom, a nitrogen atom, a sulfur atom or the like. Examples of the aryl group having a heterocyclic structure include a pyrrole residue (a group formed when one hydrogen atom is lost from pyrrole), a furan residue (a group formed when one hydrogen atom is lost from furan), a thiophene residue (a group formed when one hydrogen atom is lost from thiophene), an indole residue (a group formed when one hydrogen atom is lost from indole), a benzofuran residue (a group formed when one hydrogen atom is lost from benzofuran) and a benzothiophene residue (a group formed when one hydrogen atom is lost from benzothiophene). In the case where the aryl sulfonium compound has two or more aryl groups, the two or more existing aryl groups may be the same or different.

The alkyl group which the aryl sulfonium compound optionally has is preferably a linear or branched alkyl group having from 1 to 15 carbon atoms. Examples thereof include a methyl group, an ethyl group, a propyl group, an n-butyl group, a sec-butyl group and a t-butyl group.

The cycloalkyl group which the aryl sulfonium compound optionally has is preferably a cycloalkyl group having from 3 to 15 carbon atoms. Examples thereof include a cyclopropyl group, a cyclobutyl group and a cyclohexyl group.

Each of the aryl group, the alkyl group and the cycloalkyl group represented by $R_{201}$ to $R_{203}$ may have, as a substituent, an alkyl group (preferably one having from 1 to 15 carbon atoms), a cycloalkyl group (preferably one having from 3 to 15 carbon atoms), an aryl group (preferably one having from 6 to 14 carbon atoms), an alkoxy group (preferably one having from 1 to 15), a halogen atom, a hydroxyl group or a phenylthio group. Preferred examples of the substituent include a linear or branched alkyl group having from 1 to 12 carbon atoms, a cycloalkyl group having from 3 to 12 carbon atoms and an alkoxy group having from 1 to 12 carbon atoms; and the most preferred examples thereof include an alkyl group having from 1 to 4 carbon atoms and an alkoxy group having from 1 to 4 carbon atoms. The substituent may be substituted on any one of three $R_{201}$ to $R_{203}$ or may be substituted on all of three $R_{201}$ to $R_{203}$. Also, in the case where $R_{201}$ to $R_{203}$ are an aryl group, it is preferable that the substituent is substituted at the p-position of the aryl group.

Examples of the non-nucleic anion represented by $X^-$ include a sulfonic anion, a carboxylic anion, a sulfonyl imide anion, a bis(alkylsulfonyl)imide anion and a tris(alkyl-sulfonyl)methyl anion.

The "non-nucleic anion" as referred to herein means an anion having extremely low ability to cause a nucleic reaction, and it is an anion capable of inhibiting the decomposition with time due to an intramolecular nucleic reaction. According to this, the stability with time of the resist is enhanced.

Examples of the sulfonic anion include an aliphatic sulfonic anion, an aromatic sulfonic anion and a camphor sulfonic anion.

Examples of the carboxylic anion include an aliphatic carboxylic anion, an aromatic carboxylic anion and an aralkyl carboxylic anion.

Examples of the aliphatic group in the aliphatic sulfonic anion include an alkyl group having from 1 to 30 carbon atoms, specific examples of which include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group; and a cycloalkyl group having from 3 to 30 carbon atoms, specific examples of which include a cyclopropyl group, a cyclopentyl group, a cyclohexyl group, an adamantyl group, a norbornyl group and a boronyl group.

The aromatic group in the aromatic sulfonic anion is preferably an aryl group having from 6 to 14 carbon atoms, and examples thereof include a phenyl group, a tolyl group and a naphthyl group.

Each of the alkyl group, the cycloalkyl group and the aryl group in the foregoing aliphatic sulfonic anion and aromatic sulfonic anion may have a substituent.

Examples of such a substituent include a nitro group, a halogen atom (for example, a fluorine atom, a chlorine atom, a bromine atom and an iodine atom), a carboxyl group, a hydroxyl group, an amino group, a cyano group, an alkoxy group (preferably one having from 1 to 5 carbon atoms), a cycloalkyl group (preferably one having from 3 to 15 carbon atoms), an aryl group (preferably one having from 6 to 14 carbon atoms), an alkoxycarbonyl group (preferably one having from 2 to 7 carbon atoms), an acyl group (preferably one having from 2 to 12 carbon atoms), an alkoxycarbonyloxy group (preferably one having from 2 to 7 carbon atoms) and an alkylthio group (preferably one having from 1 to 15 carbon atoms). With respect to the aryl group and ring structure which each of the groups has, an alkyl group (preferably one having from 1 to 15 carbon atoms) can be further exemplified as the substituent.

Examples of the aliphatic group in the aliphatic carboxylic anion include the same aliphatic group in the aliphatic sulfonic anion.

Examples of the aromatic group in the aromatic carboxylic anion include the same aromatic group in the aromatic sulfonic anion.

The aralkyl group in the aralkyl carboxylic anion is preferably an aralkyl group having from 6 to 12 carbon atoms, and examples thereof include a benzyl group, a phenethyl group, a naphthylmethyl group, a naphthylethyl group and a naphthylmethyl group.

Each of the aliphatic group, the aromatic group and the aralkyl group in the foregoing aliphatic carboxylic anion, aromatic carboxylic anion and aralkyl carboxylic anion may have a substituent. Examples of the substituent include the same halogen atom, alkyl group, cycloalkyl group, alkoxy group and alkylthio group in the aliphatic sulfonic anion.

Examples of the sulfonylimide anion include a saccharin anion.

The alkyl group in the bis(alkylsulfonyl)imide anion and the tris(alkylsulfonyl)methyl anion is preferably an alkyl group having from 1 to 5 carbon atoms, and examples thereof include a methyl group, an ethyl group, a propyl group, an isopropyl group, an n-butyl group, an isobutyl group, a sec-butyl group, a pentyl group and a neopentyl group. Such an alkyl group may have a substituent. Examples of the substituent include a halogen atom, a halogen atom-substituted alkyl group, an alkoxy group and an alkylthio group. Above all, a fluorine atom-substituted alkyl group is preferable.

Examples of other non-nucleic anion include fluorinated phosphorus, fluorinated boron and fluorinated antimony.

Preferred examples of the non-nucleic anion represented by $X^-$ include an aliphatic sulfonic anion in which the α-position of sulfonic acid is substituted with a fluorine atom, an aromatic sulfonic anion substituted with a fluorine atom or a group having a fluorine atom, a bis(alkylsulfonyl)imide anion in which the alkyl group thereof is substituted with a fluorine atom and a tris(alkylsulfonyl)methide anion in which the alkyl group thereof is substituted with a fluorine atom. The non-nucleic anion is especially preferably a perfluoro aliphatic sulfonic anion having from 4 to 8 carbon atoms or a aromatic sulfonic anion having a fluorine atom; and most preferably a nonafluorobutanesulfonic anion, a perfluorooctanesulfonic anion, a pentafluorobenzenesulfonic anion or a 3,5-bis(trifluoro-methyl)benzenesulfonic anion.

Next, the compound (ZI-2) is described.

The compound (ZI-2) is a compound in which $R_{201}$ to $R_{203}$ in the general formula (ZI) each independently represents an aromatic ring-free organic group. The "aromatic ring" as referred to herein also includes a hetero atom-containing aromatic ring.

The aromatic ring-free organic group represented by $R_{201}$ to $R_{203}$ generally has from 1 to 30 carbon atoms, and preferably from 1 to 20 carbon atoms.

$R_{201}$ to $R_{203}$ are each independently preferably an alkyl group, a cycloalkyl group, an allyl group or a vinyl group; more preferably a linear or branched 2-oxoalkyl group or an alkoxycarbonylmethyl group; and most preferably a linear or branched 2-oxoalkyl group.

The alkyl group represented by $R_{201}$ to $R_{203}$ may be linear or branched and is preferably a linear or branched alkyl group having from 1 to 10 carbon atoms, and examples thereof include a methyl group, an ethyl group, a propyl group, a butyl group and a pentyl group. More preferred examples of the alkyl group include a 2-linear or branched oxoalkyl group and an alkoxycarbonylmethyl group.

The cycloalkyl group represented by $R_{20}$, to $R_{203}$ is preferably a cycloalkyl group having from 3 to 10 carbon atoms, and examples thereof include a cyclopentyl group, a cyclohexyl group and a norbornyl group. More preferred examples of the cycloalkyl group include a 2-oxocycloalkyl group.

The 2-oxoalkyl group may be linear, branched or cyclic, and preferred examples thereof include a group having >C=O at the 2-position of the foregoing alkyl group or cycloalkyl group.

Preferred examples of the alkoxy group in the alkoxycarbonylmethyl group include an alkoxy group having from 1 to 5 carbon atoms (for example, a methoxy group, an ethoxy group, a propoxy group, a butoxy group and a pentoxy group).

Each of $R_{201}$ to $R_{203}$ may be further substituted with a halogen atom, an alkoxy group (for example, one having from 1 to 5 carbon atoms), a hydroxyl group, a cyano group or a nitro group.

The compound (ZI-3) is a compound represented by the following general formula (ZI-3) and is a compound having a phenacyl sulfonium salt structure.

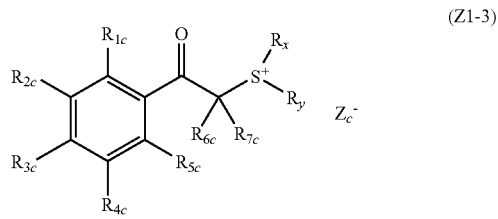

(ZI-3)

In the general formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more of $R_{1c}$ to $R_{7c}$ and $R_x$ and $R_y$ may be taken together, respectively to form a ring structure. This ring structure may contain an oxygen atom, a sulfur atom, an ester bond or an amide bond. Examples of the group formed when any two or more of $R_{1c}$ to $R_{7c}$ and $R_x$ and $R_y$ are taken together, respectively include a butylene group and a pentylene group.

$Zc^-$ represents a non-nucleic anion, and examples thereof include the same non-nucleic anion as in $X^-$ in the general formula (ZI).

The alkyl group represented by $R_{1c}$ to $R_{7c}$ is preferably a linear or branched alkyl group having from 1 to 20 carbon atoms, and examples thereof include a methyl group, an ethyl group, a linear or branched propyl group, a linear or branched butyl group and a linear or branched pentyl group.

The cycloalkyl group represented by $R_{1c}$ to $R_{7c}$ is preferably a cycloalkyl group having from 3 to 8 carbon atoms, and examples thereof include a cyclopentyl group and a cyclohexyl group.

The alkoxy group represented by $R_{1c}$ to $R_{5c}$ may be linear, branched or cyclic; and examples thereof include an alkoxy group having from 1 to 10 carbon atoms, and preferably a linear or branched alkoxy group having from 1 to 5 carbon atoms (for example, a methoxy group, an ethoxy group, a linear or branched propoxy group, a linear or branched butoxy group and a linear or branched pentoxy group) and a cyclic alkoxy group having from 3 to 8 carbon atoms (for example, a cyclopentyloxy group and a cyclohexyloxy group).

It is preferable that any one of $R_{1c}$ to $R_{5c}$ is a linear or branched alkyl group, a cycloalkyl group or a linear, branched or cyclic alkoxy group; and it is more preferable that the total sum of carbon atoms of $R_{1c}$ to $R_{5c}$ is from 2 to 15. According to this, it is possible to enhance the solvent solubility and to inhibit the generation of a particle at the preservation.

Examples of the alkyl group and the cycloalkyl group represented by $R_x$ and $R_y$ include the same alkyl group and cycloalkyl group as in $R_{1c}$ to $R_{7c}$. Above all, a 2-oxoalkyl group, a 2-oxocycloalkyl group and an alkoxycarbonylmethyl group are more preferable.

Examples of the 2-oxoalkyl group and the 2-oxocycloalkyl group include a group having >C=O at the 2-position of each of the alkyl group and the cycloalkyl group represented by $R_{1c}$ to $R_{7c}$.

Examples of the alkoxy group in the alkoxycarbonylmethyl group include the same alkoxy group represented by $R_{1c}$ to $R_{5c}$.

$R_x$ and $R_y$ are each preferably an alkyl group having 4 or more carbon atoms, more preferably an alkyl group having 6 or more carbon atoms, and further preferably an alkyl group having 8 or more carbon atoms.

In the general formulae (ZII) and (ZIII), $R_{204}$ to $R_{207}$ each independently represents an aryl group, an alkyl group or a cycloalkyl group.

The aryl group represented by $R_{204}$ to $R_{207}$ is preferably a phenyl group or a naphthyl group, and more preferably a phenyl group. The aryl group represented by $R_{204}$ to $R_{207}$ may be an aryl group having a heterocyclic structure having an oxygen atom, a nitrogen atom, a sulfur atom or the like. Examples of the aryl group having a heterocyclic structure include a pyrrole residue (a group formed when one hydrogen atom is lost from pyrrole), a furan residue (a group formed when one hydrogen atom is lost from furan), a thiophene residue (a group formed when one hydrogen atom is lost from thiophene), an indole residue (a group formed when one hydrogen atom is lost from indole), a benzofuran residue (a group formed when one hydrogen atom is lost from benzofuran) and a benzothiophene residue (a group formed when one hydrogen atom is lost from benzothiophene).

Preferred examples of the alkyl group represented by $R_{204}$ to $R_{207}$ include a linear or branched alkyl group having from 1 to 10 carbon atoms (for example, a methyl group, an ethyl group, a propyl group, a butyl group and a pentyl group).

Preferred examples of the cycloalkyl group represented by $R_{204}$ to $R_{207}$ include a cycloalkyl group having from 3 to 10 carbon atoms (for example, a cyclopentyl group, a cyclohexyl group and a norbornyl group).

Examples of the substituent which each of $R_{204}$ to $R_{207}$ may have include an alkyl group (for example, one having from 1 to 15 carbon atoms), a cycloalkyl group (for example, one having from 3 to 15 carbon atoms), an aryl group (for example, one having from 6 to 15 carbon atoms), an alkoxy group (for example, one having from 1 to 15 carbon atoms), a halogen atom, a hydroxyl group and a phenylthio group.

$X^-$ represents a non-nucleic anion, and examples thereof include the same non-nucleic anion as in $X^-$ in the general formula (ZI).

As the acid generator, compounds represented by the following general formulae (ZIV), (ZV) and (ZVI) can be further exemplified.

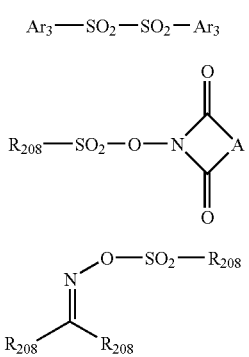

In the general formula (ZIV), two $Ar_3$s each independently represents an aryl group.

In the general formulae (ZV) and (ZVI), $R_{208}$s each independently represents an alkyl group, a cycloalkyl group or an aryl group and is the same represented by the alkyl group, the cycloalkyl group or the aryl group as in $R_{204}$ to $R_{207}$ in the foregoing general formulae (ZI) to (ZIII).

A represents an alkylene group, an alkenylene group or an arylene group.

Of the acid generators, the compounds represented by the general formulae (ZI) to (ZIII) are more preferable.

The acid generator in the invention is especially preferably an acid generator having an anion structure containing a fluorine-substituted alkyl group having not more than 4 carbon atoms, a fluorine atom-substituted cycloalkyl group or a fluorine atom-substituted aromatic group and a triarylsulfonium cation structure. Such an acid generator is represented by any of the following general formulae (B1) to (B3).

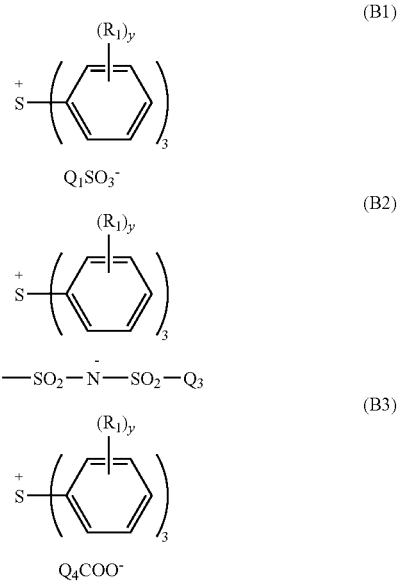

In the general formulae (B1) to (B3), $R_1$ represents an alkyl group, an alicyclic hydrocarbon group, a hydroxyl group, a carboxyl group, an alkoxy group or a halogen atom.

ys each independently represents 0 or an integer of from 1 to 5. In the case where y is an integer of 2 or more, two or more existing $R_1$s may be the same or different.

$Q_1$ to $Q_4$ each independently represents a fluorine atom-substituted alkyl group having from 1 to 8 carbon atoms, a fluorine atom-substituted cycloalkyl group, a fluorine atom-substituted aryl group or a fluorinated alkyl group-substituted aryl group.

In particular, an acid generator represented by the general formula (B2) wherein $Q_2$ and $Q_3$ are taken together to form a ring structure is preferable in view of an improvement in the exposure latitude.

The alkyl group represented by $R_1$ is preferably a linear or branched alkyl group having from 1 to 15 carbon atoms, and examples thereof include a methyl group, an ethyl group, a propyl group, an n-butyl group, a sec-butyl group and a t-butyl group.

The alicyclic hydrocarbon group represented by $R_1$ is preferably a cycloalkyl group having from 3 to 15 carbon atoms, and examples thereof include a cyclopropyl group, a cyclobutyl group, a cyclopentyl group, a cyclohexyl group, a norbornyl group and an adamantyl group.

Examples of the fluorine atom-substituted alkyl group represented by $Q_1$ to $Q_4$ include —$CF_3$, —$C_2F_5$, -n-$C_3F_7$, -n-$C_4F_9$, -n-$C_8F_{17}$, —$CF(CF_3)_2$, —$CH(CF_3)_2$, —$(CF_2)_2$ $OCF_2CF_3$, —$(CF_2)_2$—O—$(CH_2)_3CH_3$, —$(CF_2)_2$—O—$(CH_2)_{13}CH_3$ and —$(CF_2)_2O(CF_2)_2(CH_2)_3CH_3$. The fluorine atom-substituted alkyl group having not more than 4 carbon atoms represented by $Q_1$ to $Q_4$ may further have a substituent, for example, an alkoxy group and a fluoroalkoxy group.

Examples of the fluorine atom-substituted aryl group represented by $Q_1$ to $Q_4$ include a 2,3,4,5,6-pentafluorophenyl group, a 2,3,4-trifluorophenyl group, a 2,4-difluorophenyl group, a 4-fluorophenyl group and a 4-undecanyl-oxy-2,3,5,6-tetrafluorophenyl group.

Examples of the fluorinated alkyl group-substituted aryl group represented by $Q_1$ to $Q_4$ include a 3-trifluoromethylphenyl group, a 3,5-bis(trifluoromethyl)phenyl group, a 4-trifluoromethylphenyl group and a 4-n-nonafluorobutylphenyl group.

Especially preferred examples of the acid generator are given below.
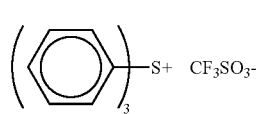 (z1)
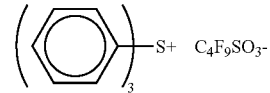 (z2)
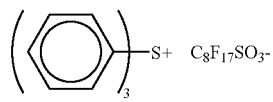 (z3)
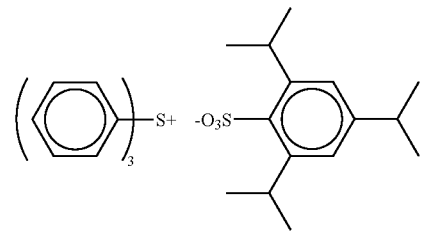 (z4)
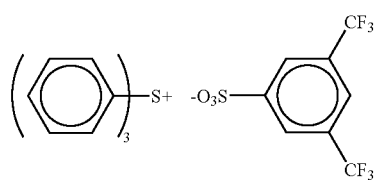 (z5)
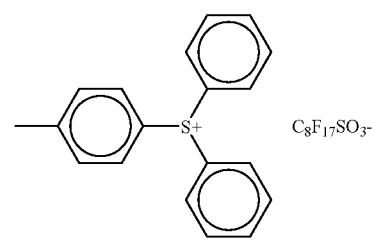 (z6)
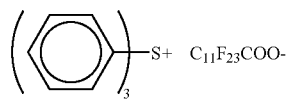 (z7)
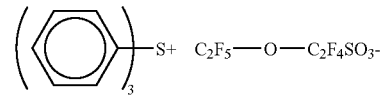 (z8)
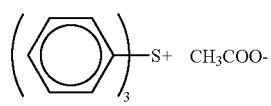 (z9)
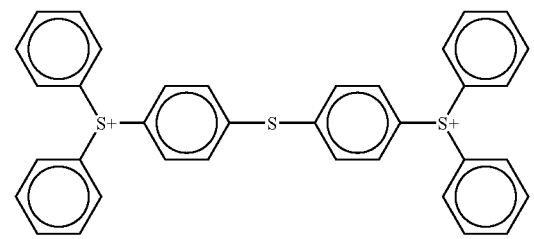 (z10)
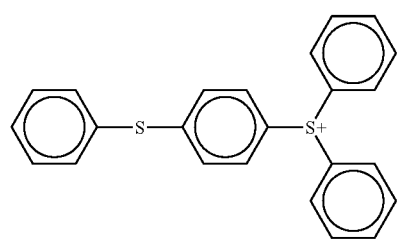 (z11)
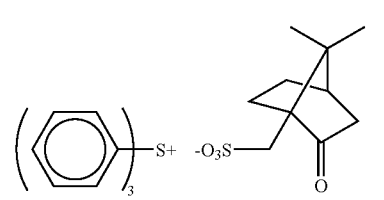 (z12)
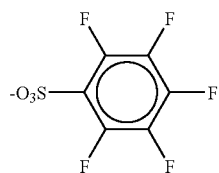

-continued
(z13) 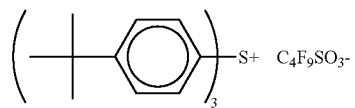
(z14) 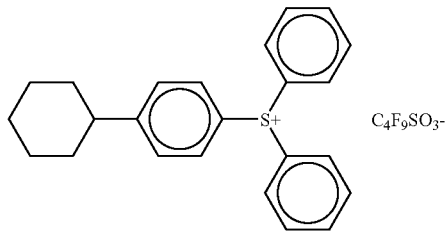
(z15) 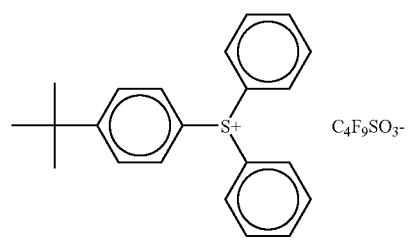
(z16) 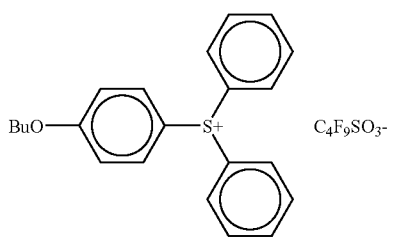
(Z17) 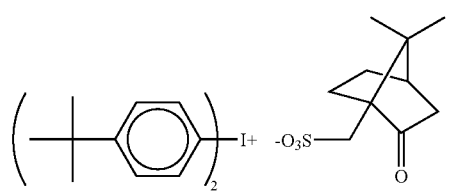
(z18) 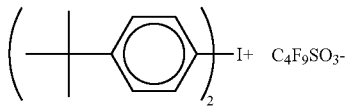
(z19) 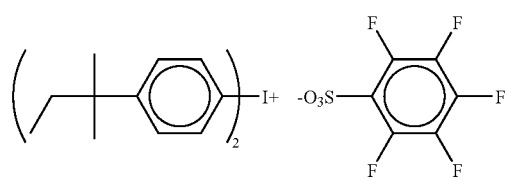
(z20) 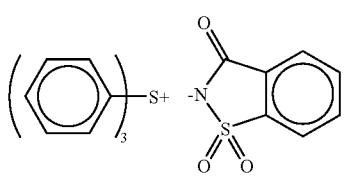
(z21) 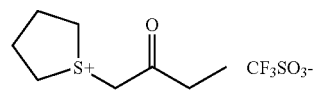
(z22) 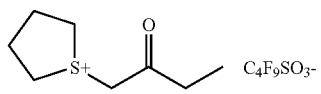
(z23) 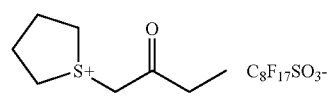
(z24) 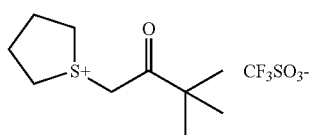
(z25) 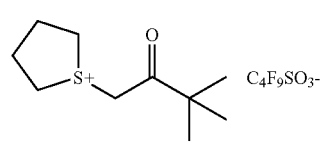
(z26) 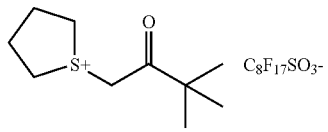
(z27) 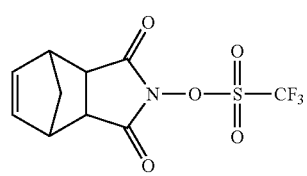
(z28) 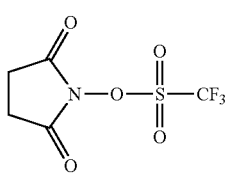
(z29) 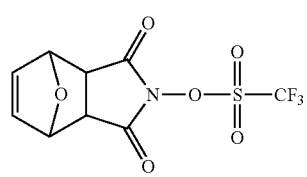
(z30) 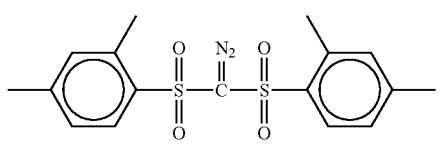

-continued
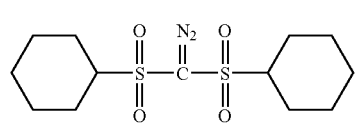 (z31)
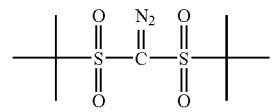 (z32)
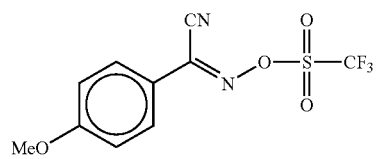 (z33)
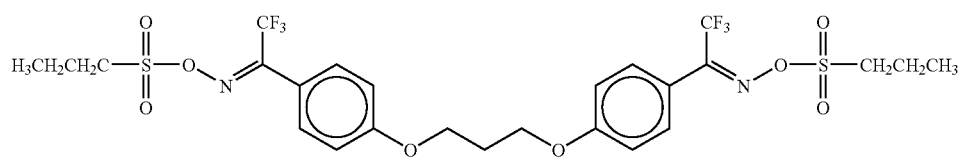 (z34)
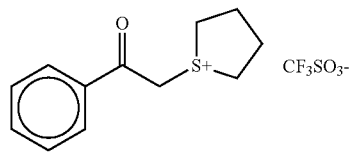 (z35)
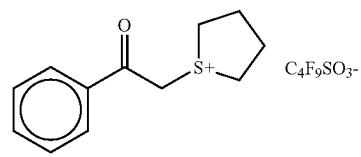 (z36)
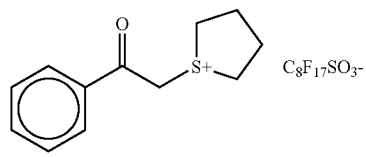 (z37)
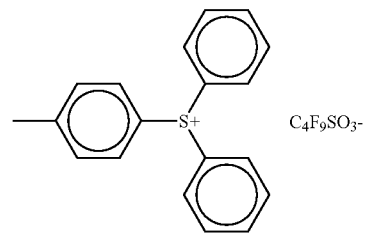 (z38)
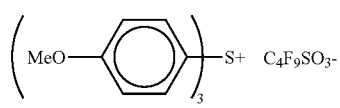 (z39)
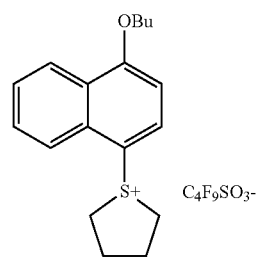 (z40)
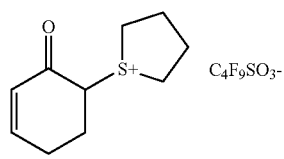 (z41)
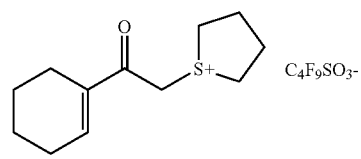 (z42)
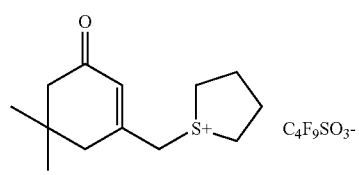 (z43)
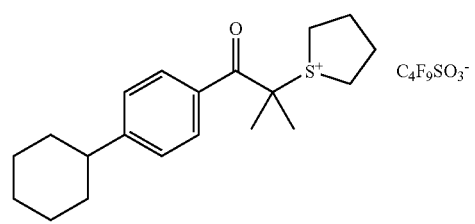 (z44)

-continued
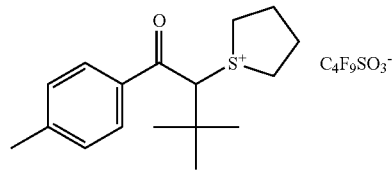 (z45)
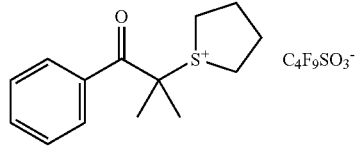 (z46)
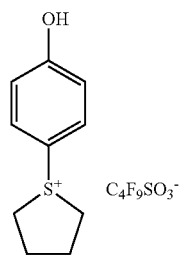
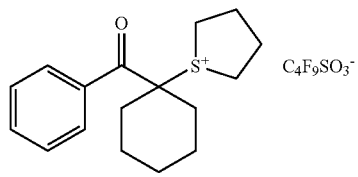 (z47)
(z48)
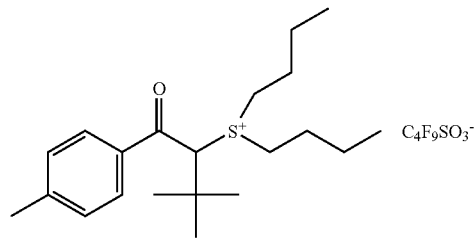
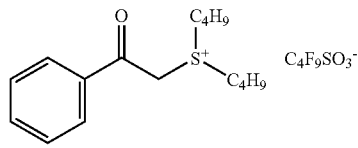 (z49)
(z50)
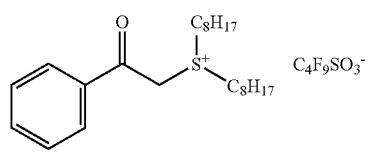
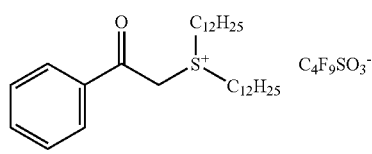 (z51)
(z52)
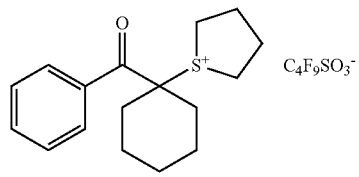
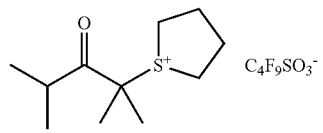 (z53)
(z54)
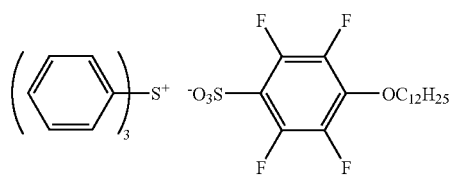
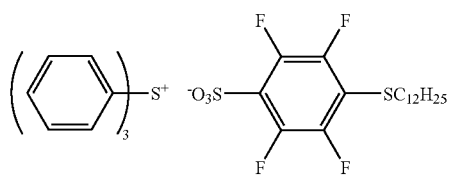 (z55)
(z56)
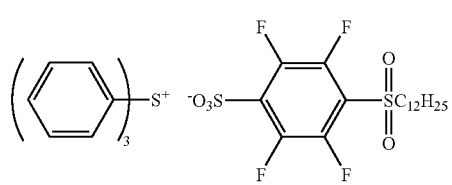
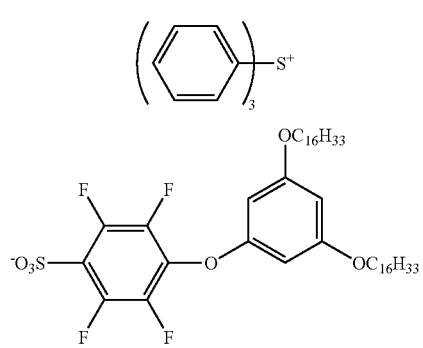 (z57)
(z58)

-continued
(z59) 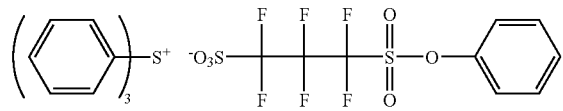
(z60) 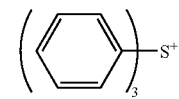
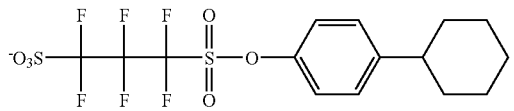
(z61) 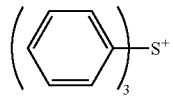
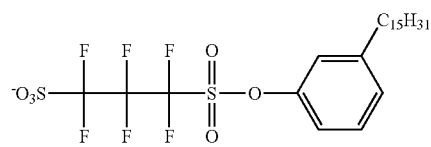
(z62) 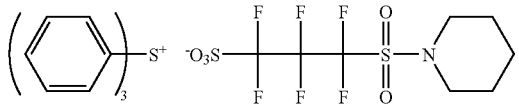
(z63) 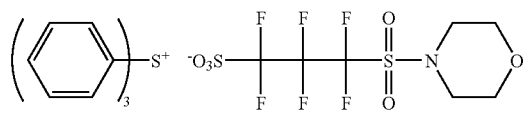
(z64) 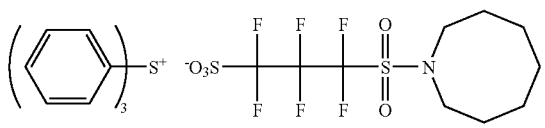
(z65) 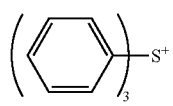
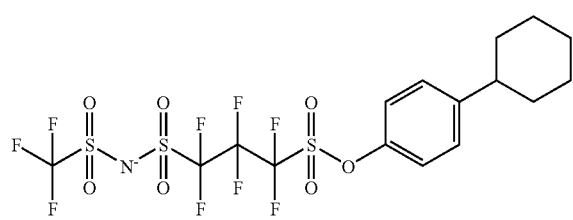
(z66) 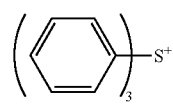
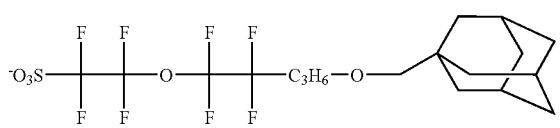
(z67) 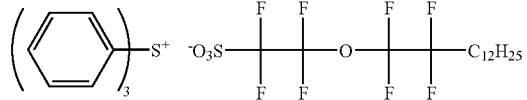
(z68) 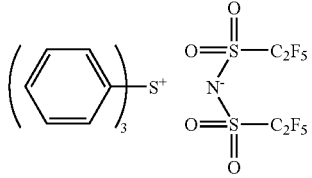
(z69) 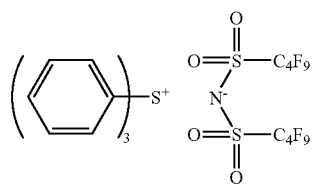
(z70) 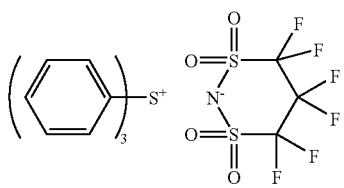

-continued
(z71)
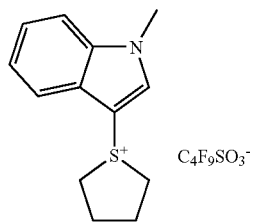
(z72)
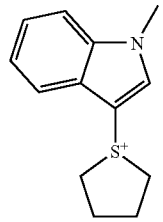
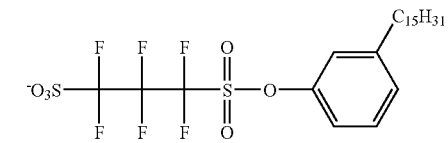
(z73)
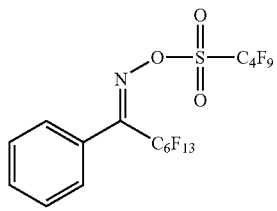
(z74)
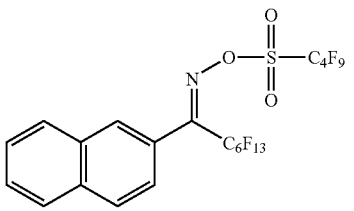
(z75)
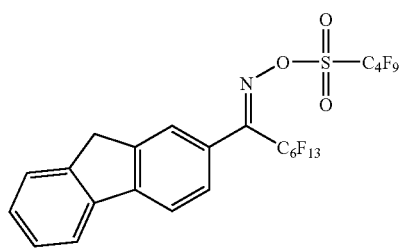
(z76)
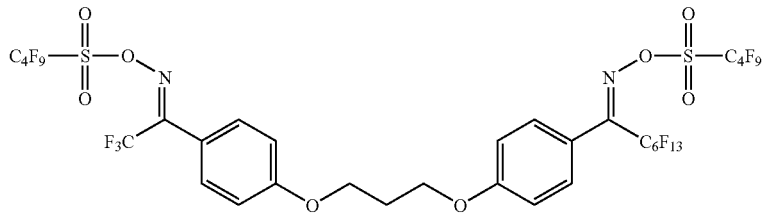
(z77)
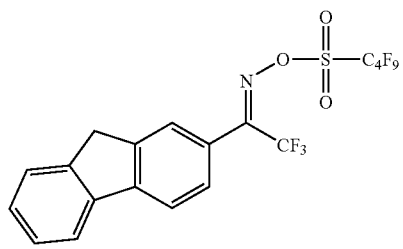
Ba-1
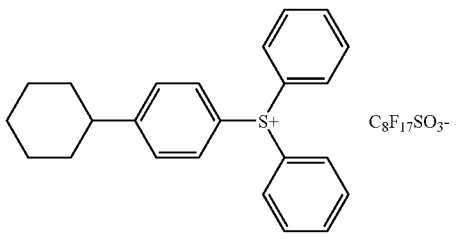
Ba-2
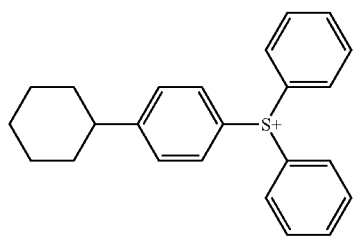
Ba-3
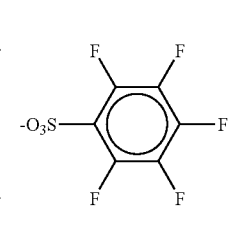

Ba-4
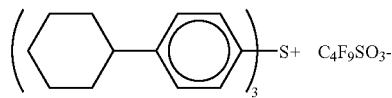
Ba-5
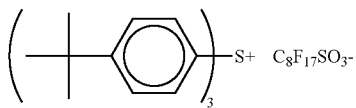
Ba-6
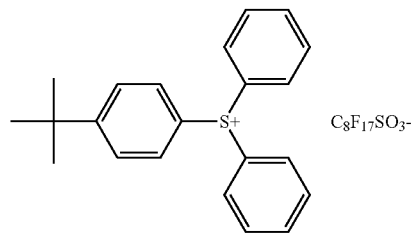
Ba-7
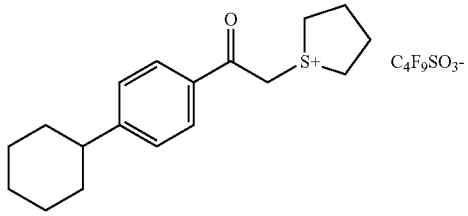
Ba-8
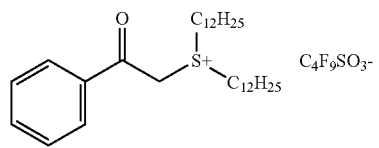
Ba-9
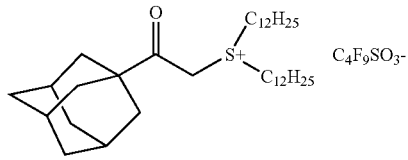
Ba-10
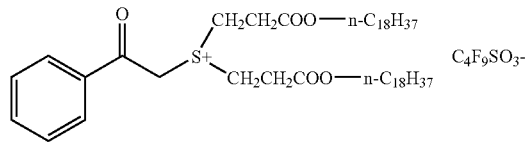
Ba-11
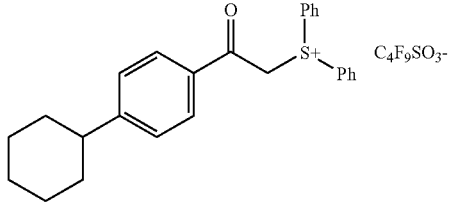
Ba-12
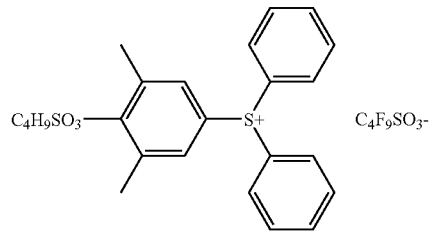
Ba-13
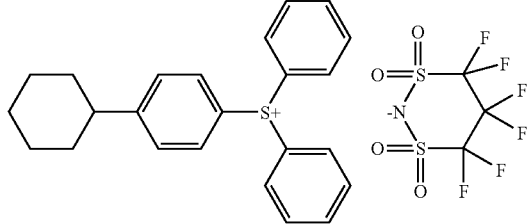
Ba-14
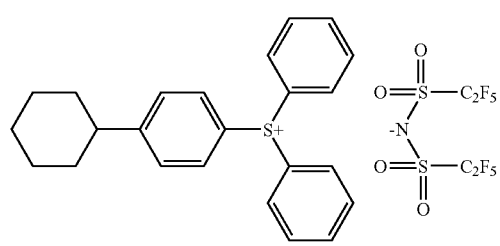
Bb-1
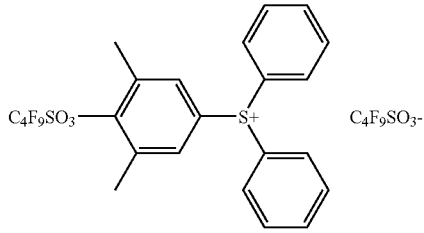
Bb-2
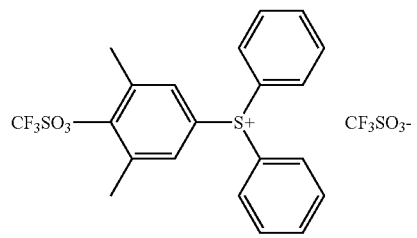
Bb-3
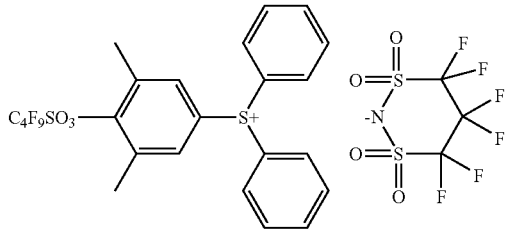

-continued
Bb-4
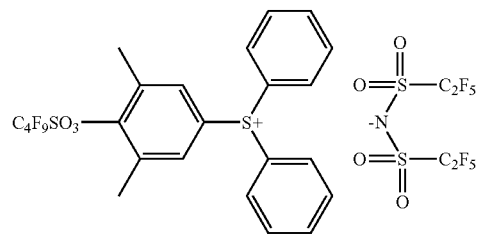
Bb-5
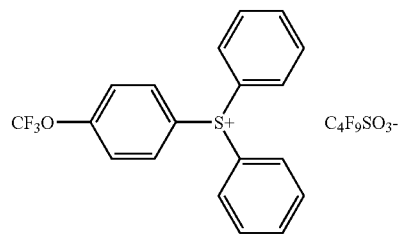
Bb-6
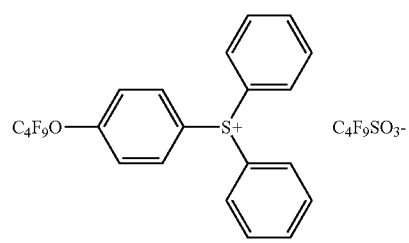
Bb-7
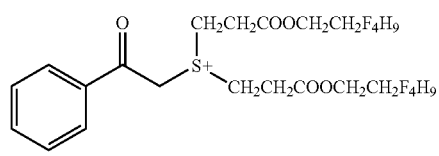
Bb-8
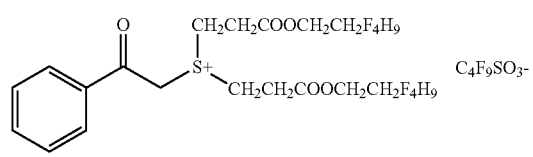
Bc-1
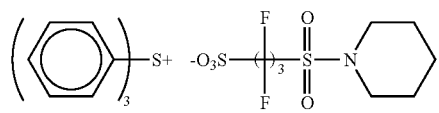
Bc-2
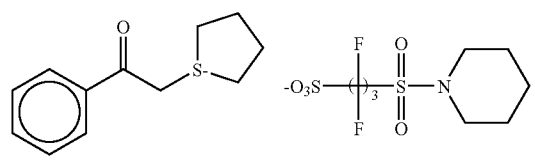
Bc-3
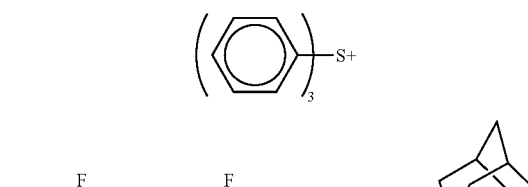
Bc-4
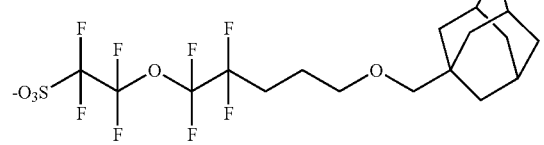
Bc-5
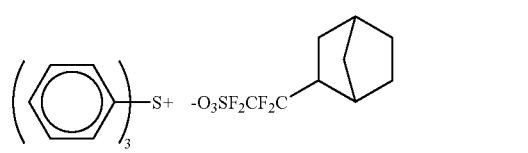
Bc-6
Bc-7

-continued
Bc-8
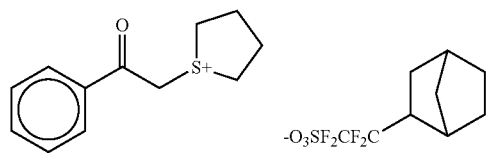
Bc-9
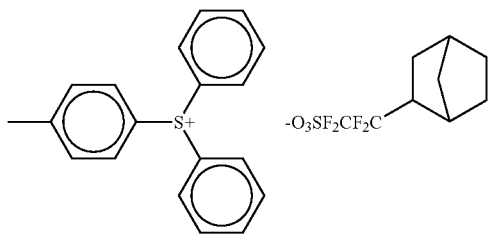
Bc-10
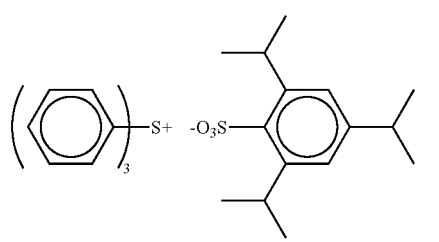
Bc-11
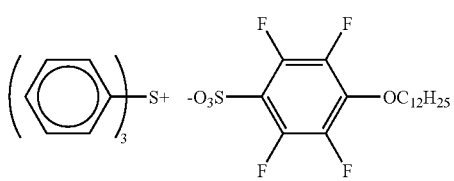
Bc-12
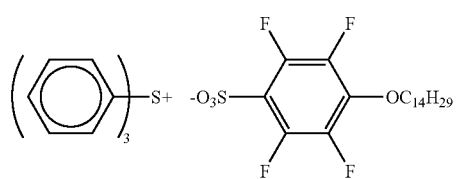
Bc-13
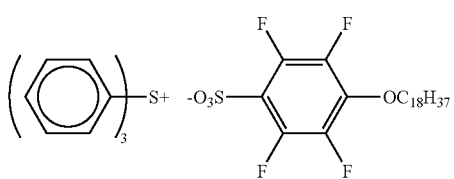
Bc-14
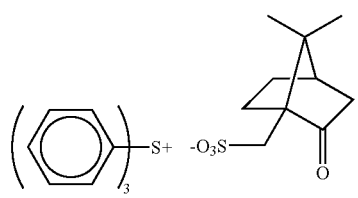
Bc-15
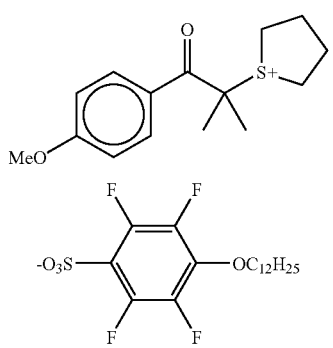
Bc-16
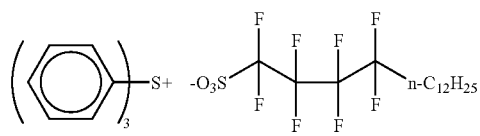
BaBc-1
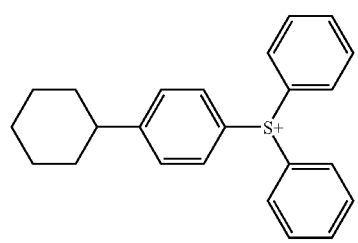
BaBc-2
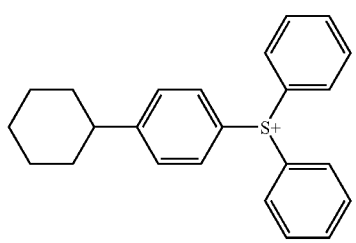
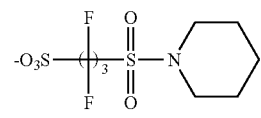
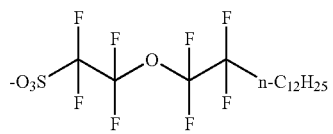

-continued
BaBc-3
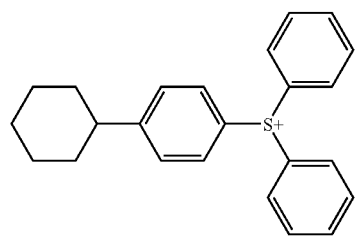 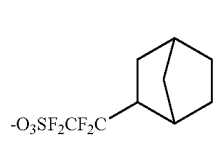
BaBc-4
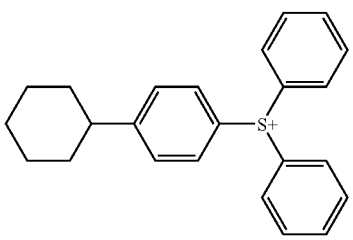
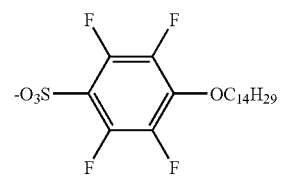
BaBc-5
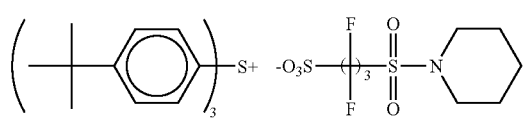
BaBc-6
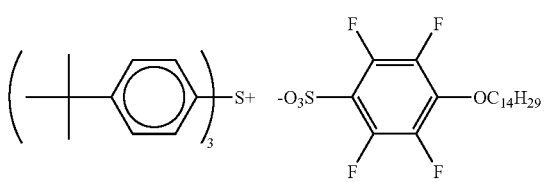
BaBc-7
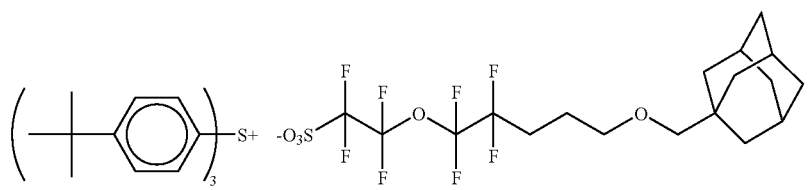
BaBc-8
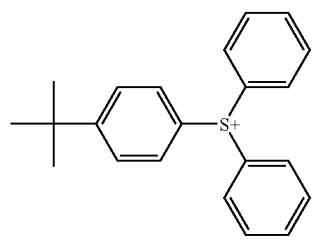
BaBc-9
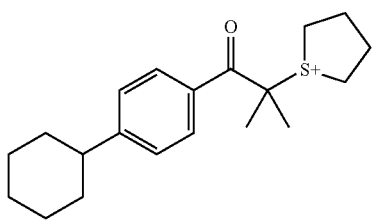
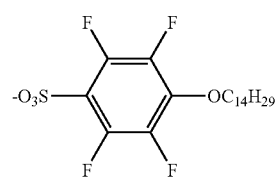
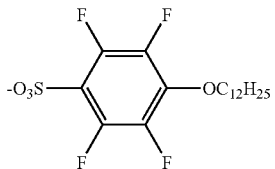
BaBc-10
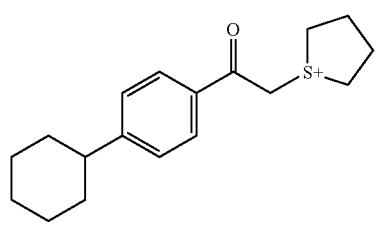
BaBc-11
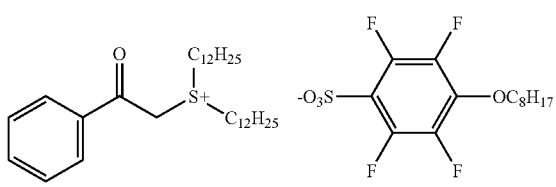
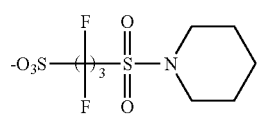

-continued
BaBc-12
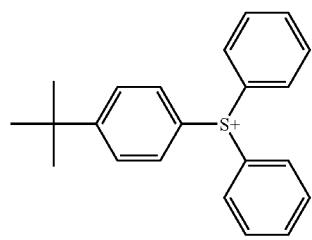 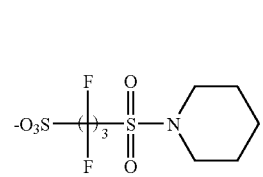
BaBc-13
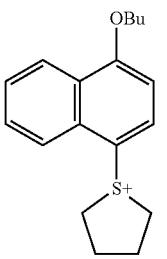 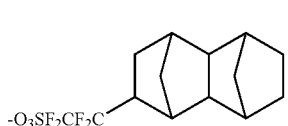
BbBc-1
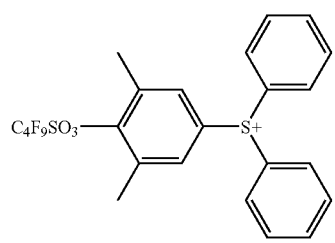 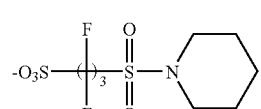
BbBc-2
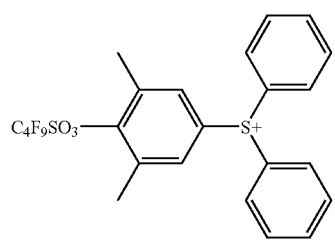 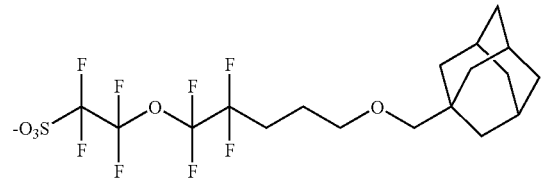
BbBc-3
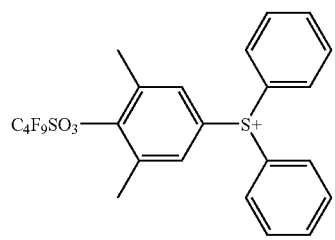 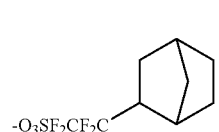
BbBc-4
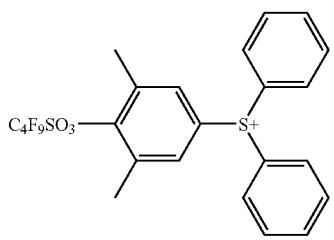
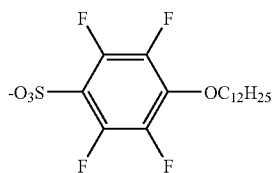
BbBc-5
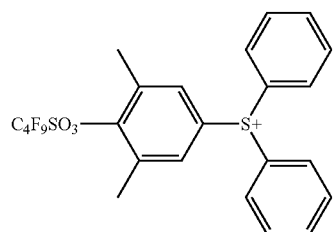
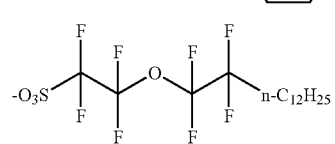
BbBc-6
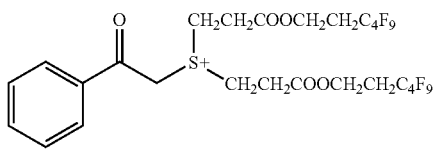
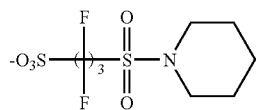

-continued
BbBc-7
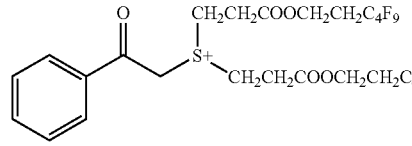 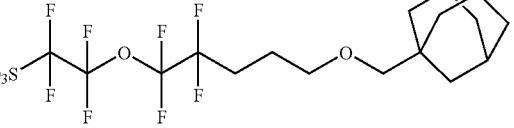
BbBc-8
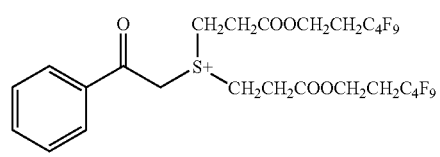
BbBc-9
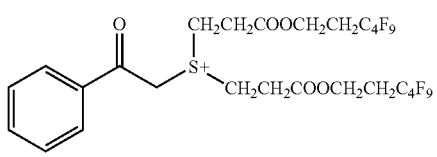
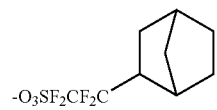
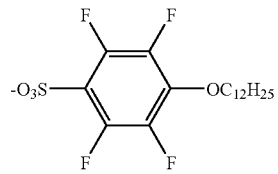
BbBc-10
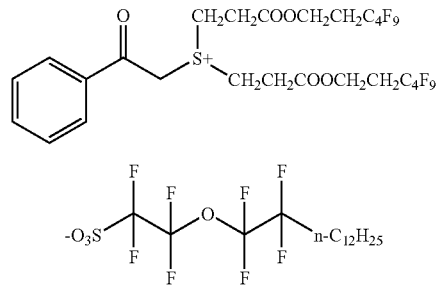
BbBc-11
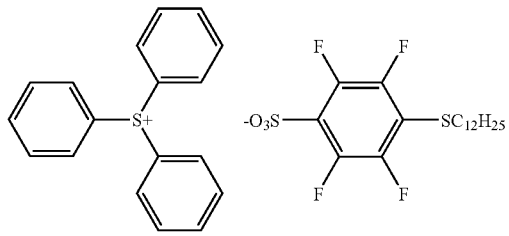
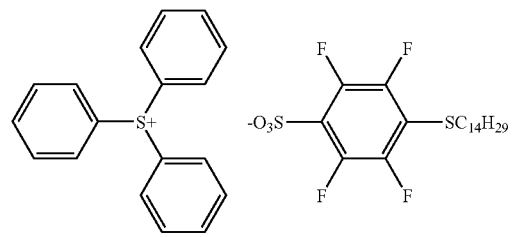
BbBc-12
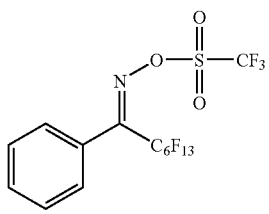
(PAG4-1)
(PAG4-2)
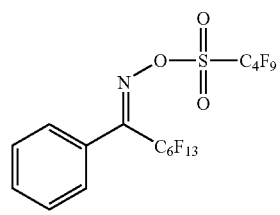
(PAG4-3)
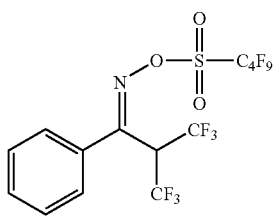
(PAG4-4)
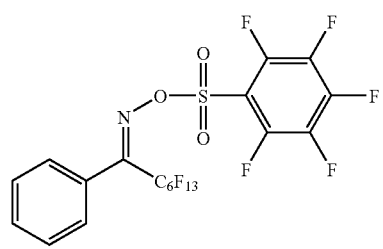
(PAG4-5)
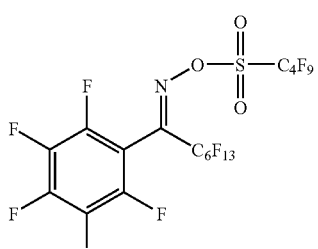

-continued
(PAG4-6)
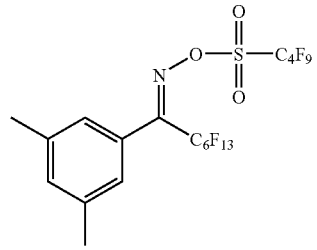
(PAG4-7)
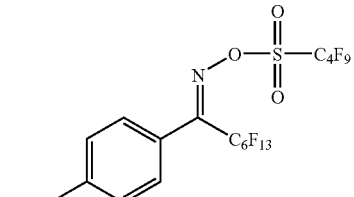
(PAG4-8)
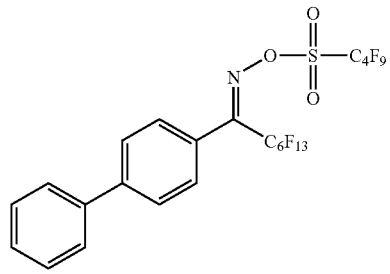
(PAG4-9)
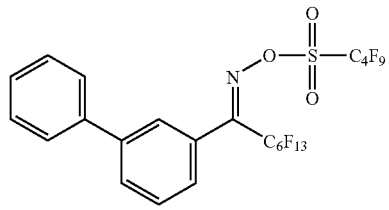
(PAG4-10)
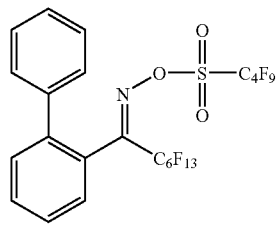
(PAG4-11)
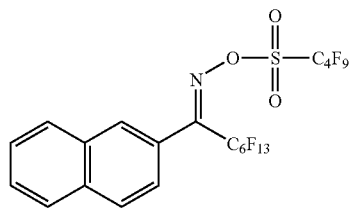
(PAG4-12)
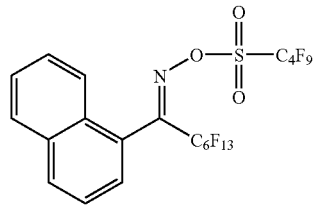
(PAG4-13)
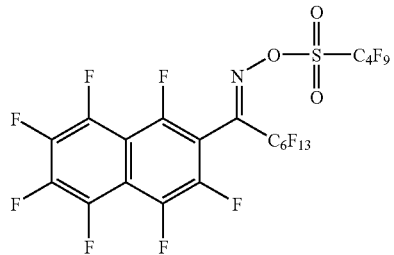
(PAG4-14)
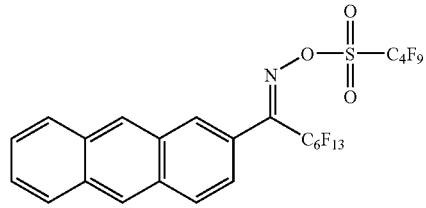
(PAG4-15)
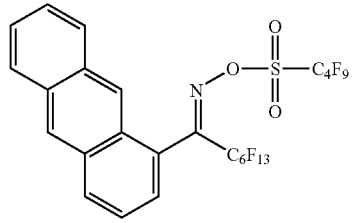
(PAG4-16)
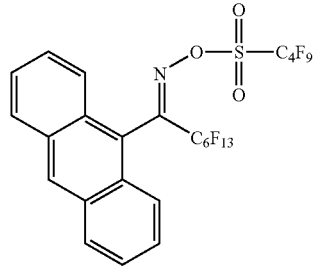
(PAG4-17)
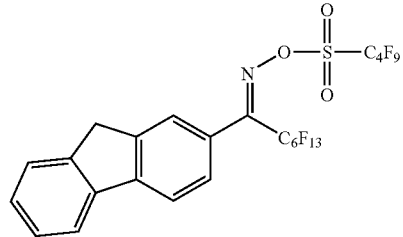

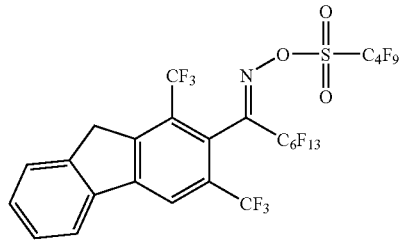 (PAG4-18)

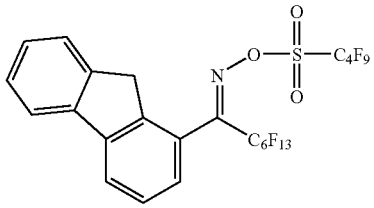 (PAG4-19)

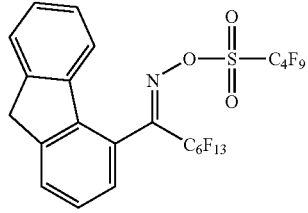 (PAG4-20)

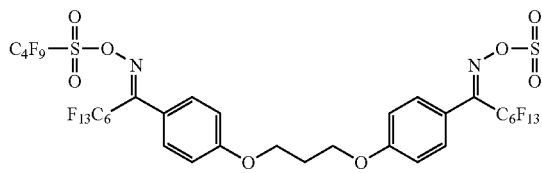 (PAG4-21)

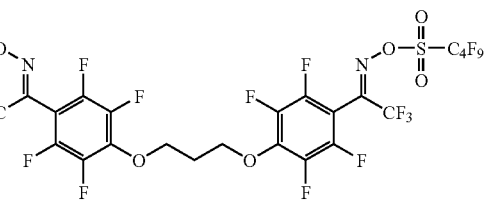 (PAG4-22)

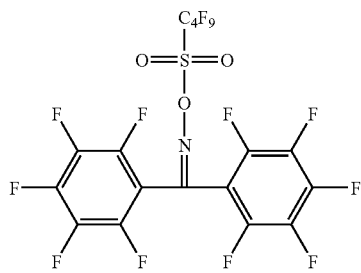 (PAG4-23)

The acid generator can be used singly or in combination of two or more kinds thereof.

The content of the acid generator in the positive working resist composition is preferably from 0.1 to 20% by mass, more preferably from 0.5 to 10% by mass, and further preferably from 1 to 7% by mass on the basis of the whole of the solids of the positive working resist composition.

[3] (C) Solvent:

The positive working resist composition of the invention is used by dissolving the respective components in a prescribed organic solvent.

Examples of the useful solvent include ethylene dichloride, cycloxanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, methoxybutanol and tetrahydrofuran.

In the invention, though the solvent may be used singly or in admixture, it is preferable to use a mixed solvent containing two or more kinds of solvents having a different functional group from each other. It is preferable to use a mixed solvent of a solvent having a hydroxyl group in a structure thereof and a solvent not having a hydroxyl group or a mixed solvent of a solvent having an ester structure and a solvent having a ketone structure as the mixed solvent of solvents having a different functional from each other. According to this, it is possible to reduce the generation of a particle at the preservation of the resist.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Of these, propylene glycol monomethyl ether and ethyl lactate are preferable.

Examples of the solvent not having a hydroxyl group include propylene glycol monomethyl ether acetate, ethyl ethoxypropionate, 2-heptanone, γ-butyrolactone, cyclo-hexanone, butyl acetate, N-methylpyrrolidone, N,N-dimethylacetamide and dimethyl sulfoxide. Of these, propylene glycol monomethyl ether acetate, ethyl ethoxypropionate, 2-heptanone, γ-butyrolactone, cyclohexanone and butyl acetate are more preferable; and propylene glycol monomethyl ether acetate, ethyl ethoxypropionate, 2-heptanone and cyclohexanone are especially preferable.

A mixing ratio (by mass) of the solvent having a hydroxyl group to the solvent not having a hydroxyl group is usually from 1/99 to 99/1, preferably from 10/90 to 90/10, and more preferably from 20/80 to 60/40. A mixed solvent containing 50% by mass or more of the solvent not having a hydroxyl group is especially preferable in view of the coating uniformity.

With respect to the mixed solvent of a mixture of a solvent having an ester structure and a solvent having a ketone structure, examples of the solvent having a ketone structure include cyclohexanone and 2-heptanone, with cyclohexanone being preferable. Examples of the solvent having an ester structure include propylene glycol monomethyl ether acetate, ethyl ethoxypropionate, γ-butyrolactone and butyl acetate, with propylene glycol monomethyl ether acetate being preferable.

A mixing ratio (by mass) of the solvent having an ester structure to the solvent having a ketone structure is usually from 1/99 to 99/1, preferably from 10/90 to 90/10, and more preferably from 20/80 to 60/40. A mixed solvent containing 50% by mass or more of the solvent having an ester structure is especially preferable in view of the coating uniformity.

[4] (D) Basic Compound:

For the purpose of reducing the change in performance with time from exposure to heating, it is preferable that the positive working resist composition of the invention contains a basic compound.

Preferred examples of the basic compound include compounds having a structure represented by any of the following formulae (A) to (E).

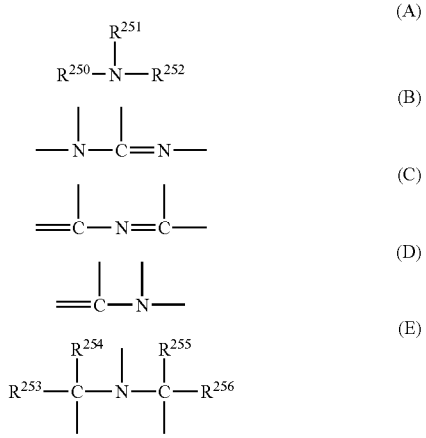

Here, $R^{250}$, $R^{251}$ and $R^{252}$ each independently represents a hydrogen atom, an alkyl group having from 1 to 20 carbon atoms, a cycloalkyl group having from 3 to 20 carbon atoms or an aryl group having from 6 to 20 carbon atoms; and $R^{250}$ and $R^{251}$ may be taken together to form a ring. Each of these groups may have a substituent. The substituted alkyl group or cycloalkyl group is preferably an aminoalkyl group having from 1 to 20 carbon atoms or an aminocycloalkyl group having from 3 to 20 carbon atoms or a hydroxyalkyl group having from 1 to 20 carbon atoms or a hydroxycycloalkyl group having from 3 to 20 carbon atoms, respectively.

Also, each of these groups may contain an oxygen atom, a sulfur atom or a nitrogen atom in the alkyl chain thereof.

In the formulae, $R^{253}$, $R^{254}$, $R^{255}$ and $R^{256}$ each independently represents an alkyl group having from 1 to 20 carbon atoms or a cycloalkyl group having from 3 to 20 carbon atoms.

Preferred examples of the compound include guanidine, aminopyrrolidine, pyrazole, pyrazoline, piperazine, aminomorpholine, aminoalkyl morpholines and piperidine; and each of these compounds may have a substituent. More preferred examples thereof include compounds having an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond and aniline derivatives having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-di-azabicyclo[4,3,0]nona-5-ene and 1,8-diazabicyclo[5,4,0]undeca-7-ene. Examples of the compound having an onium hydroxide structure include triaryl sulfonium hydroxides, phenacyl sulfonium hydroxides, sulfonium hydroxides having a 2-oxoalkyl group, and specifically triphenyl sulfonium hydroxide, tris(t-butylphenyl)sulfonium hydroxide, bis-(t-butylphenyl)iodonium hydroxide, phenacylthiophenium hydroxide and 2-oxopropylthiophenium hydroxide. The compound having an onium carboxylate structure is a compound having an onium hydroxide structure in which an anion segment thereof is carboxylated; and examples thereof include an acetate, an adamantane-1-carboxylate and a perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

In the positive working resist composition of the invention, the basic compound is used singly or in combination of two or more kinds thereof. The amount of the basic compound (in total) to be used is usually from 0.001 to 10% by mass, and preferably from 0.01 to 5% by mass on the basis of the solids of the positive working resist composition. The amount of the basic compound to be used is preferably 0.001% by mass or more in view of obtaining a sufficient addition effect and is preferably not more than 10% by mass in view of the sensitivity and developability of an unexposed area.

[5] (E) Dissolution inhibiting compound having a molecular weight of not more than 3,000, which decomposes by action of an acid to increase its solubility in an alkaline developer (this compound will also be referred to as "component (E)" or "dissolution inhibiting compound"):

As (E) a dissolution inhibiting compound having a molecular weight of not more than 3,000, which decomposes by action of an acid to increase its solubility in an alkaline developer, in order that the transmittance to light of not more than 220 nm may not be reduced, an acid-decomposable group-containing alicyclic or aliphatic compound, such as acid-decomposable group-containing cholic acid derivatives as described in *Processing of SPIE*, 2724, 355 (1996), is preferable. With respect to the acid-decomposable group and the alicyclic structure, the same as described above in the alicyclic hydrocarbon based acid-decomposable resin can be referred to herein.

In the case where the positive working resist composition of the invention is exposed with a KrF excimer laser or an electron beam, a compound containing a structure in which a phenolic hydroxyl group of a phenol compound is substituted with an acid-decomposable group is preferable. The phenol compound is preferably one containing from 1 to 9 phenol skeletons, and more preferably one containing from 2 to 6 phenol skeletons.

In the invention, the molecular weight of the dissolution inhibiting compound is not more than 3,000, preferably from 300 to 3,000, and more preferably from 500 to 2,500.

The addition amount of the dissolution inhibiting compound is preferably from 3 to 50% by mass, and more preferably from 5 to 40% by mass relative to the solids of the positive working resist composition.

Specific examples of the dissolution inhibiting compound are given below, but it should not be construed that the invention is limited thereto.

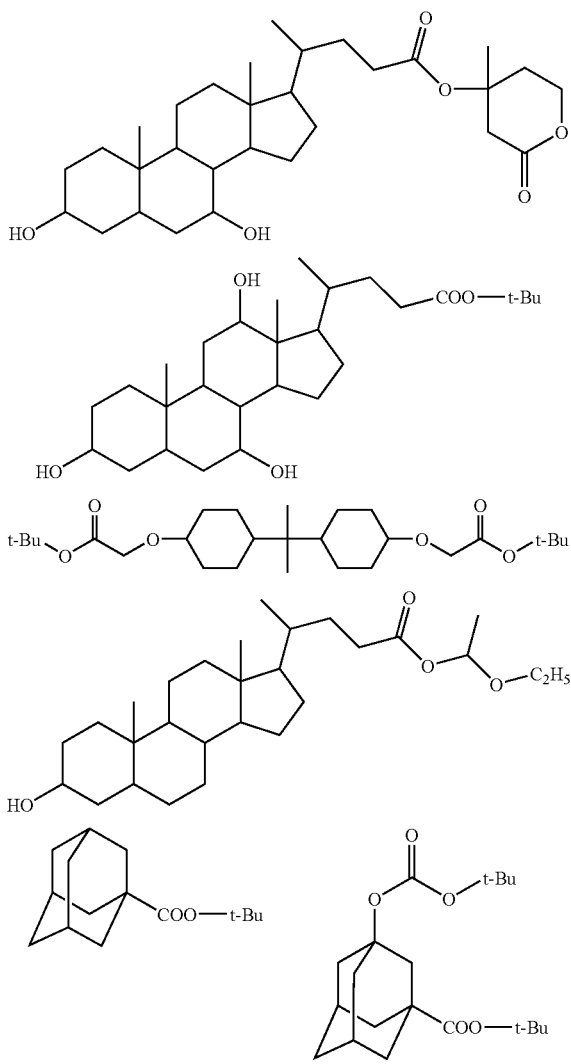

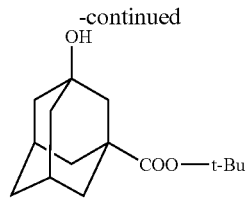

-continued

[6] (F) Surfactant:

It is preferable that the positive working resist composition of the invention contains a surfactant; and it is more preferable that the positive working resist composition of the invention contains either one or two or more kinds of fluorine based and/or silicon based surfactants (for example, a fluorine based surfactant, a silicon based surfactant and a surfactant containing both a fluorine atom and a silicon atom).

When the positive working resist composition of the invention contains a fluorine based and/or silicon based surfactant, it is possible to give a resist pattern with satisfactory sensitivity and resolution and with less adhesiveness and development defect at the time of use of an exposure light source of not more than 250 nm, and especially not more than 220 nm.

Examples of the fluorine based and/or silicon based surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants can also be used as they are.

Examples of the commercially available surfactant which can be used include fluorine based surfactants and silicon based surfactants, for example, EFTOP EF301 and EFTOP EF303 (all of which are manufactured by Shin-Akita Kasei Co., Ltd.); FLUORAD FC430, FLUORAD FC431 and FLUORAD FC4430 (all of which manufactured by Sumitomo 3M Limited); MEGAFAC F171, MEGAFAC F173, MEGAFAC F176, MEGAFAC F189, MEGAFAC F113, MEGAFAC F110, MEGAFAC F177, MEGAFAC F120 and MEGAFAC R08 (all of which are manufactured by Dainippon Ink and Chemicals, Incorporated); SURFLON S-382, SURFLON SC101, SURFLON SC102, SURFLON SC103, SURFLON SC104, SURFLON SC105 and SURFLON SC106 (all of which manufactured by Asahi Glass Co., Ltd.); TROYSOL S-366 (manufactured by Troy Chemical Corporation); GF-300 and GF-150 (all of which are manufactured by Toagosei Co., Ltd.); SURFLON S-393 (manufactured by AGC Seimichemical Co., Ltd.); EFTOP EF121, EFTOP EF122A, EFTOP EF122B, EFTOP EF122C, EFTOP EF125M, EFTOP EF135M, EFTOP EF351, EFTOP EF352, EFTOP EF801, EFTOP EF802 and EFTOP EF601 (all of which are manufactured by Jemco Inc.); PF 636, PF 656, PF 6320 and PF 6520 (all of which are manufactured by OMNOVA Solutions Inc.); and FTX-204D, FTX-208G, FTX-218G, FTX-230G, FTX-204D, FTX-208D, FTX-212D, FTX-218 and FTX-222D (all of which are manufactured by NEOS Company Limited). Also, a polysiloxane polymer, KP-341 (manufactured by Shin-Etsu Chemical Co., Ltd.) can also be used as the silicon based surfactant.

Also, as the surfactant, in addition to the foregoing known surfactants, surfactants using a polymer having a fluoro aliphatic group derived from fluoro aliphatic compounds manufactured by a telomerization method (also called a telomer method) or an oligomerization method (also called an oligomer method) can be used. The fluoro aliphatic compound can be synthesized according to the method disclosed in JP-A-2002-90991.

As the polymer having a fluoro aliphatic group, copolymers of a fluoro aliphatic group-containing monomer and a (poly(oxyalkylene)) acrylate and/or a (poly(oxyalkylene)) methacrylate are preferable; and these monomers may be irregularly distributed or block copolymerized. Also, examples of the poly(oxyalkylene) group include a poly(oxyethylene) group, a poly(oxypropylene) group and a poly(oxybutylene) group. A unit containing alkylenes having a different chain length within the same chain length, such as poly(oxyethylene/oxypropylene/oxyethylene block connected body) and poly(oxyethylene/oxypropylene block connected body) may also be used. Furthermore, the copolymer of a fluoro aliphatic group-containing monomer and a (poly(oxyalkylene)) acrylate (or methacrylate) may be not only a binary copolymer but also a ternary or multi-component copolymer obtainable by simultaneous copolymerization of two or more kinds of different fluoro aliphatic group-containing monomers or two or more kinds of different (poly(oxyalkylene)) acrylates (or methacrylates).

Examples of commercially available surfactants include MEGAFAC F178, MEGAFAC F-470, MEGAFAC F-473, MEGAFAC F-475, MEGAFAC F-476 and MEGAFAC F-472 (all of which are manufactured by Dainippon Ink and Chemicals, Incorporated). Furthermore, examples of the surfactant include a copolymer of a $C_6F_{13}$ group-containing acrylate (or methacrylate) and a (poly(oxyalkylene)) acrylate (or methacrylate); a copolymer of a $C_6F_{13}$ group-containing acrylate (or methacrylate), (poly(oxyethylene)) acrylate (or methacrylate) and (poly(oxypropylene)) acrylate (or methacrylate); a copolymer of a $C_8F_{17}$ group-containing acrylate (or methacrylate) and a (poly(oxyalkylene)) acrylate (or methacrylate); and a copolymer of a $C_8F_{17}$ group-containing acrylate (or methacrylate), (poly(oxyethylene)) acrylate (or methacrylate) and (poly(oxypropylene)) acrylate (or methacrylate).

Also, in the invention, other surfactants than the fluorine based and/or silicon based surfactant can also be used. Specific examples thereof include nonionic surfactants such as polyoxyethylene alkyl ethers (for example, polyoxyethylene lauryl ether, polyoxyethylene stearyl ether, polyoxyethylene cetyl ether and polyoxyethylene oleyl ether), polyoxyethylene alkylaryl ethers (for example, polyoxyethylene octylphenyl ether and polyoxyethylene nonylphenyl ether), polyoxyethylene/polyoxypropylene block copolymers, sorbitan fatty acid esters (for example, sorbitan monolaurate, sorbitan monopalmitate, sorbitan monostearate, sorbitan monooleate, sorbitan trioleate and sorbitan tristearate) and polyoxyethylene sorbitan fatty acid esters (for example, polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate).

The surfactant may be used singly or may be used in combination of several kinds thereof.

The amount of the surfactant to be used is preferably from 0.0001 to 2% by mass, and more preferably from 0.001 to 1% by mass relative to the whole amount (excluding the solvent) of the positive working resist composition.

<Other Additives>

The positive working resist composition of the invention can contain a dye, a light absorber, a plasticizer, a surfactant other than the foregoing component (F), a photosensitizer, a compound capable of accelerating the dissolution in the developer and so on as the need arises.

A dissolution accelerating compound in the developer which can be used in the invention is a low-molecular weight compound having two or more phenolic OH groups or one or more carboxyl groups and having a molecular weight of not more than 1,000. In the case where the compound has a carboxyl group, the compound is preferably an alicyclic or aliphatic compound.

The addition amount of such a dissolution accelerating compound is preferably from 2 to 50% by mass, and more preferably from 5 to 30% by mass relative to the resin (A). The addition amount of the dissolution accelerating compound is preferably not more than 50% by mass in view of inhibiting a development residue and preventing the deformation of a pattern at the time of development.

Such a phenol compound having a molecular weight of not more than 1,000 can be easily synthesized by those skilled in the art by referring to a method as described in, for example, JP-A-4-122938, JP-A-2-28531, U.S. Pat. No. 4,916,210 and European Patent No. 219,294.

Specific examples of the carboxyl group-containing alicyclic or aliphatic compound include carboxylic acid derivatives having a steroid structure, such as cholic acid, deoxycholic acid and lithocholic acid, adamantanecarboxylic acid derivatives, adamantanedicarboxylic acid, cyclohexanecarboxylic acid and cyclohexanedicarboxylic acid. However, it should not be construed that the invention is limited thereto.

As the plasticizer, in addition to commercially available plasticizers, any compound may be used without particular limitations so far as it is a compound having a molecular weight of not more than 1,000, which is compatible with the polymer to be used and which has an effect for dropping a softening point of the film. From the viewpoint of compatibility, the molecular weight is preferably not more than 750, and more preferably not more than 500. A compound having a boiling point of 300° C. or higher at atmospheric pressure and a melting point of no higher than 20° C. is preferable. Specific examples of the compound include diisobutyl phthalate, tricresyl phosphate, triethylene glycol diphenyl ether, diethylene glycol dibenzoate and triethylene glycol diacetate.

As the light absorber, any compound can be used without particular limitations so far as it is a compound having absorption at the exposure wavelength and not generating an acid by the exposure. In the case where the light source wavelength is 193 nm, a compound having an aromatic ring is preferable. Specific examples thereof include benzene derivatives, naphthalene derivatives, anthracene derivatives, furan derivatives, thiophene derivatives and indole derivatives.

In the case where a photosensitive film composed of the photosensitive composition of the invention is exposed through a liquid immersion medium, a hydrophobic resin (HP) can be further added as the need arises. According to this, the hydrophobic resin (HP) is localized in a photosensitive film surface layer, and in the case where the liquid immersion medium is water, when a photosensitive film is formed, it is possible to enhance a receding contact angle of the photosensitive film surface against water and to enhance the follow-up properties of the liquid immersion water. Any resin is useful as the hydrophobic resin (HP) so far as it is able to enhance the receding contact angle of the surface upon addition, and a resin having at least one of a fluorine atom and a silicon atom is preferable. The receding contact angle of the photosensitive film is from 60° to 80°, and preferably 70° or more. The addition amount of the hydrophobic resin (HP) can be properly adjusted such that the receding contact angle of the photosensitive film falls within the foregoing range and is preferably from 0.1 to 10% by mass, and more preferably from 0.1 to 5% by mass on the basis of the whole of the solids of the photosensitive composition.

In order that the resist film may not be brought into direct contact with the liquid immersion liquid, a film which is sparingly soluble in the liquid immersion liquid (hereinafter also referred to as "top coat") may be provided between the resist film composed of the resist composition of the invention and the liquid immersion liquid. Examples of functions necessary for the top coat include coating properness to a resist upper layer part, transparency to radiation, especially light of 193 nm and sparing solubility in the liquid immersion liquid. It is preferable that the top coat does not mix with the resist and can be uniformly coated on the resist upper layer.

From the viewpoint of the transparency to light of 193 nm, a polymer which does not contain an abundant amount of an aromatic moiety is preferable as the top coat. Specific examples thereof include hydrocarbon polymers, acrylic ester polymers, polymethacrylic acid, polyacrylic acid, polyvinyl ether, silicon-containing polymers and fluorine-containing polymers. The foregoing hydrophobic resin (HP) is also suitable as the top coat. From the viewpoint of the matter that when impurities elute from the top coat into the liquid immersion liquid, they stain an optical lens, it is preferable that the amount of residual monomer components of the polymer contained in the top coat is low.

In releasing the top coat, a developer may be used, or a release agent may be separately used. A solvent having low penetration into the photosensitive film is preferable as the release agent. In view of the matter that the release step can be carried out simultaneously with the development treatment step of the photosensitive film, it is preferable that the top coat can be released with an alkaline developer. From the viewpoint of releasing the top coat with an alkaline developer, it is preferable that the top coat is acidic. However, from the viewpoint of non-intermix properties with the photosensitive film, the top coat may be neutral or alkaline.

When there is no difference in refractive index between the top coat and the liquid immersion liquid, the resolution is enhanced. In an ArF excimer laser (wavelength: 193 nm), in the case where water is used as the liquid immersion liquid, it is preferable that the top coat for ArF liquid immersion exposure has a refractive index close to the liquid immersion liquid. From the viewpoint of making the top coat have a refractive index close to the liquid immersion liquid, it is preferable that the top coat has a fluorine atom. Also, from the viewpoints of the transparency and refractive index, a thin film is preferable as the top coat.

It is preferable that the top coat neither mixes with the photosensitive film nor mixes with the liquid immersion liquid. From this viewpoint, in the case where the liquid immersion liquid is water, it is preferable that a solvent to be used in the top coat is a medium which is sparingly soluble in the solvent to be used in the photosensitive composition and insoluble in water. Furthermore, in the case where the liquid immersion liquid is an organic solvent, the top coat may be soluble in water or insoluble in water.

<Hydrophobic Resin (HP)>

The resist composition of the invention may contain a hydrophobic resin (HP) for hydrophobilizing the surface. As such a hydrophobic resin (HP), a resin having at least one of a fluorine atom and a silicon atom is preferable. Also, the hydrophobic resin (HP) can be suitably used as the top coat.

The fluorine atom or silicon atom in the resin (HP) may exist in the principal chain of the resin or may be substituted on the side chain.

It is preferable that the resin (HP) is a resin having, as a fluorine atom-containing partial structure, a fluorine atom-containing alkyl group, a fluorine atom-containing cycloalkyl group or a fluorine atom-containing aryl group.

The fluorine atom-containing alkyl group (preferably one having from 1 to 10 carbon atoms, and more preferably one having from 1 to 4 carbon atoms) is a linear or branched alkyl group in which at least one hydrogen atom is substituted with a fluorine atom and may further have other substituent.

The fluorine atom-containing cycloalkyl group is a monocyclic or polycyclic cycloalkyl group in which at least one hydrogen atom is substituted with a fluorine atom and may further have other substituent.

The fluorine atom-containing aryl group is an aryl group (for example, a phenyl group and a naphthyl group) in which at least one hydrogen atom is substituted with a fluorine atom and may further have other substituent.

Examples of the fluorine atom-containing alkyl group, the fluorine atom-containing cycloalkyl group and the fluorine atom-containing aryl group include groups represented by the following general formulae, but it should not be construed that the invention is limited thereto.

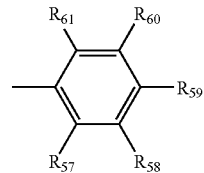

(F2)

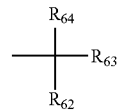

(F3)

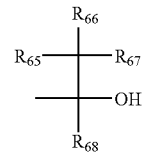

(F4)

In the general formulae (F2) to (F4), $R_{57}$ to $R_{68}$ each independently represents a hydrogen atom, a fluorine atom or an alkyl group, provided that at least one of $R_{57}$ to $R_{61}$, $R_{62}$ to $R_{64}$ and $R_{65}$ to $R_{68}$ represents a fluorine atom or an alkyl group in which at least one hydrogen atom is substituted with a fluorine atom (preferably one having from 1 to 4 carbon atoms). It is preferable that all of $R_{57}$ to $R_{61}$ and $R_{65}$ to $R_{67}$ are a fluorine atom. Each of $R_{62}$, $R_{63}$ and $R_{68}$ is preferably an alkyl group in which at least one hydrogen atom is substituted with a fluorine atom (preferably one having from 1 to 4 carbon atoms), and more preferably a perfluoroalkyl group having from 1 to 4 carbon atoms. $R_{62}$ and $R_{63}$ may be taken together to form a ring.

Specific examples of the group represented by the general formula (F2) include a p-fluorophenyl group, a pentafluorophenyl group and a 3,5-di(trifluoromethyl)phenyl group.

Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferable; and a hexafluoroisopropyl group and a heptafluoroisopropyl group are more preferable.

Specific examples of the group represented by the general formula (F4) include —C(CF$_3$)$_2$OH, —C(C$_2$F$_5$)$_2$OH, —C(CF$_3$)(CH$_3$)OH and —CH(CF$_3$)OH, with —(CF$_3$)$_2$OH being preferable.

Specific examples of the repeating unit containing a group represented by any of the general formulae (F2) to (F4) are given below. In the following, X$_1$ represents a hydrogen atom, —CH$_3$, —F or —CF$_3$; and X$_2$ represents —F or —CF$_3$.

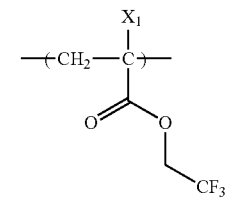
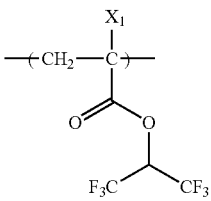
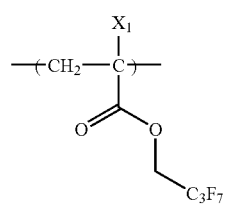
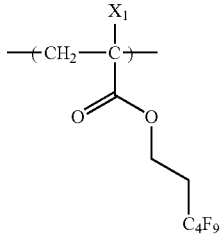
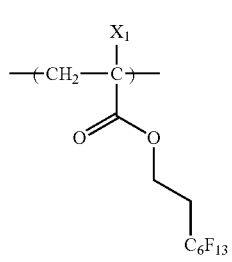
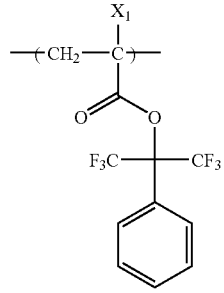
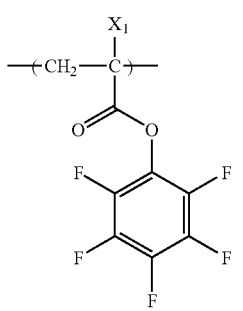
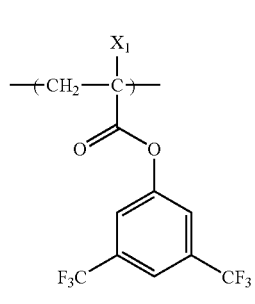

-continued

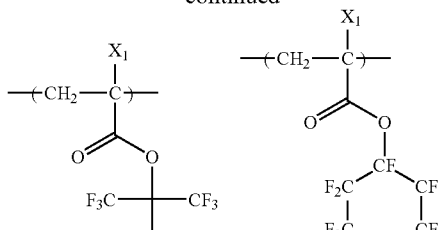
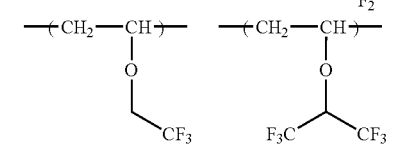
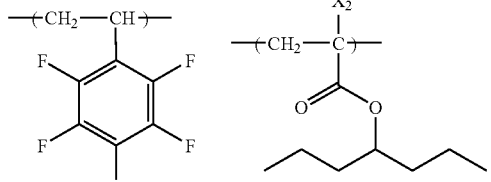
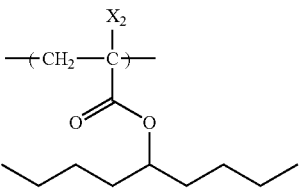
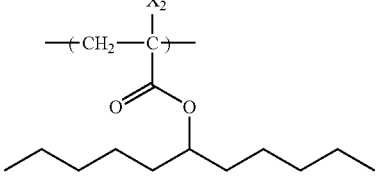
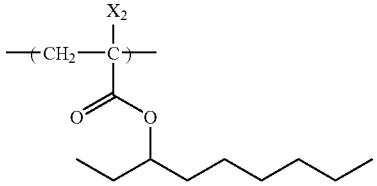
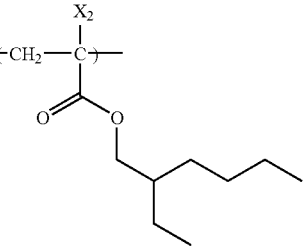
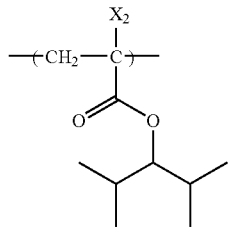
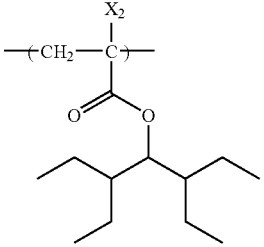
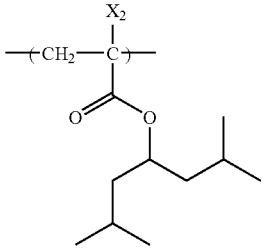

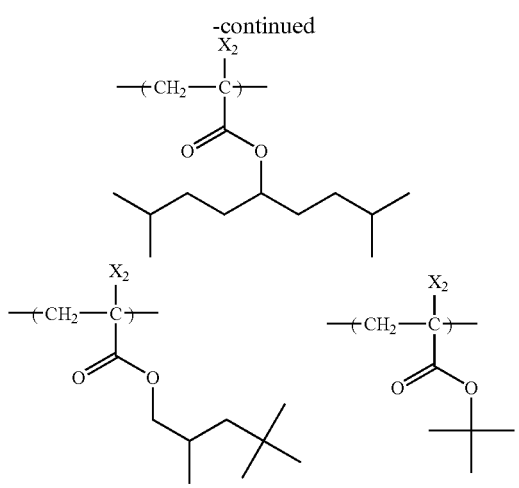

It is preferable that the resin (HP) is a resin having, as a silicon atom-containing partial structure, an alkylsilyl structure (preferably a trialkylsilyl group) or a cyclic cyclohexane structure.

Specific examples of the alkylsilyl structure and the cyclic cyclohexane structure include groups represented by the following general formulae (CS-1) to (CS-3).

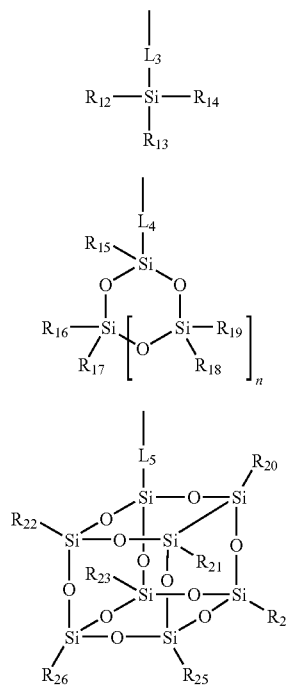

In the general formulae (CS-1) to (CS-3), $R_{12}$ to $R_{26}$ each independently represents a linear or branched alkyl group (preferably one having from 1 to 20 carbon atoms) or a cycloalkyl group (preferably one having from 3 to 20 carbon atoms).

$L_3$ to $L_5$ each represents a single bond or a divalent connecting group. Examples of the divalent connecting group include one member selected from the group consisting of an alkylene group, a phenyl group, an ether group, a thioether group, a carbonyl group, an ester group, an amide group, a urethane group and a urea group or a combination of two or more kinds thereof.

X represents a hydrogen atom, —$CH_3$, —F or —$CF_3$.

n denotes an integer of 1 to 5.

Specific examples of the repeating unit containing a group represented by any of the general formulae (CS-1) to (CS-3) are given below.

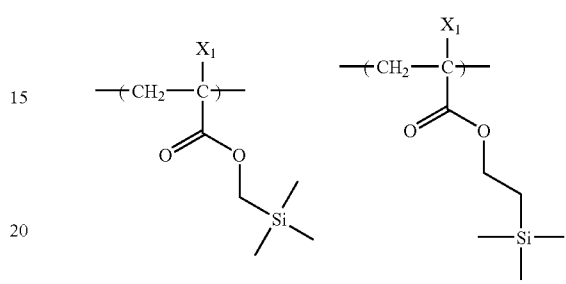

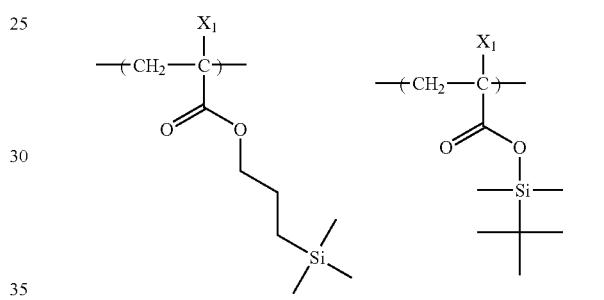

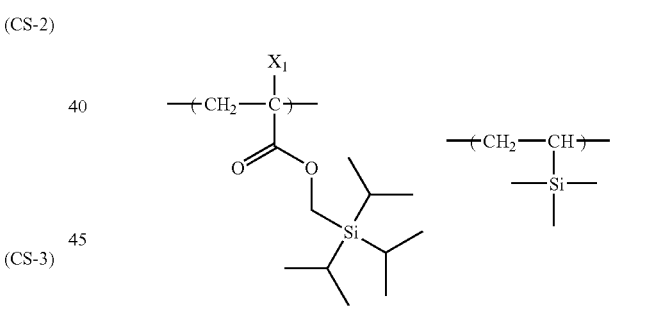

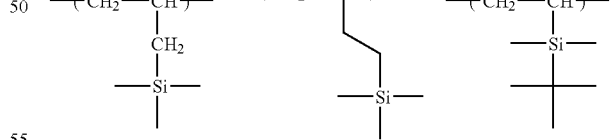

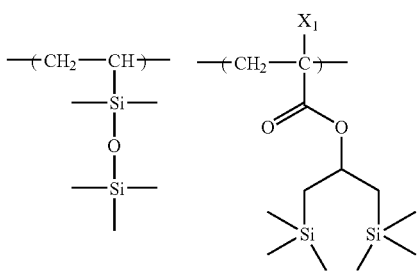

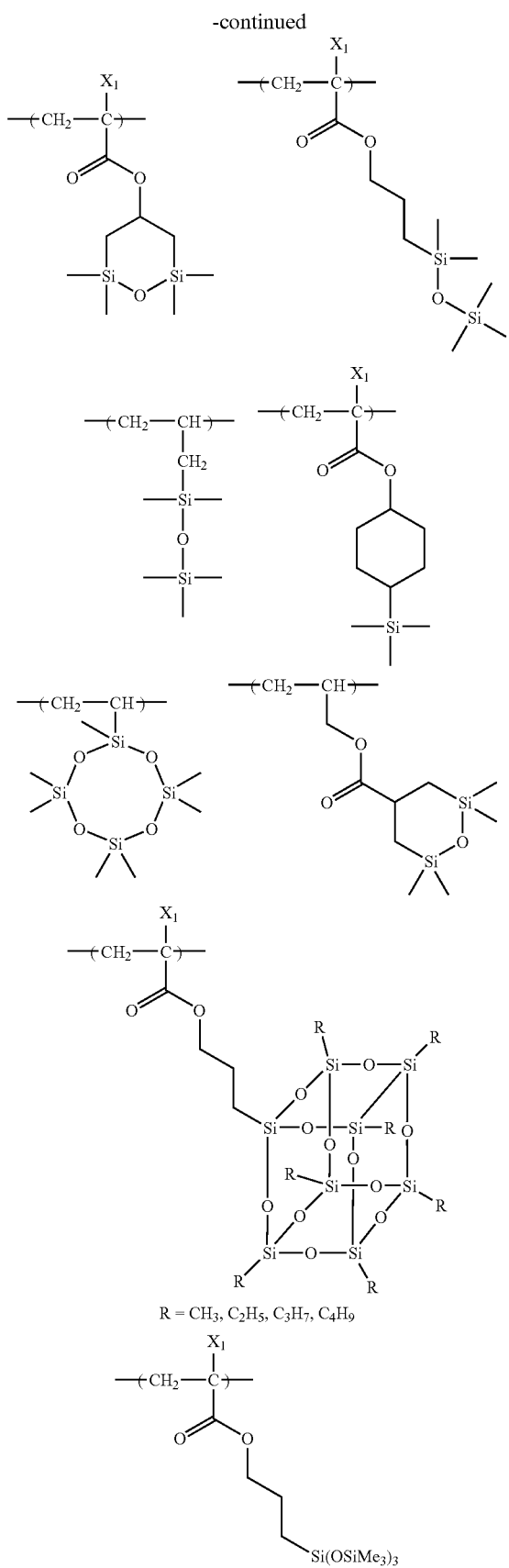

Furthermore, the resin (HP) may have at least one group selected from the group consisting of the following (x) to (z):

(x) an alkali-soluble group, (y) a group which decomposes by action of an alkaline developer to increase its solubility in the alkaline developer, and (z) a group which decomposes by the action of an acid.

Examples of the alkali-soluble group (x) include groups having a phenolic hydroxyl group, a carboxylic group, a fluorinated alcohol group, a sulfonic group, a sulfonamide group, a sulfonylimide group, an (alkylsulfonyl) (alkylcarbonyl)methylene group, an (alkylsulfonyl) (alkylcarbonyl)imide group, a bis(alkylcarbonyl)methylene group, a bis(alkylcarbonyl)imide group, a bis(alkylsulfonyl)methylene group, a bis(alkylsuofonyl)imide group, a tris(alkylcarbonyl)methylene group or a tris(alkylsulfonyl)methylene group.

Preferred examples of the alkali-soluble group include a fluorinated alcohol group (preferably hexafluoroisopropanol), a sulfonimide group and a bis(alkylcarbonyl)methylene group.

As the repeating unit having the alkali-soluble group (x), all of a repeating unit in which an alkali-soluble group is directly bound to the principal chain of a resin, such as a repeating unit by acrylic acid or methacrylic acid; a repeating unit in which an alkali-soluble group is bound to the principal chain of a resin via a connecting group; and a repeating unit in which an alkali-soluble group-containing polymerization initiator or chain transfer agent is used at the time of polymerization and introduced into a terminal end of a polymer chain are preferable.

The content of the repeating unit having the alkali-soluble group (x) is preferably from 1 to 50% by mole, more preferably from 3 to 35% by mole, and further preferably from 5 to 20% by mole relative to the whole of the repeating units in the polymer.

Specific examples of the repeating unit having the alkali-soluble group (x) are given below. In the formulae, Rx represents H, $CH_3$, $CF_3$ or $CH_2OH$.

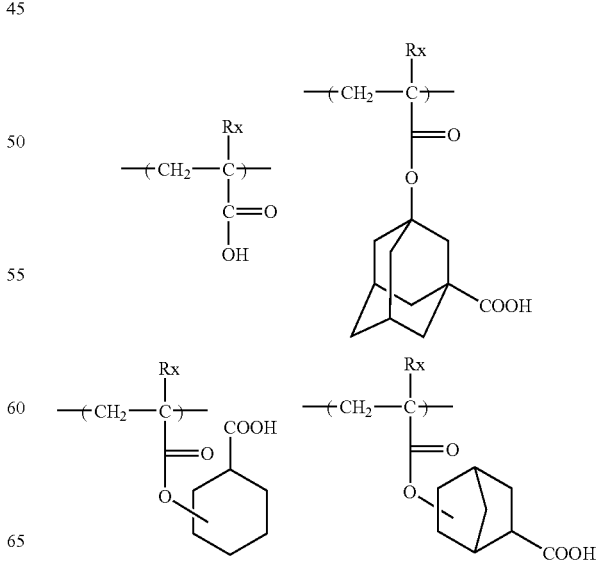

-continued
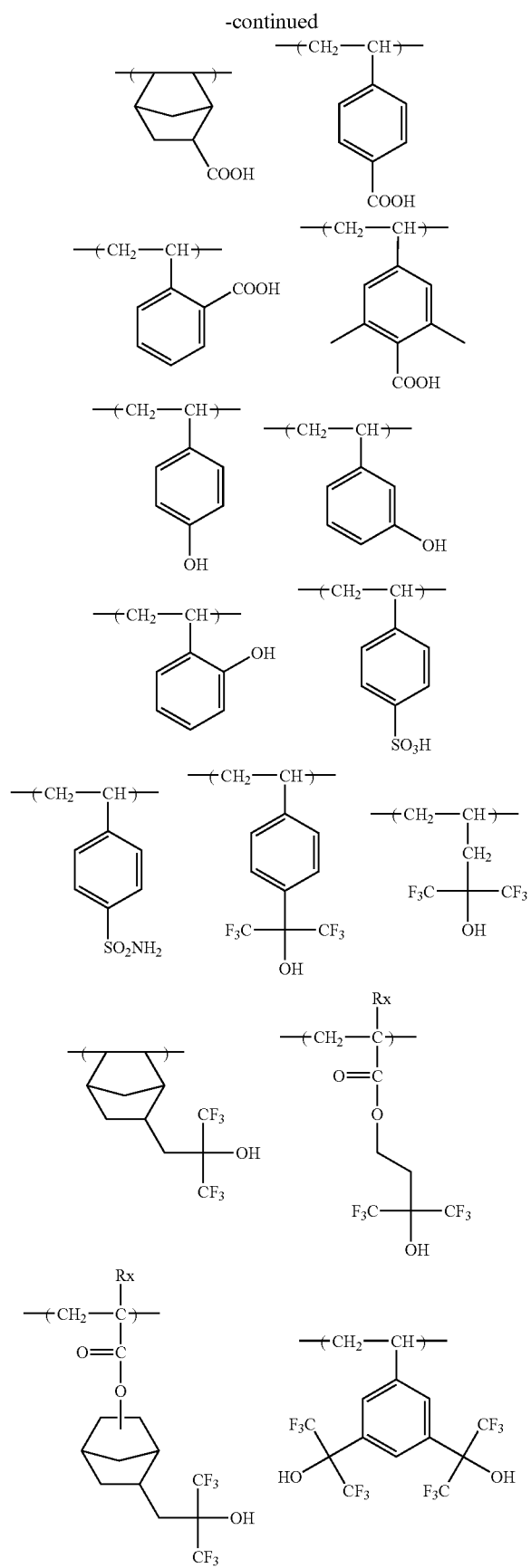
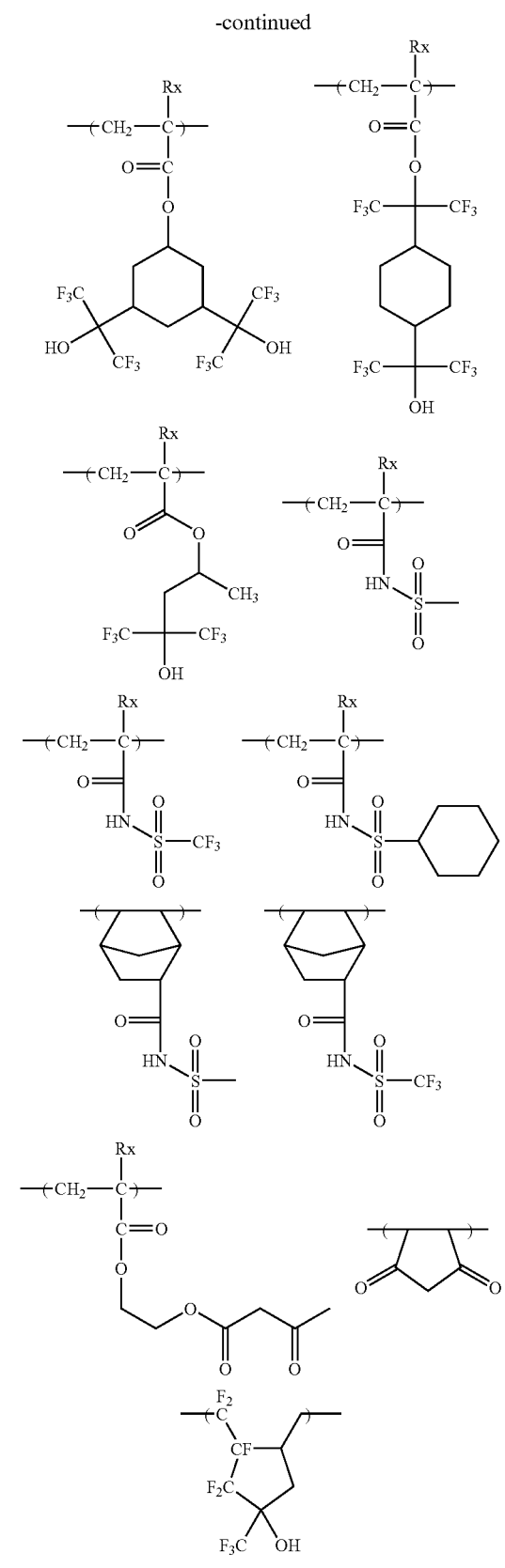
Examples of the group (y) which decomposes by action of an alkaline developer to increase its solubility in the alkaline developer include a group having a lactone structure, an acid anhydride and an acid imide group. Above all, a lactone group is preferable.

As the repeating unit having the group (y) which decomposes by action of an alkaline developer to increase its solubility in the alkaline developer, all of a repeating unit in which an alkali-soluble group is bound to the principal chain of a resin via a connecting group, such as a repeating unit by an acrylic ester or a methacrylic ester; and a repeating unit in which a polymerization initiator or chain transfer agent having the group (y) which decomposes by action of an alkaline developer to increase its solubility in the alkaline developer is used at the time of polymerization and introduced into a terminal end of a polymer chain are preferable.

The content of the group (y) which decomposes by action of an alkaline developer to increase its solubility in the alkaline developer is preferably from 1 to 40% by mole, more preferably from 3 to 30% by mole, and further preferably from 5 to 15% by mole relative to the whole of the repeating units in the polymer.

Specific examples of the group (y) which decomposes by action of an alkaline developer to increase its solubility in the alkaline developer include the same repeating unit having a lactone structure as exemplified in the resin as the component (A) and that having the structure represented by the general formula (VIII).

Examples of the group (z) which decomposes by action of an acid include the same acid-decomposable group as exemplified in the resin (A). In the case where the fluorine-containing compound (HP) is a resin, examples of the repeating unit containing the group (z) which decomposes by action of an acid include the same repeating unit having an acid-decomposable group as exemplified in the resin (A). In the case where the fluorine-containing compound (HP) is a resin, the content of the repeating unit having the group (z) which decomposes by action of an acid is preferably from 1 to 80% by mole, more preferably from 10 to 80% by mole, and further preferably from 20 to 60% by mole relative to the whole of the repeating units in the polymer.

The resin (HP) may further have a repeating unit represented by the following general formula (III).

(III)

In the general formula (III), $R_4$ represents a group having an alkyl group, a cycloalkyl group, an alkenyl group or a cycloalkenyl group, and $L_6$ represents a single bond or a divalent connecting group.

In the general formula (III), the alkyl group represented by $R_4$ is preferably a linear or branched alkyl group having from 3 to 20 carbon atoms.

The cycloalkyl group is preferably a cycloalkyl group having from 3 to 20 carbon atoms.

The alkenyl group is preferably an alkenyl group having from 3 to 20 carbon atoms.

The cycloalkenyl group is preferably a cycloalkenyl group having from 3 to 20 carbon atoms.

The divalent connecting group represented by $L_6$ is preferably an alkylene group (preferably one having from 1 to 5 carbon atoms) or an oxy group.

In the case where the resin (HP) has a fluorine atom, the content of the fluorine atom is preferably from 5 to 80% by mass, and more preferably from 10 to 80% by mass relative to the molecular weight of the resin (HP). Also, the content of the fluorine atom-containing repeating unit is preferably from 10 to 100% by mass, and more preferably from 30 to 100% by mass in the resin (HP).

A weight average molecular weight, as reduced into standard polystyrene, of the resin (HP) is preferably 1,000 to 100,000, more preferably from 1,000 to 50,000, and further preferably from 2,000 to 15,000.

It is a matter of course that the resin (HP) is low in impurities such as metals. The content of residual monomers or oligomer components is preferably from 0 to 10% by mass, more preferably from 0 to 5% by mass, and further preferably from 0 to 1% by mass. According to this, a resist which is free from foreign substances in the liquid and the change in sensitivity or the like with time is obtained. Also, in view of the resolution, resist shape, side wall of resist pattern, roughness and so on, the molecular weight distribution (Mw/Mn, which is also called "degree of dispersion") is preferably in the range of from 1 to 5, and more preferably from 1 to 3.

As the resin (HP), various commercially available products can be utilized, and the hydrophobic resin (HR) can be synthesized according to the usual way (for example, radical polymerization). Examples of the general synthesis method include a batchwise polymerization method in which a monomer species and an initiator are dissolved in a solvent and the solution is polymerized upon heating; and a dropwise polymerization method in which a solution of a monomer species and an initiator is added dropwise in a heated solvent over from 1 to 10 hours, with a dropwise polymerization method being preferable. Examples of the reaction solvent include ethers (for example, tetrahydrofuran, 1,4-dioxane and diisopropyl ether), ketones (for example, methyl ethyl ketone and methyl isobutyl ketone), ester solvents (for example, ethyl acetate), amide solvents (for example, dimethylformamide and dimethylacetamide) and solvents capable of dissolving the composition of the invention therein as described later (for example, propylene glycol monomethyl ether acetate, propylene glycol monomethyl ether and cyclohexanone). It is more preferable that the polymerization is carried out by using the same solvent as the solvent used in the resist composition of the invention. According to this, it is possible to inhibit the generation of a particle at the preservation.

It is preferable that the polymerization reaction is carried out in an inert gas atmosphere such as nitrogen and argon. The polymerization is initiated by using a commercially available radical initiator (for example, an azo based initiator and a peroxide) as the polymerization initiator. An azo based initiator is preferable as the radical initiator, and an azo based initiator having an ester group, a cyano group or a carboxyl group is preferable. Preferred examples of the initiator include azobisisobutyronitrile, azobisdimethylvaleronitirle and dimethyl 2,2'-azobis(2-methylpropionate). The reaction concentration is from 5 to 50% by mass, and preferably from 30 to 50% by mass. The reaction temperature is usually from 10° C. to 150° C., preferably from 30° C. to 120° C., and more preferably from 60° C. to 100° C.

After completion of the reaction, the reaction mixture is allowed to stand for cooling to room temperature and purified. For the purification, a usual method such as a liquid-liquid extraction method for removing residual monomers and oligomer components by washing with water or combining appropriate solvents; a purification method for achieving purification in a solution state by ultrafiltration for extracting and removing only a substance having a molecular weight of not more than a specified value or other means; a reprecipitation method for removing residual monomers and so on by adding dropwise a resin solution in a poor solvent to solidify the resin in the poor solvent; and a purification method for achieving purification in a solid state by washing a filtered resin slurry with a poor solvent or other means can be applied. For example, by contacting a solvent (poor solvent) in which the foregoing resin is sparingly soluble or insoluble in a volume amount of not more than 10 times, and preferably from 10 to 5 times of the reaction solution, the resin is deposited as a solid.

As the solvent (precipitation or reprecipitation solvent) to be used in the precipitation or reprecipitation operation from the polymer solution, any poor solvent against the polymer is useful and can be properly chosen and used among hydrocarbons, halogenated hydrocarbons, nitro compounds, ethers, ketones, esters, carbonates, alcohols, carboxylic acids, water and mixed solvents containing these solvents and so on depending upon the kind of the polymer. Of these, a solvent containing at least an alcohol (especially, methanol or the like) or water is preferable as the precipitation or reprecipitation solvent.

The amount of the precipitation or reprecipitation solvent to be used can be properly chosen while taking into consideration the efficiency or yield or the like and is generally from 100 to 10,000 parts by mass, preferably from 200 to 2,000 parts by mass, and more preferably from 300 to 1,000 parts by mass based on 100 parts by mass of the polymer solution.

The temperature in the precipitation or reprecipitation can be properly chosen while taking into consideration the efficiency or operability and is usually from about 0 to 50° C., and preferably around room temperature (for example, from about 20 to 35° C.). The precipitation or reprecipitation operation can be achieved by using a customary mixing vessel such as a stirring tank in a known method such as a batchwise mode and a continuous mode.

The precipitated or reprecipitated polymer is usually subjected to customary solid-liquid separation such as filtration and centrifugation, dried and then provided for use. The filtration is carried out preferably under a pressure by using a solvent-resistant filter medium. The drying is carried out at a temperature of from about 30 to 100° C., and preferably from about 30 to 50° C. at atmospheric pressure or under a reduced pressure (preferably under a reduced pressure).

After once depositing the resin and separating it, the resin may be again dissolved in the solvent and then brought into contact with a solvent in which the resin is sparingly soluble or insoluble. That is, a method including a step of, after completion of the foregoing radical polymerization reaction, bringing the reaction mixture into contact with a solvent in which the polymer is sparingly soluble or insoluble to deposit the resin (step a); a step of separating the resin from the solution (step b); a step of again dissolving the resin in the solvent to prepare a resin solution A (step c); a step of thereafter, bringing the resin solution A into contact with a solvent in which the resin is sparingly soluble or insoluble in a volume amount of less than 10 times of the resin solution A (preferably in a volume amount of not more than 5 times of the resin solution A) to deposit a resin solid (step d); and a step of separating the deposited resin (step e) may be employed.

Specific examples of the hydrophobic resin (HR) are given below. Also, molar ratios of repeating units (corresponding to the respective repeating units in the order from the left side), weight average molecular weights and degrees of dispersion in the respective resins are shown in the following Table 1.

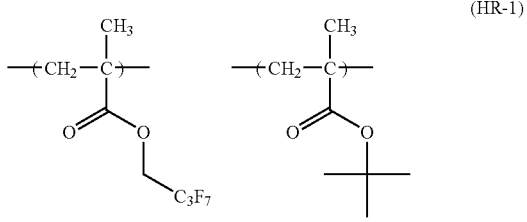
(HR-1)

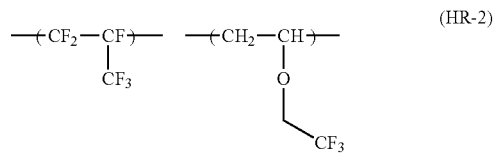
(HR-2)

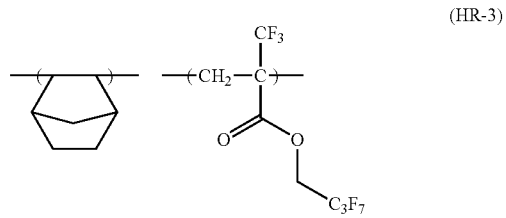
(HR-3)

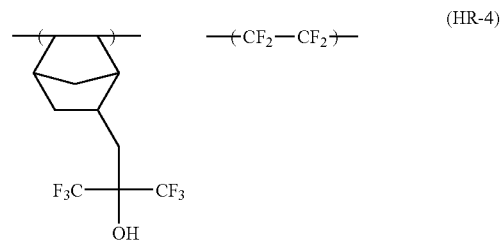
(HR-4)

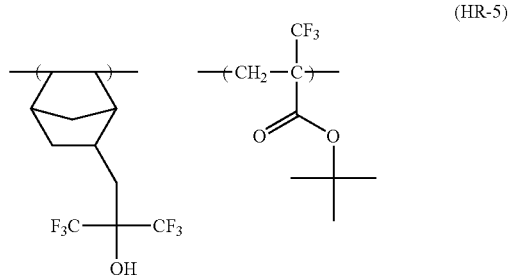
(HR-5)

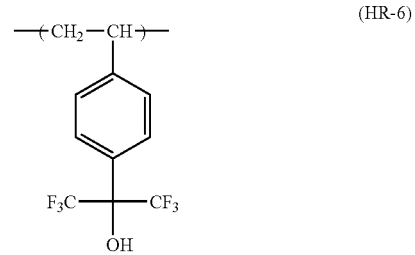
(HR-6)

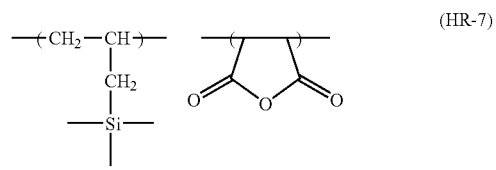
(HR-7)

-continued
(HR-8)
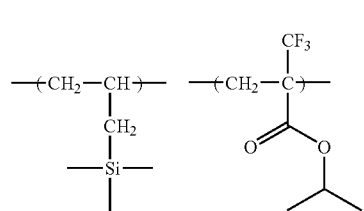
(HR-9)
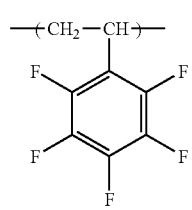
(HR-10)
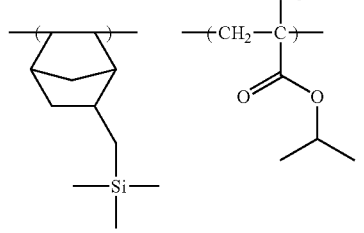
(HR-11)
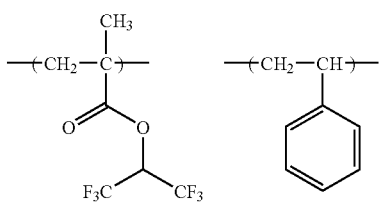
(HR-12)
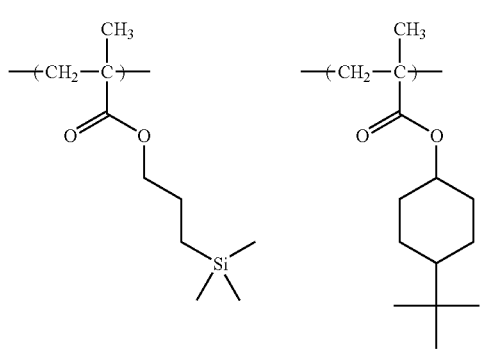
(HR-13)
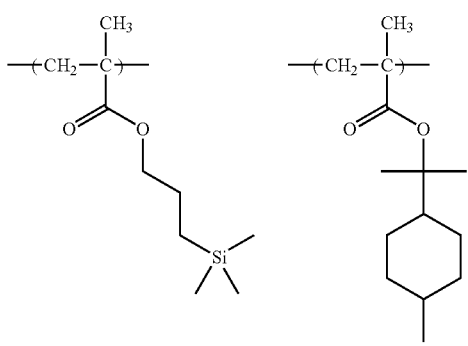
-continued
(HR-14)
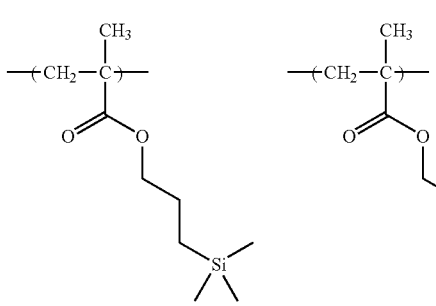
(HR-15)
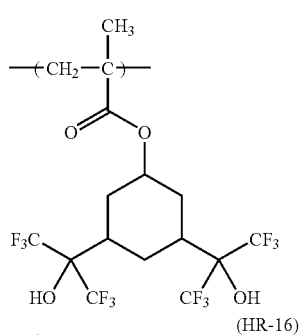
(HR-16)
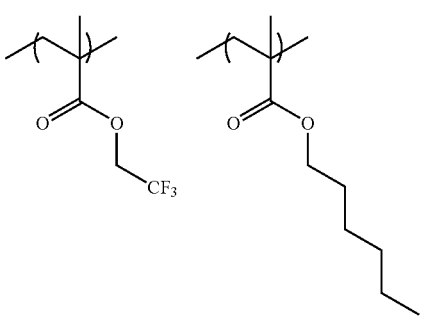
(HR-17)
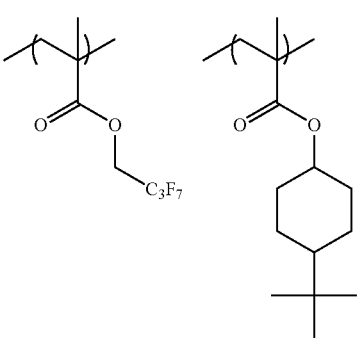
(HR-18)
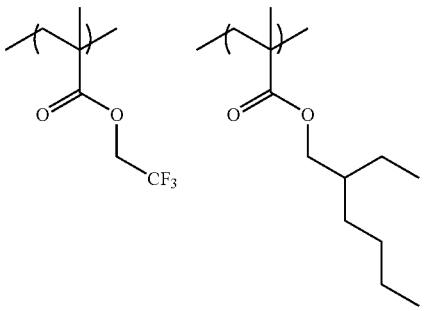

-continued
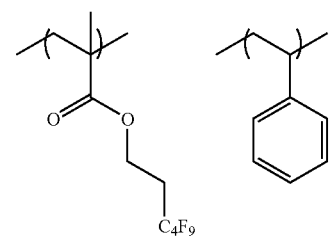 (HR-19)
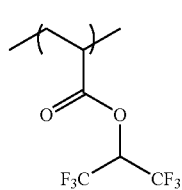 (HR-20)
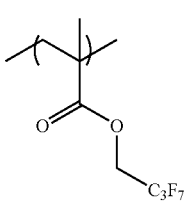 (HR-21)
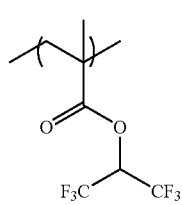 (HR-22)
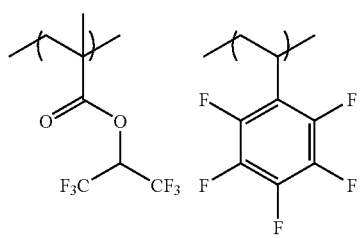 (HR-23)
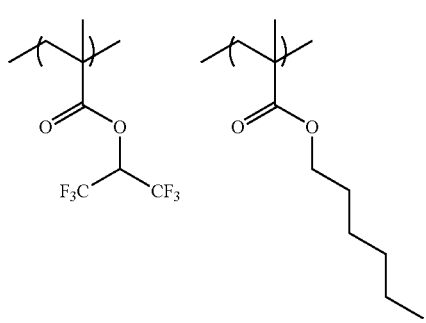 (HR-24)
-continued
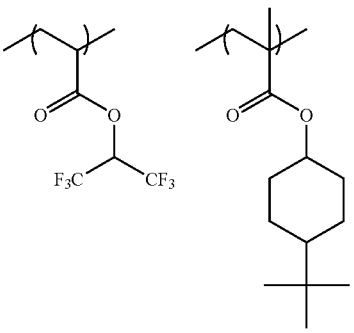 (HR-25)
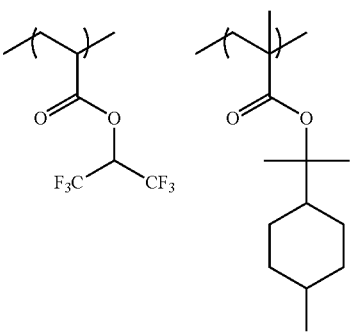 (HR-26)
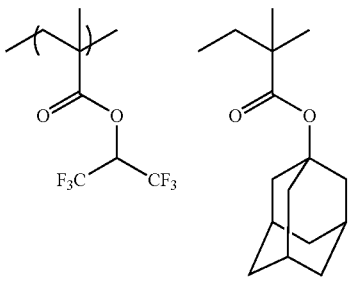 (HR-27)
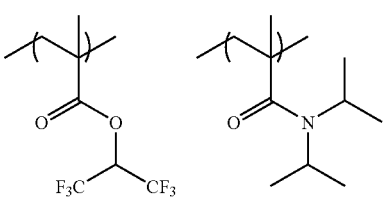 (HR-28)
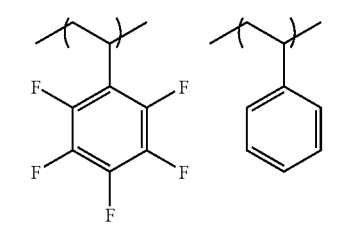 (HR-29)
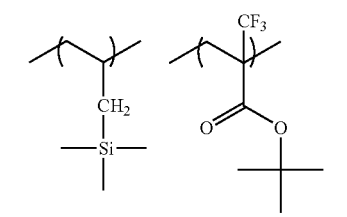 (HR-30)

-continued
(HR-31)
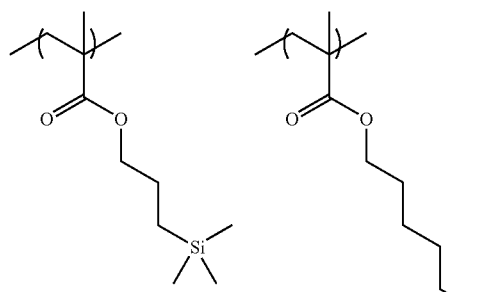
(HR-32)
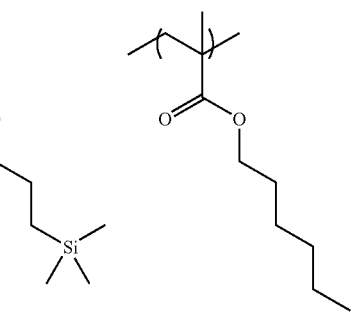
(HR-33)
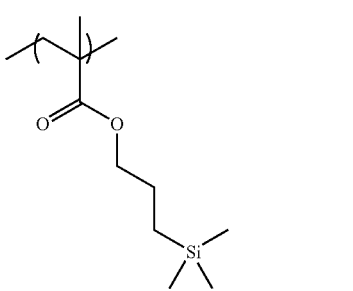
(HR-34)
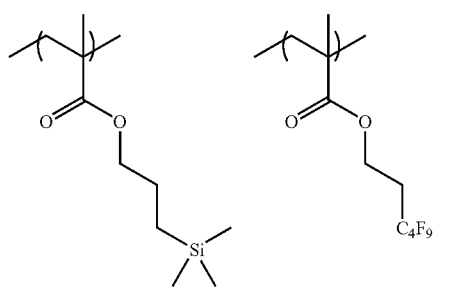
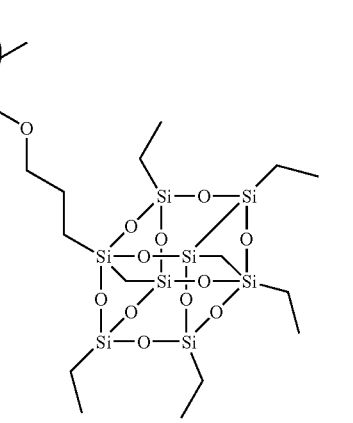
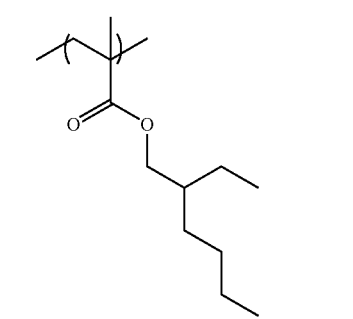
-continued
(HR-35)
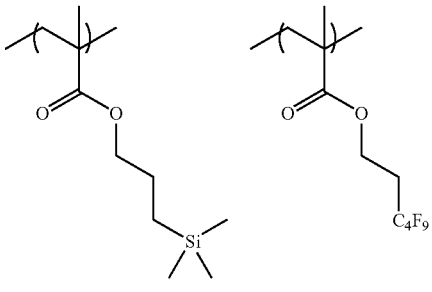
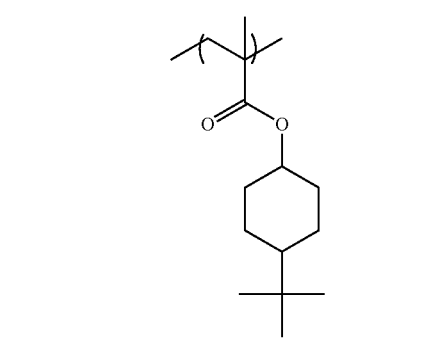
(HR-36)
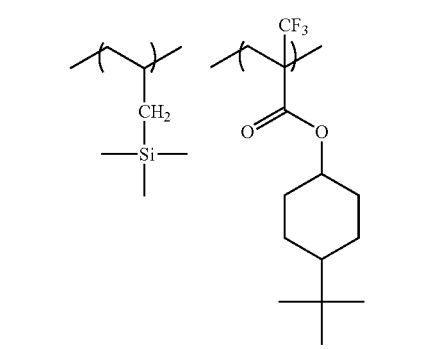
(HR-37)
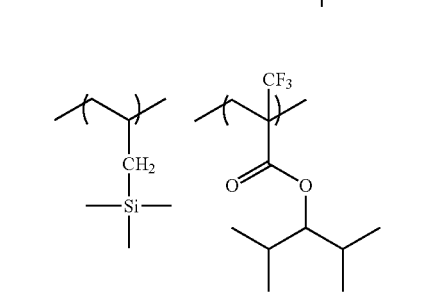
(HR-38)
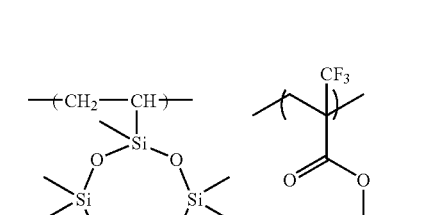

-continued
(HR-39) 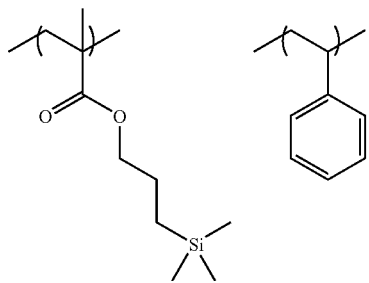
(HR-40) 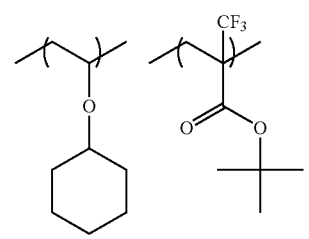
(HR-41) 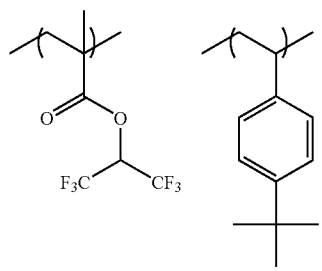
(HR-42) 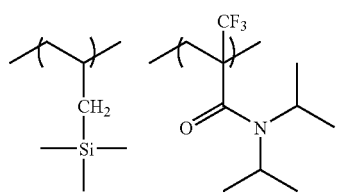
(HR-43) 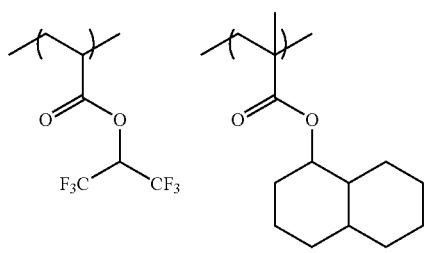
-continued
(HR-44) 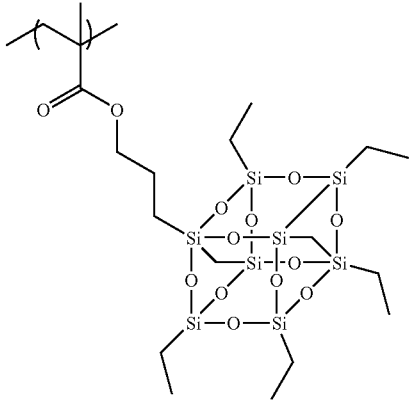
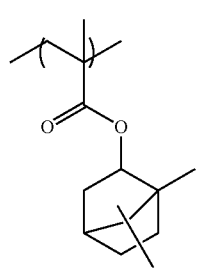
(HR-45) 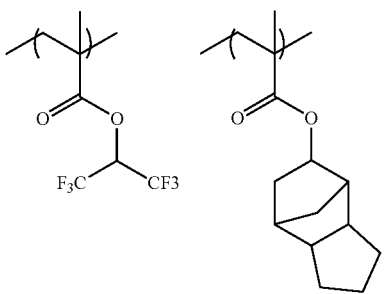
(HR-46) 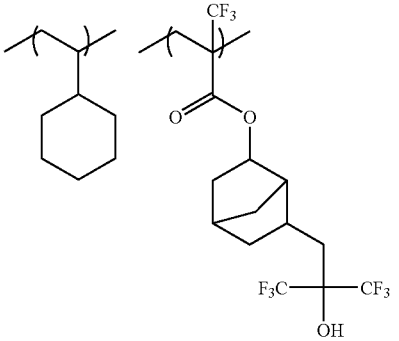
(HR-47) 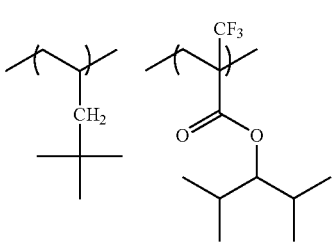

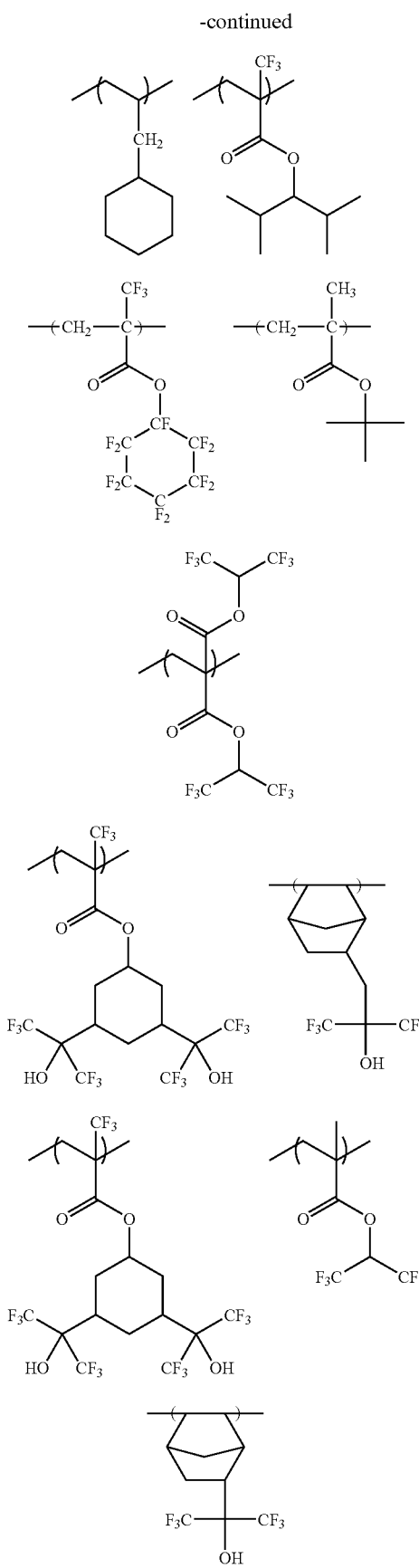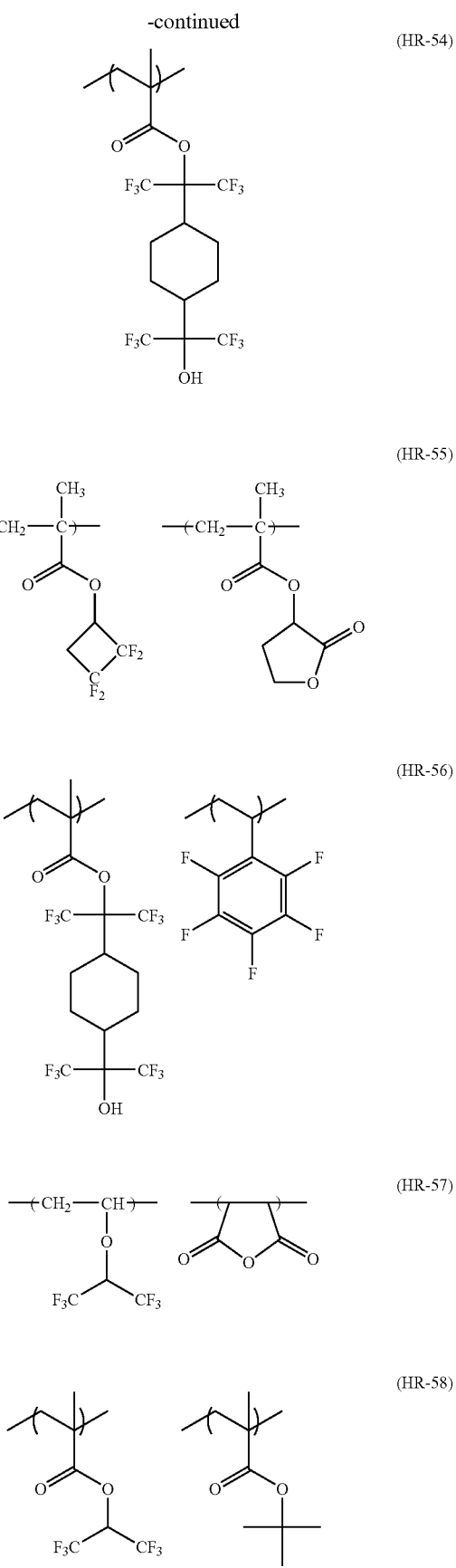

-continued
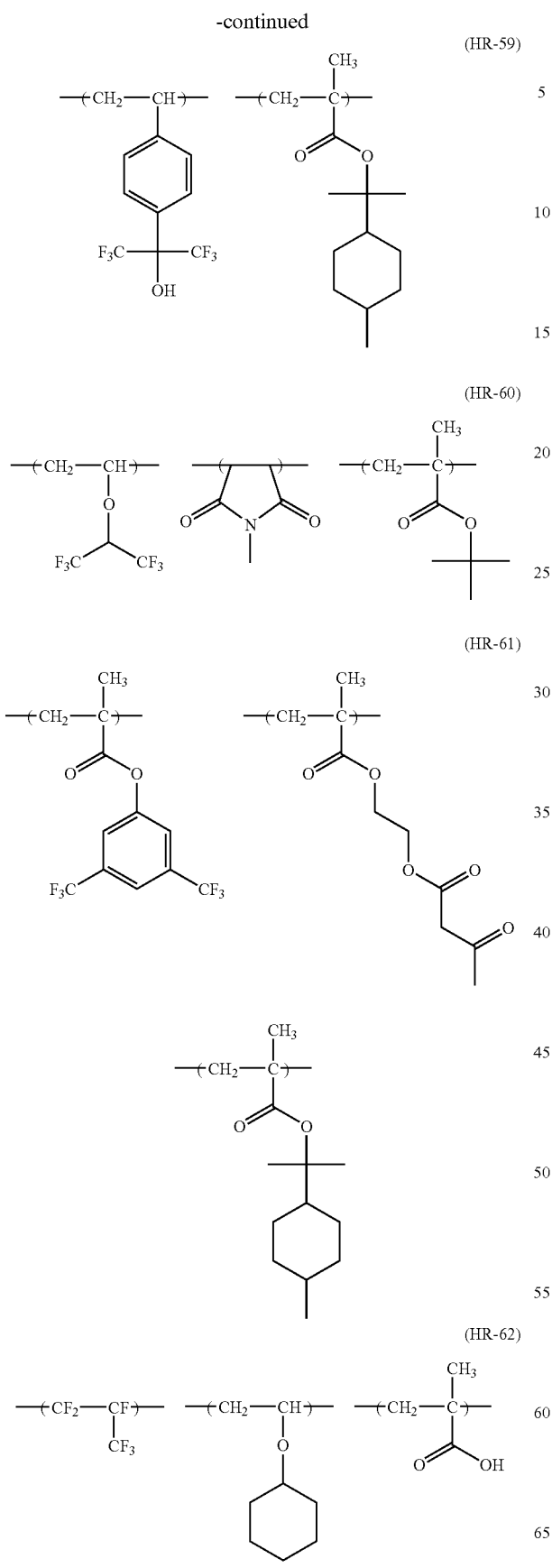
(HR-59)
(HR-60)
(HR-61)
(HR-62)
-continued
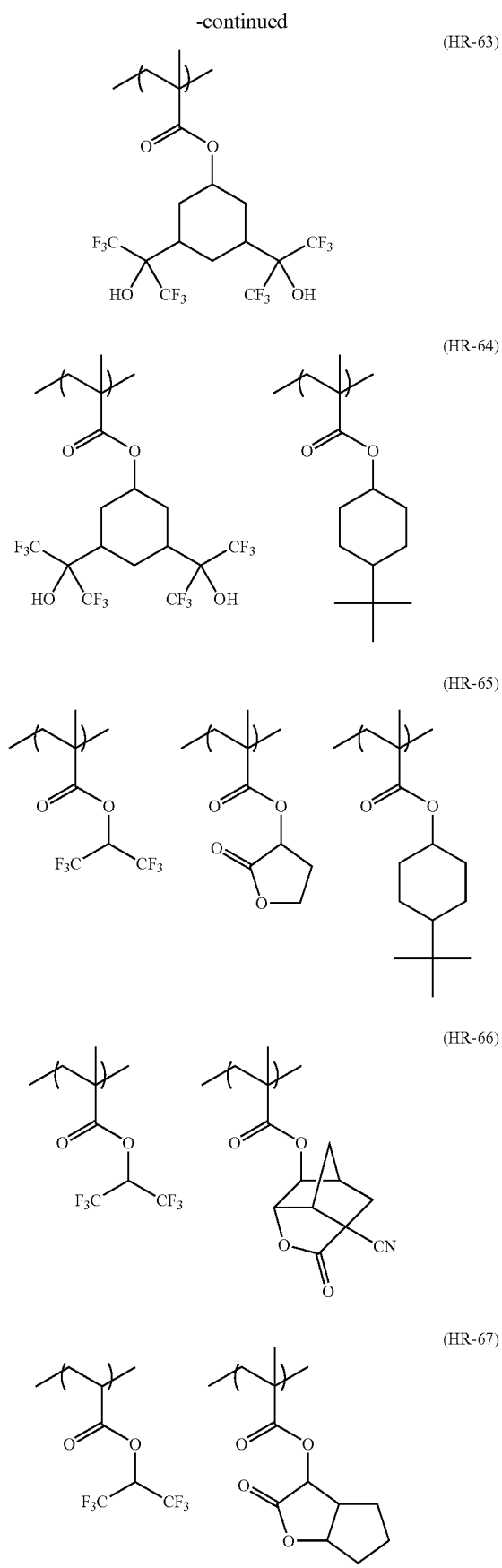
(HR-63)
(HR-64)
(HR-65)
(HR-66)
(HR-67)

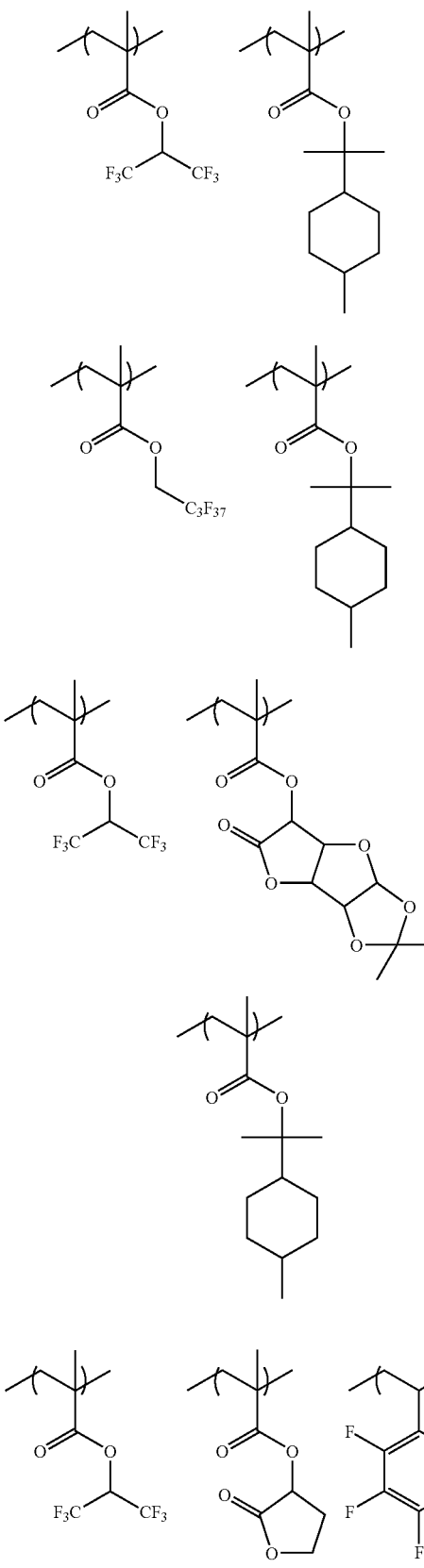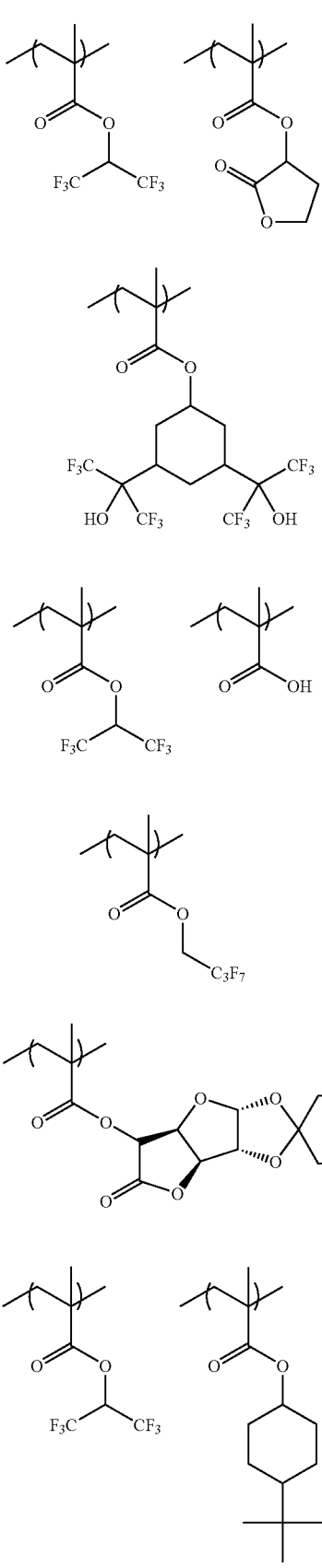

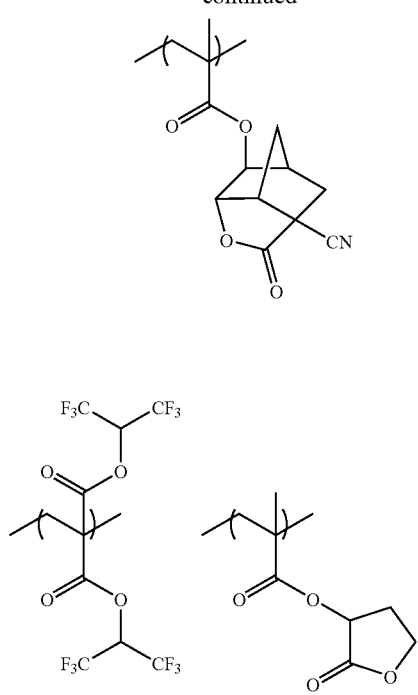
(HR-76)
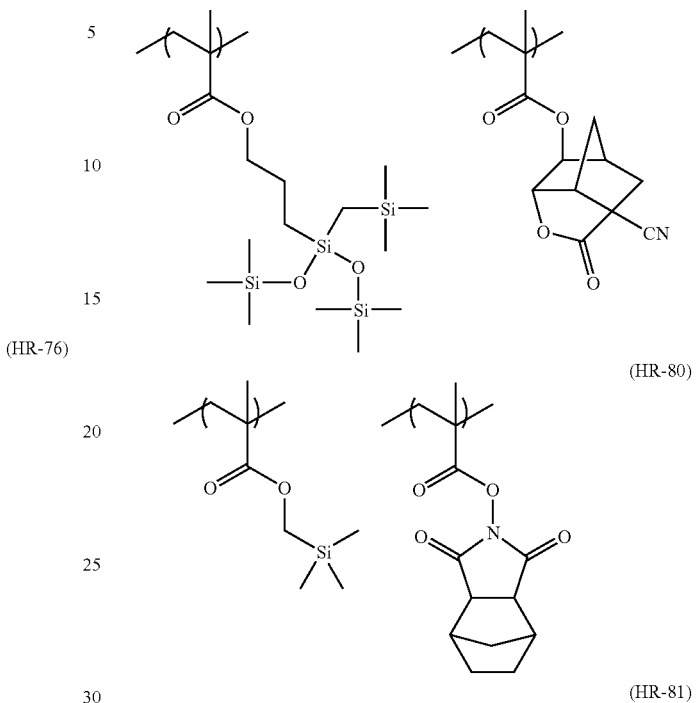
(HR-79)
(HR-80)
(HR-81)
(HR-77)
(HR-78)
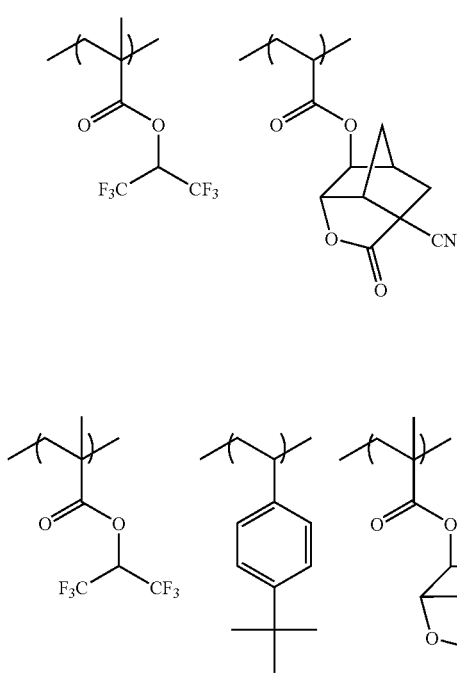
(HR-82)
(HR-83)
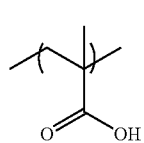
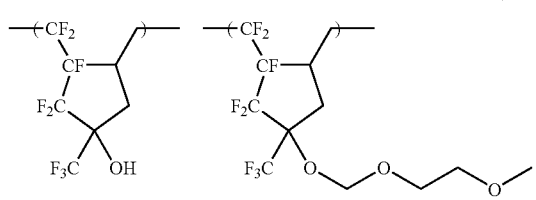
(HR-84)

TABLE 1

| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

The positive working photosensitive composition of the invention is used by dissolving the foregoing components in a prescribed organic solvent, and preferably the foregoing mixed solvent, subjecting the solution to filter filtration and then coating on a prescribed support in the following manner. A filter which is used for the filter filtration is preferably a filter made of polytetrafluoroethylene, polyethylene or nylon and having an opening of not more than 0.1 micron, more preferably not more than 0.05 microns, and further preferably not more than 0.03 microns.

For example, the positive working photosensitive composition is coated on a substrate to be used for the manufacture of large scale integrated circuits (for example, a silicon/silicon dioxide coating film) in an arbitrary thickness (usually from 50 to 500 nm) in an appropriate coating method using a spinner, a coater or the like. After coating, drying by spinning or drying is carried out to form a resist film. The baking temperature can be properly set up and is usually from 60 to 150° C., and preferably from 90 to 130° C.

Subsequently, the resist film is exposed through a mask or the like for the pattern formation.

The exposure amount can be properly set up and is usually from 1 to 100 mJ/cm$^2$. After the exposure, the exposed resist film is subjected to spinning or/and baking and then developed and rinsed to obtain a pattern.

Exposure (liquid immersion exposure) may be carried out by filling a liquid (liquid immersion medium) having a higher refractive index than air between a photosensitive film and a lens at the irradiation with actinic rays or radiation. According to this, the resolution can be enhanced. Any liquid having a higher refractive index than air can be used as the liquid immersion medium to be used, and pure water is preferable. Also, in order that in performing the liquid immersion exposure, the liquid immersion medium may not come into direct contact with the photosensitive film, an overcoat layer may be further provided on the photosensitive film. According to this, the elution of the composition from the photosensitive film into the liquid immersion medium can be inhibited, thereby reducing a development defect.

Examples of the actinic rays or radiation include infrared light, visible light, ultraviolet light, far ultraviolet light, X-rays and an electron beam. Of these, far ultraviolet light having a wavelength of not more than 250 nm is preferable; and far ultraviolet light having a wavelength of not more than 220 nm is more preferable. Specific examples thereof include a KrF excimer laser (248 nm), an ArF excimer laser (193 nm), an F$_2$ excimer laser (157 nm), X-rays and an electron beam. Of these, an ArF excimer laser, an F$_2$ excimer laser, EUV (13 nm) and an electron beam are preferable.

Prior to the formation of a resist film, an antireflection film may be provided in advance on the substrate.

As the antireflection film, all of an inorganic film type made of titanium, titanium dioxide, titanium nitride, chromium oxide, carbon, amorphous silicon or the like and an organic film type made of a light absorber and a polymer material can be used. Also, commercially available organic antireflection films, for example, DUV-30 Series and DUV-40 Series (all of which are manufactured by Brewers Science, Ltd.) and AR-2, AR-3 and AR-5 (all of which are manufactured by Shipley Co.) can be used.

In a development step, the alkaline developer is used in the following manner. Examples of the alkaline developer of the resist composition which can be used include alkaline aqueous solutions of an inorganic alkali (for example, sodium hydroxide, potassium hydroxide, sodium carbonate, sodium silicate, sodium metasilicate and ammonia water), a primary amine (for example, ethylamine and n-propylamine), a secondary amine (for example, diethylamine and di-n-butylamine), a tertiary amine (for example, triethylamine and methyldiethylamine), an alcoholamine (for example, dimethylethanolamine and triethanolamine), a quaternary ammonium salt (for example, tetramethylammonium hydroxide and tetraethylammonium hydroxide) or a cyclic amine (for example, pyrrole and piperidine).

Furthermore, suitable amounts of an alcohol and a surfactant can be added and used in the foregoing alkaline developer.

An alkali concentration of the alkaline developer is usually from 0.1 to 20% by mass.

A pH of the alkaline developer is usually from 10.0 to 15.0.

The positive working resist composition of the invention may be applied to a multilayered resist process (in particular, a three-layered resist process). The multilayered resist method includes the following process.

(a) A lower resist layer composed of an organic material is formed on a substrate to be processed.

(b) An interlayer and an upper resist layer composed of an organic material which crosslinks or decomposes upon irradiation with radiation are successively stacked on the lower resist layer.

(c) After forming a prescribed pattern on the upper resist layer, the interlayer, the lower layer and the substrate are successively etched.

An organopolysiloxane (silicone resin) or an $SiO_2$ coating solution (SOG) is generally used as the interlayer. Though an appropriated organic high-molecular weight film is used as the lower resist layer, various known photoresists may be used. Examples thereof include respective series such as FH Series and FHi Series (all of which are manufactured by Fujifilm Arch Co., Ltd.) or PFI Series (manufactured by Sumitomo Chemical Co., Ltd.).

A film thickness of the lower resist layer is preferably from 0.1 to 4.0 μm, more preferably from 0.2 to 2.0 μm, and especially preferably from 0.25 to 1.5 μm. What the film thickness of the lower resist layer is 0.1 μm or more is preferable from the viewpoints of antireflection and anti-dry etching properties, and what it is not more than 4.0 μm is preferable from the viewpoints of the aspect ratio and pattern collapse of a formed fine pattern.

EXAMPLES

The invention is hereunder described with reference to the following Examples, but it should not be construed that the invention is limited thereto.

Monomers corresponding to repeating units and chain transfer agents as used in the synthesis of the resin (A) in the present Examples are hereunder described. LM-1 to LM-8, IM-1 to IM-6, AM-1 and PM-1 to PM-13 in the description and table indicate the following monomers, respectively.

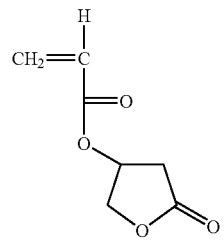

LM-1

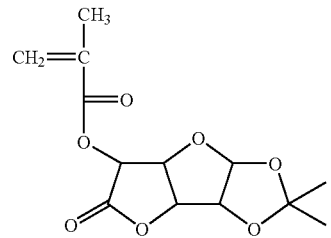

LM-2

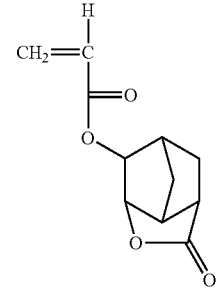

LM-3

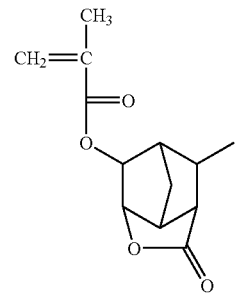

LM-4

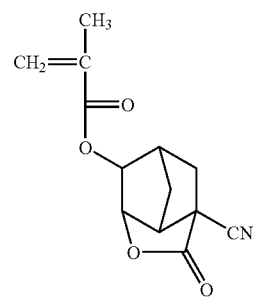

LM-5

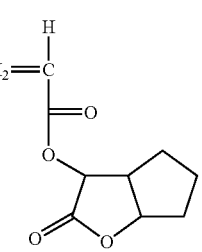

LM-6

-continued
LM-7
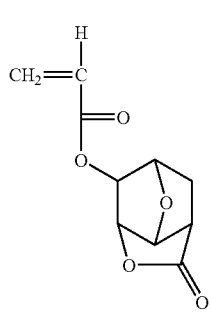
LM-8
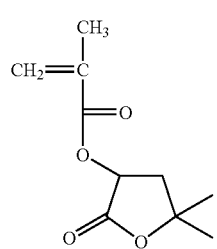
IM-1
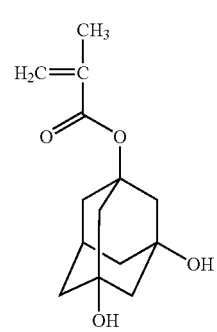
IM-2
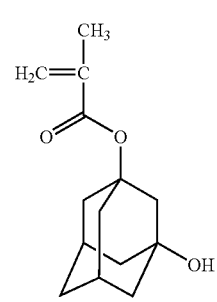
IM-3
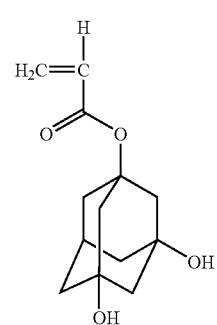
-continued
IM-4
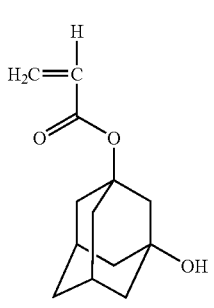
IM-5
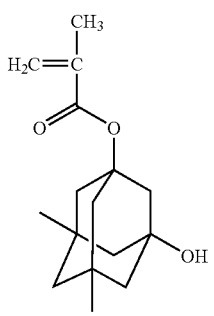
IM-6
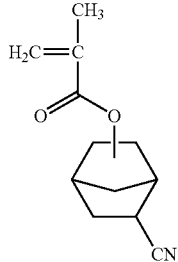
AM-1
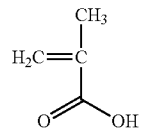
PM-1
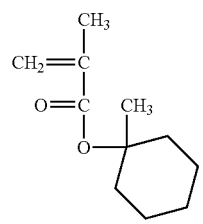
PM-2
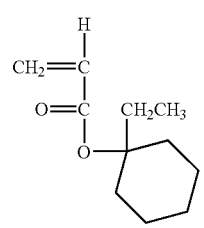

-continued
PM-3
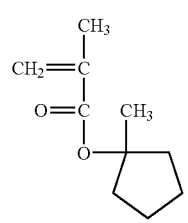
PM-4
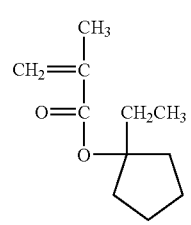
PM-5
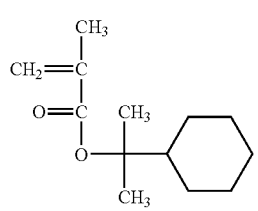
PM-6
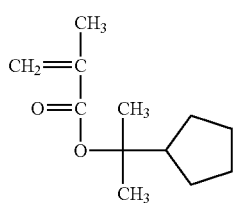
PM-7
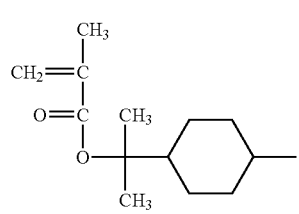
PM-8
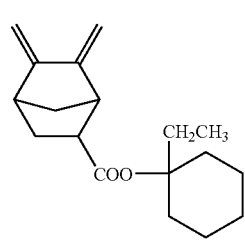
-continued
PM-9
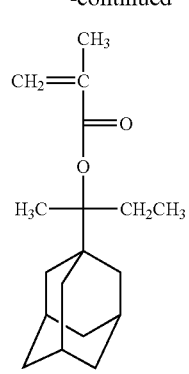
PM-10
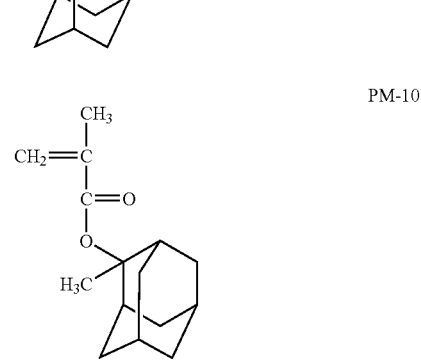
PM-11
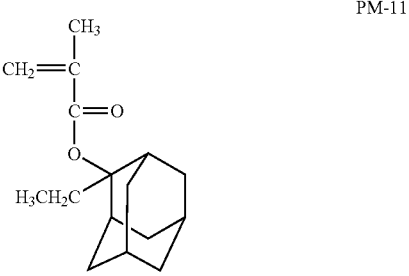
PM-12
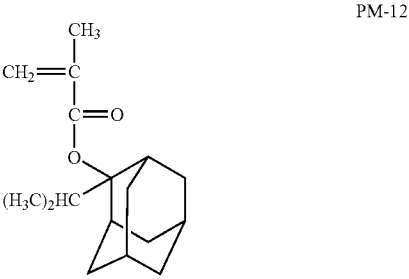
PM-13
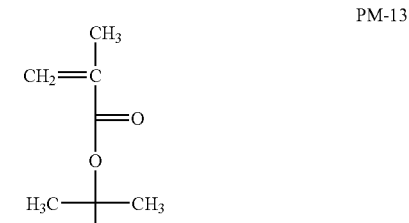
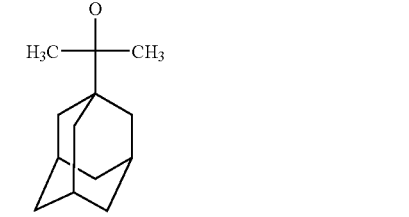

-continued

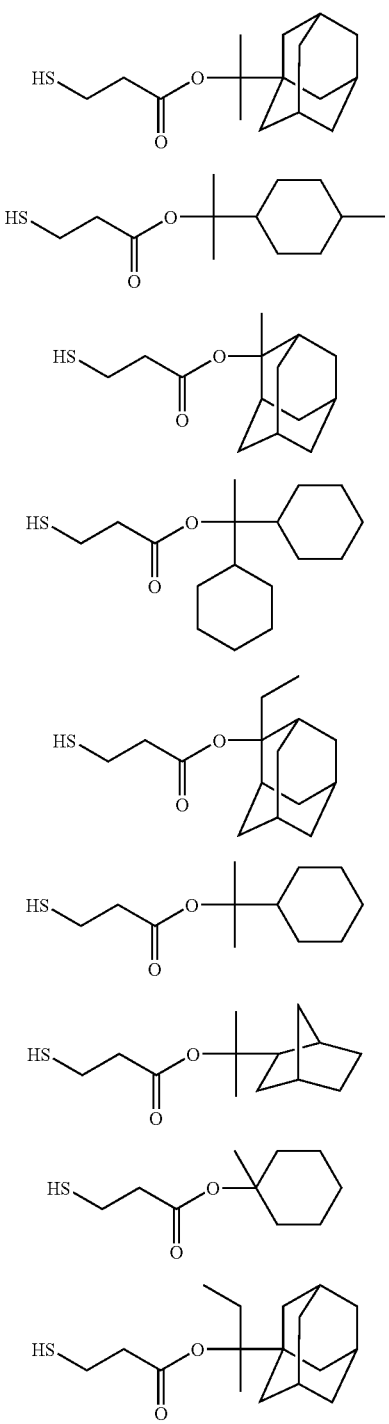

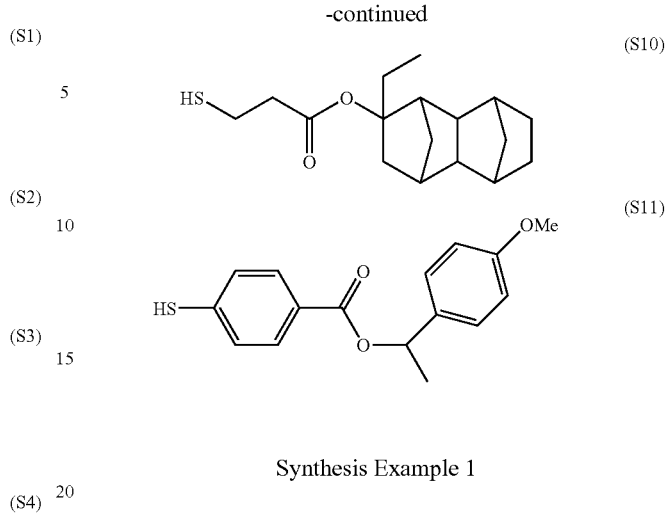

Synthesis Example 1

Synthesis of Resin (A-1) Which Decomposes by Action of an Acid to Increase its Solubility in an Alkaline Developer

LM-1, IM-1, PM-1 and PM-9 were charged in a proportion of 40/20/30/10 under a nitrogen gas stream, and the mixture was dissolved in cyclohexanone to prepare 450 g of a solution having a solids concentration of 22%. A solution of 10% by mole of a polymerization initiator (azobisisobutyronitrile (AIBN), manufactured by Wako Pure Chemical Industries, Ltd.) and 1% by mole of (SI) dissolved in 43.0 g of cyclohexanone was added dropwise over 6 hours. After completion of the dropwise addition, the mixture was allowed to react at 80° C. for an additional 2 hours. After allowing the reaction solution to stand for cooling, the resulting reaction mixture was added dropwise in 500 mL of methanol over 20 minutes, and a deposited powder was collected by filtration and then dried to obtain Resin (A-1). The obtained Resin (A-1) had a weight average molecular weight as reduced into standard polystyrene of 7,300 and a degree of dispersion (Mw/Mn) of 1.4. A polymer composition ratio as determined from NMR was 39/20/29/11. Also, it was confirmed from 1H-NMR and 13C-NMR that an end terminal site corresponding to (SI) was introduced.

Resins (A-2) to (A-17) and (Ref-1) were synthesized in the same operations as in the foregoing Synthesis Example. A structure, a composition ratio, an end terminal structure, a molecular weight and a degree of dispersion of each of the thus synthesized resins are shown below. A composition ratio of the repeating units is the order from the left side of the structural formula. Though (Ref-1) has the same structure as in (A-1), it does not contain the specified end terminal site of the invention.

TABLE 2

| Synthesis Example | LM | IM | PM1 | PM2 | AM | End terminal structure | Composition ratio | Molecular weight | Degree of dispersion |
|---|---|---|---|---|---|---|---|---|---|
| A-1 | LM-1 | IM-1 | PM-1 | PM-9 | — | S1 | 39/20/29/11 | 7300 | 1.4 |
| A-2 | LM-2 | IM-2 | PM-2 | PM-10 | — | S4 | 48/12/19/21 | 8500 | 1.3 |
| A-3 | LM-3 | IM-3 | PM-4 | PM-11 | — | S6 | 45/15/20/20 | 6900 | 1.5 |
| A-4 | LM-4 | IM-2 | PM-5 | PM-12 | AM-1 | S3 | 40/12/22/19/7 | 7800 | 1.4 |

TABLE 2-continued

| Synthesis Example | LM | IM | PM1 | PM2 | AM | End terminal structure | Composition ratio | Molecular weight | Degree of dispersion |
|---|---|---|---|---|---|---|---|---|---|
| A-5 | LM-5 | IM-1 | PM-7 | PM-13 | — | S8 | 48/11/31/10 | 8200 | 1.4 |
| A-6 | LM-6 | IM-4 | PM-1 | PM-3 | — | S2 | 38/22/31/9 | 7300 | 1.3 |
| A-7 | LM-7 | IM-1 | PM-4 | PM-6 | — | S7 | 32/12/30/26 | 8000 | 1.5 |
| A-8 | LM-8 | IM-5 | PM-6 | PM-9 | — | S5 | 43/16/11/30 | 7400 | 1.4 |
| A-9 | LM-2 | IM-2 | PM-2 | PM-8 | — | S9 | 29/10/26/35 | 8600 | 1.2 |
| A-10 | LM-3 | IM-3 | PM-3 | PM-10 | — | S10 | 46/13/21/20 | 9000 | 1.5 |
| A-11 | LM-5 | IM-6 | PM-5 | PM-11 | AM-1 | S11 | 38/21/15/16/10 | 6800 | 1.3 |
| A-12 | LM-8 | IM-1 | PM-6 | PM-12 | — | S1 | 52/12/18/18 | 7200 | 1.4 |
| A-13 | LM-1 | IM-1 | PM-8 | PM-13 | — | S4 | 41/13/26/20 | 7000 | 1.3 |
| A-14 | LM-4 | IM-1 | PM-4 | PM-6 | — | S7 | 40/21/9/30 | 8400 | 1.5 |
| A-15 | LM-6 | IM-1 | PM-7 | PM-10 | — | S2 | 46/14/29/11 | 7500 | 1.5 |
| A-16 | LM-7 | IM-1 | PM-6 | PM-13 | — | S9 | 38/18/24/20 | 8200 | 1.4 |
| A-17 | LM-5 | IM-1 | PM-7 | PM-10 | — | S6 | 41/19/22/18 | 8600 | 1.3 |
| Ref-1 | LM-1 | IM-1 | PM-1 | PM-9 | — | — | 39/21/29/11 | 8300 | 1.4 |

*: Ref-1 has the same structure as A-1, except for the end terminal.

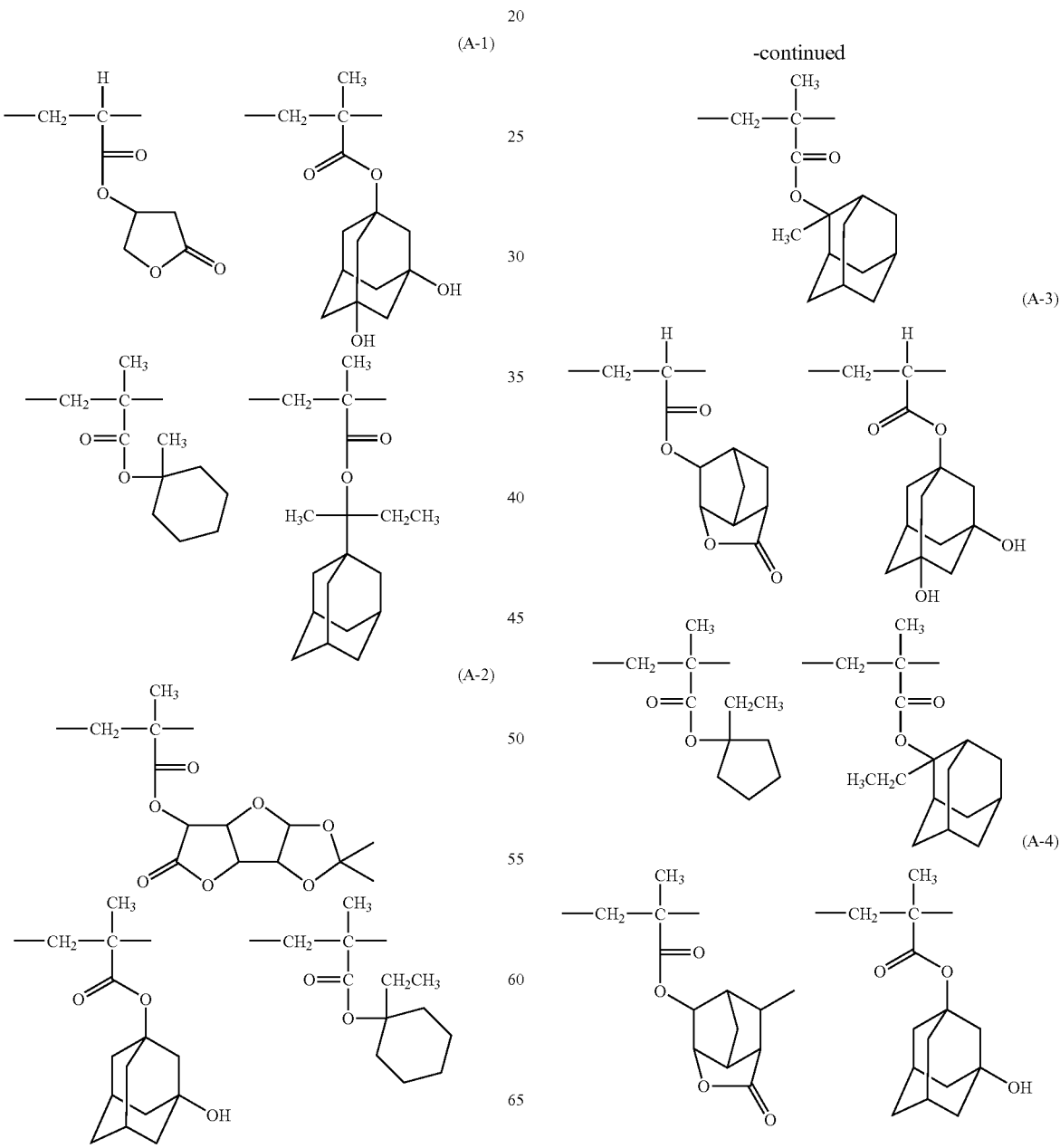

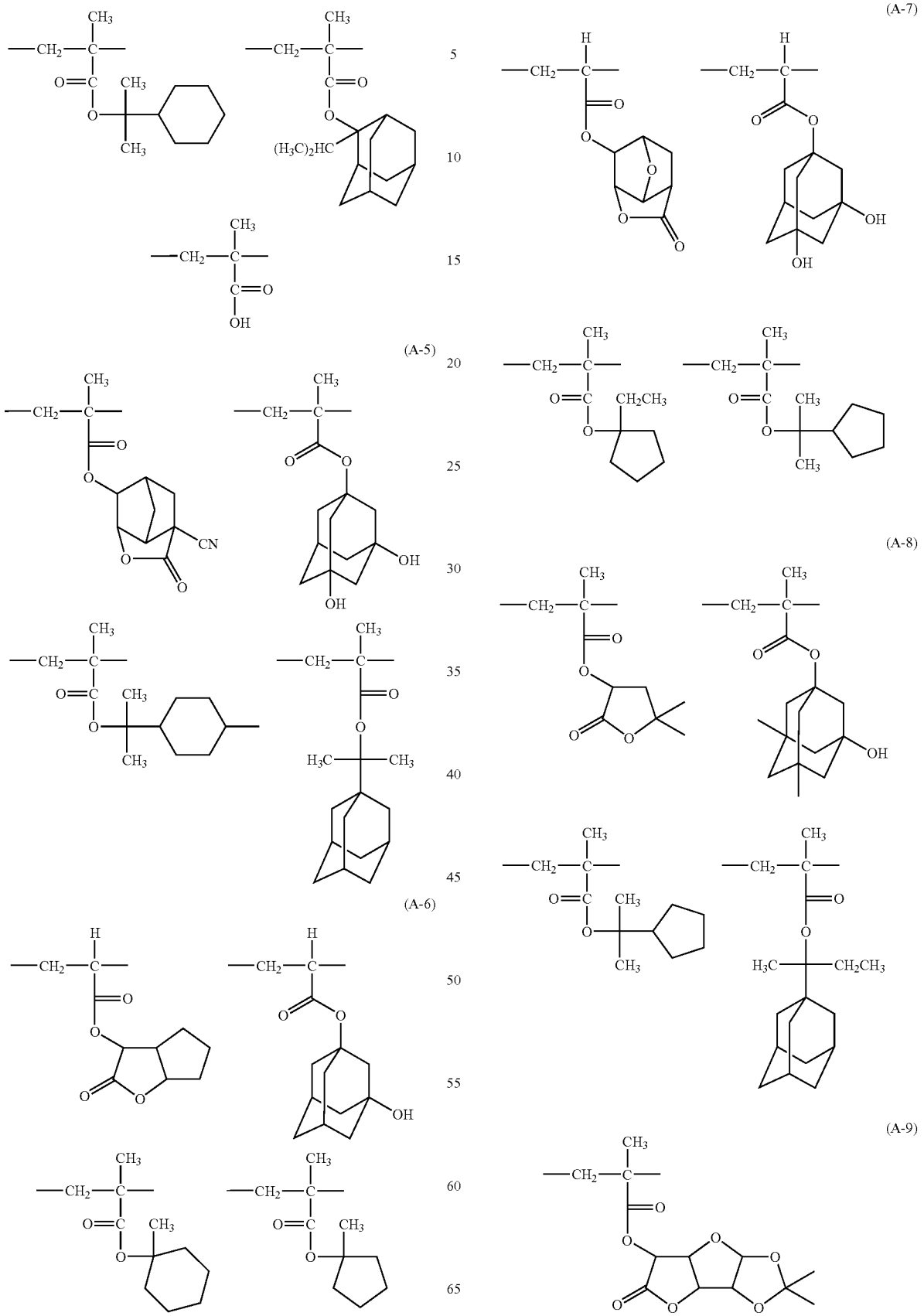

-continued
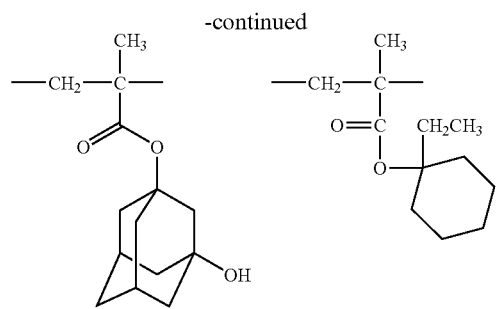
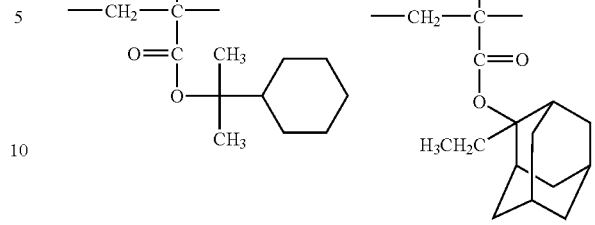
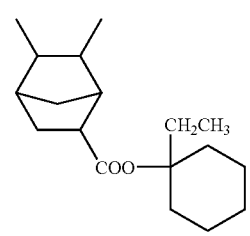
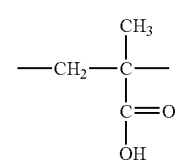
(A-10)
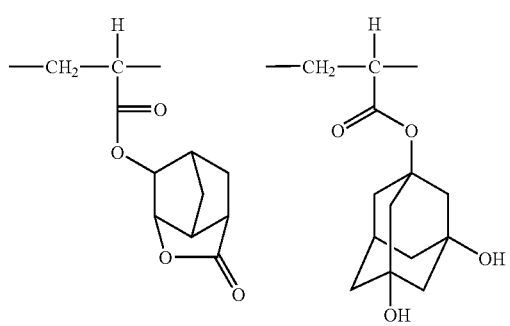
(A-12)
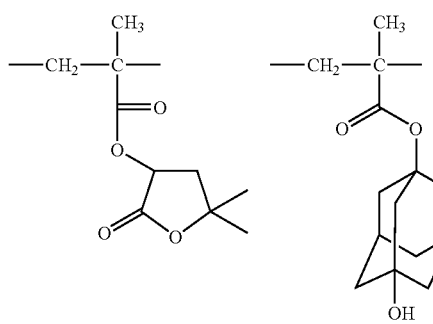
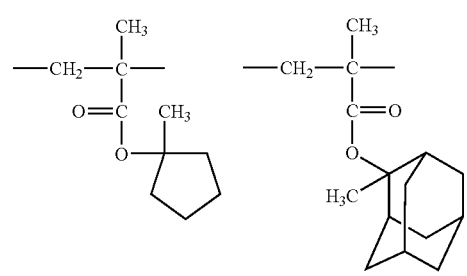
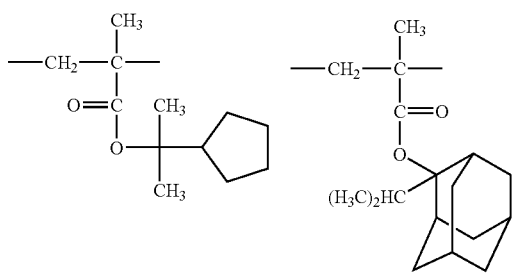
(A-11)
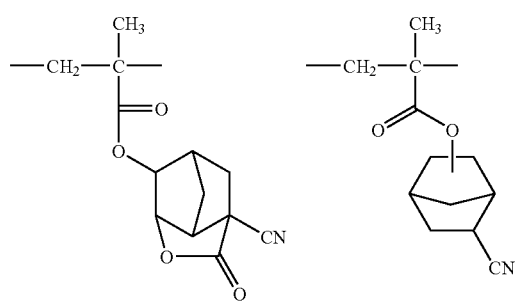
(A-13)
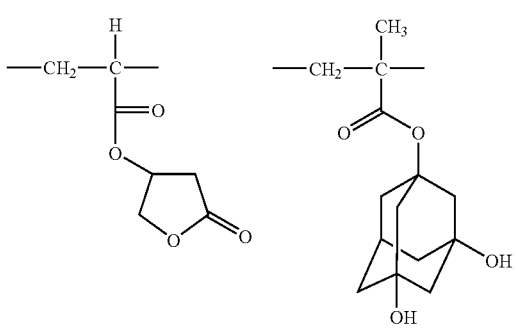

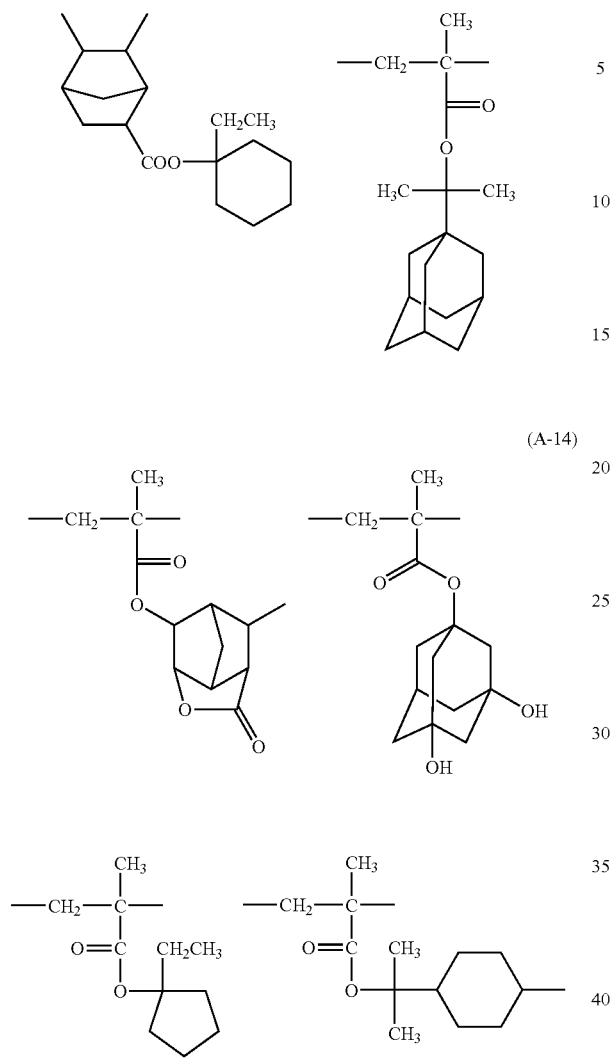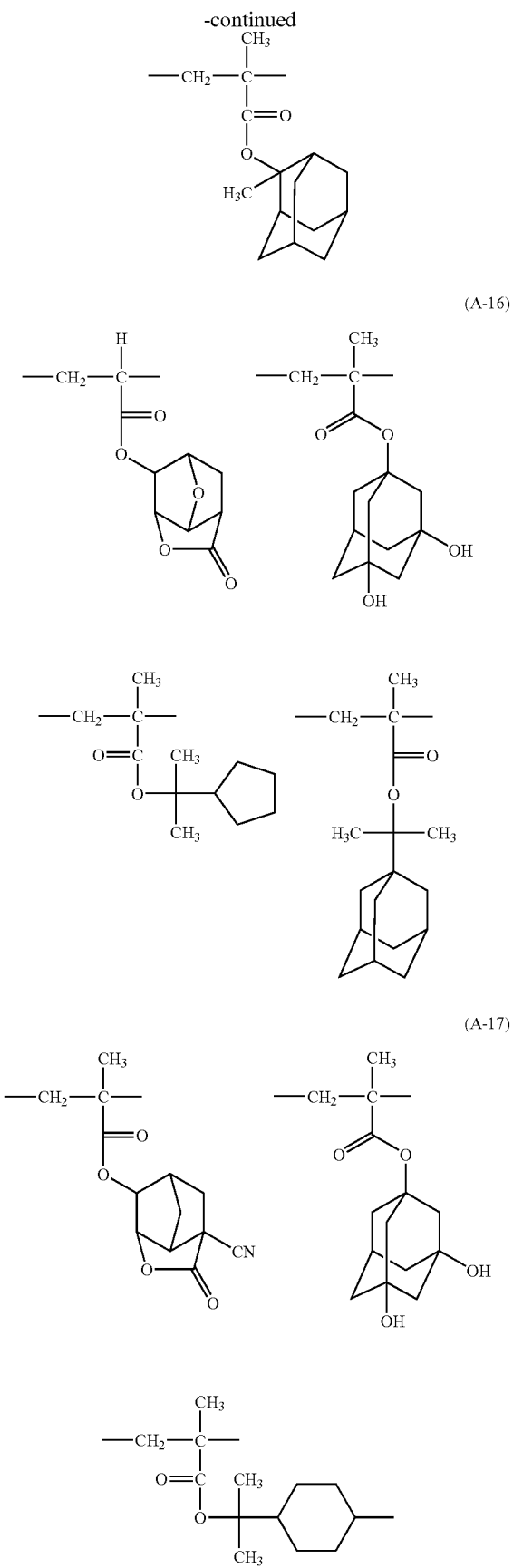

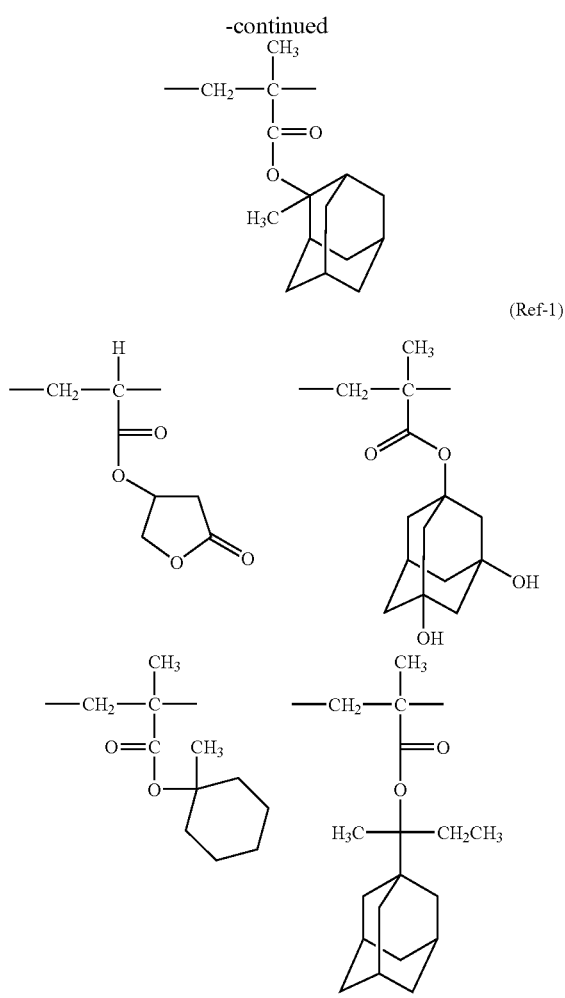

(Ref-1)

Preparation of Resist:

Components as shown in the following Table 3 was dissolved in a solvent to prepare a solution having a solids concentration of 5%, which was then filtered through a 0.1-μm polyethylene filter to prepare a positive working resist solution. The thus prepared positive working resist solution was evaluated in the following manners.

Evaluation of Standard Resist:

An antireflection film, ARC29A (manufactured by Brewers Science, Ltd.) was uniformly coated in a thickness of 780 angstroms on a silicon substrate by using a spin coater and dried on a hot plate at 205° C. for 60 seconds, followed by cooling to room temperature. Thereafter, each of the positive working resist solutions was coated by using a spin coater and dried at 120° C. for 60 seconds to form a resist film of 160 nm.

This resist film was exposed through a 90-nm 1/1 line-and-space mask by using an ArF excimer laser stepper (manufactured by manufactured by ASML, NA: 0.75) while changing the exposure amount. Immediately after the exposure, the resulting resist film was heated on a hot plate at 120° C. for 60 seconds and then cooled to room temperature. Furthermore, the resulting resist film was developed with a tetramethylammonium hydroxide aqueous solution (2.38% by mass) at 23° C. for 60 seconds, rinsed with pure water for 30 seconds and then dried to obtain a line pattern.

Evaluation of LWR:

The line pattern as finished in a thickness of 90 nm in the foregoing evaluation of standard resist was observed by using a scanning microscope (S9260, manufactured by Hitachi, Ltd.); and a distance of an edge in the longitudinal direction of the line pattern within a range of 2 μm from a standard line where the edge should be localized was measured at 50 points to determine a standard deviation, from which was then calculated 3σ. The smaller the value, the better the performance is.

Pattern Collapse Properties:

A line pattern of 90 nm (line/space=1/1) was formed in the same manner as in the foregoing evaluation method of LWR. In changing the exposure amount by 10 mJ.cm$^{-2}$ to the side of overexposure against an exposure amount E1 for reproducing this mask pattern, a pattern was observed by a scanning electron microscope (SEM). The case where pattern collapse was not caused is designated as "A"; the case where pattern collapse was caused a little is designated as "B"; and the case where pattern collapse was caused is designated as "C", respectively.

Sensitivity:

A minimum exposure amount at which a line pattern can be formed was defined as sensitivity.

Results of the foregoing evaluations are tabulated below.

TABLE 3

| | Composition | | | | | | Evaluation | | |
|---|---|---|---|---|---|---|---|---|---|
| | Resin (parts by mass) | Acid generator (part by mass) | Basic compound (part by mass) | Additive (part by mass) | Surfactant (part by mass) | Solvent (part by mass) | Sensitivity (mJ/cm$^2$) | LWR (nm) | Pattern collapse properties |
| Example 1 | A-1 (94.6) | z1 (4.5) | N-2 (0.35) | | W-1 (0.50) | SL-1/SL-5 (1140/760) | 10.0 | 6.0 | A |
| Example 2 | A-2 (94.0) | z2 (4.7) | N-3 (0.40) | AD-1 (0.5) | W-3 (0.50) | SL-1/SL-5/SL-8 (1354/531/15) | 9.5 | 6.1 | A |
| Example 3 | A-3 (92.8) | z1 (5.8) | N-5 (0.38) | AD-1 (0.5) | W-6 (0.50) | SL-2/SL-6/SL-8 (1354/531/15) | 10.2 | 6.4 | A |
| Example 4 | A-4 (92.7) | z2 (6.1) | N-6 (0.25) | AD-3 (0.5) | W-2 (0.50) | SL-1/SL-6 (1369/531) | 8.5 | 6.1 | A |
| Example 5 | A-5 (94.5) | z38 (4.2) z62 (2.5) | N-3 (0.40) N-5 (0.10) | | W-1 (0.50) | SL-1/SL-6 (1369/531) | 8.0 | 6.3 | A |
| Example 6 | A-6 (92.5) | z55 (4.0) z60 (2.5) | N-8 (0.52) | | W-6 (0.50) | SL-2/SL-5 (1656/244) | 9.1 | 6.0 | A |
| Example 7 | A-7 (92.7) | z65 (3.5) z1 (3.0) | N-1 (0.20) N-3 (0.10) | AD-2 (0.7) | W-1 (0.50) | SL-1/SL-6/SL-8 (1641/244/15) | 8.7 | 6.3 | B |

TABLE 3-continued

| | Composition | | | | | | Evaluation | | |
|---|---|---|---|---|---|---|---|---|---|
| | Resin (parts by mass) | Acid generator (part by mass) | Basic compound (part by mass) | Additive (part by mass) | Surfactant (part by mass) | Solvent (part by mass) | Sensitivity (mJ/cm$^2$) | LWR (nm) | Pattern collapse properties |
| Example 8 | A-8 (91.9) | z70 (2.2) z62 (4.4) | N-3 (0.35) | | W-4 (0.50) | SL-1/SL-6/SL-7 (1438/442/20) | 9.4 | 6.2 | A |
| Example 9 | A-9 (92.7) | z38 (3.5) z70 (3.0) | N-1 (0.20) N-2 (0.10) | | W-1 (0.50) | SL-1/SL-6 (1641/259) | 9.2 | 6.4 | A |
| Example 10 | A-10 (91.9) | z60 (2.2) z1 (4.4) | N-7 (0.35) | AD-2 (0.7) | W-4 (0.50) | SL-3/SL-4 (1438/462) | 10.3 | 6.2 | A |
| Example 11 | A-11 (94.6) | z62 (4.5) | N-3 (0.40) | | W-1 (0.50) | SL-1/SL-5 (1354/531) | 9.3 | 6.3 | A |
| Example 12 | A-12 (94.4) | z40 (4.5) | N-3 (0.40) | AD-1 (0.2) | W-1 (0.50) | SL-1/SL-5/SL-8 (1369/531/15) | 8.8 | 6.1 | B |
| Example 13 | A-13 (94.5) | z40 (4.7) | N-2 (0.35) | | W-3 (0.50) | SL-1/SL-5/SL-8 (1641/244/15) | 8.5 | 6.4 | A |
| Example 14 | A-14 (94.5) | z65 (4.7) | N-2 (0.35) | | W-3 (0.50) | SL-1/SL-5/SL-8 (1641/244/15) | 9.9 | 6.5 | A |
| Example 15 | A-15 (94.5) | z2 (4.7) | N-2 (0.35) | | W-3 (0.50) | SL-1/SL-5/SL-8 (1641/244/15) | 9.4 | 6.2 | A |
| Example 16 | A-16 (94.5) | z38 (4.7) | N-2 (0.35) | | W-3 (0.50) | SL-1/SL-5/SL-8 (1641/244/15) | 9.6 | 6.1 | B |
| Example 17 | A-17 (94.5) | z38 (4.7) | N-2 (0.35) | | W-3 (0.50) | SL-1/SL-5/SL-8 (1641/244/15) | 8.6 | 6.3 | A |
| Comparative Example 1 | Ref-1 (94.5) | z1 (4.7) | N-2 (0.35) | | W-1 (0.50) | SL-1/SL-5 (1140/760) | 25.0 | 7.5 | C |

Compounds corresponding to the abbreviations in Tables are as follows.

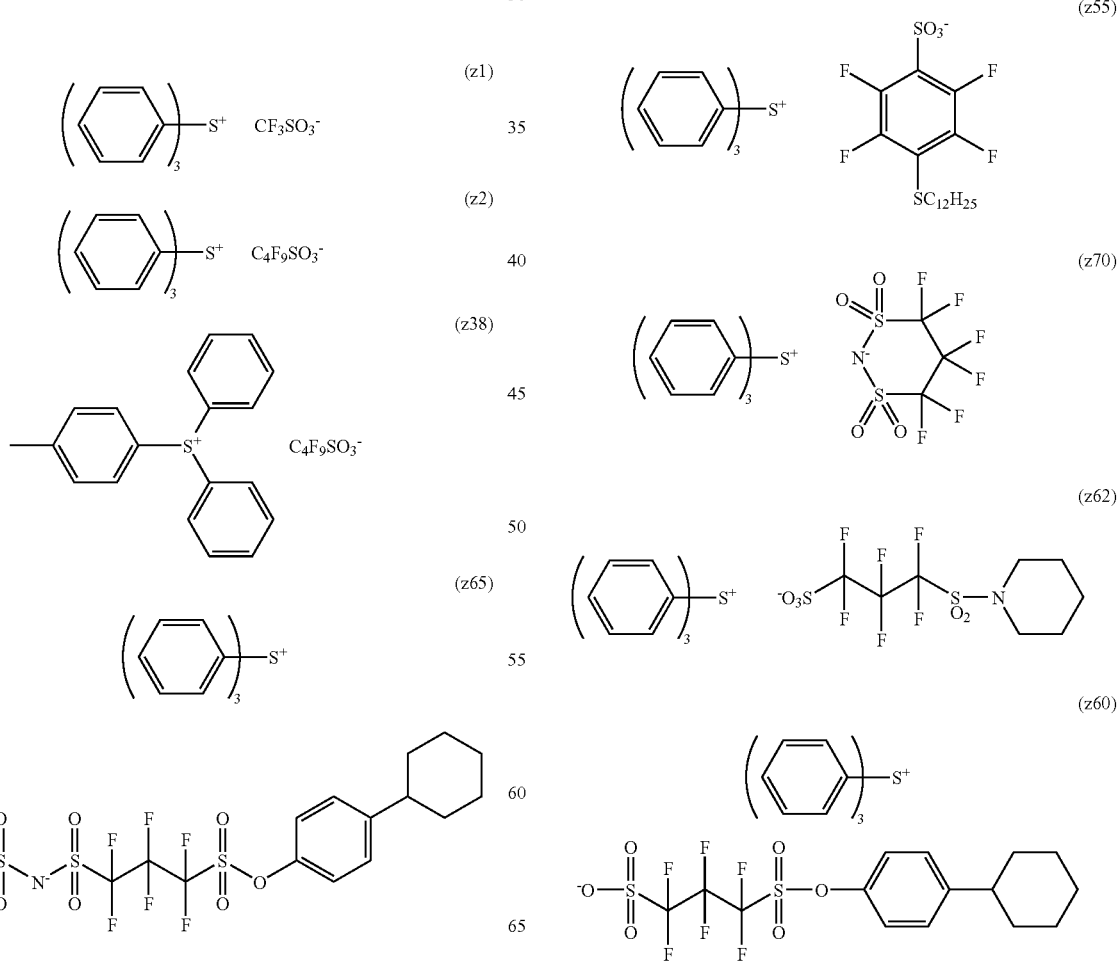

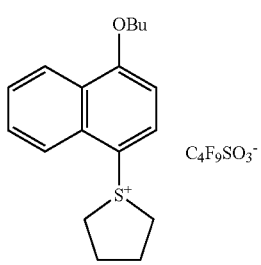

(z40)

N-1: N,N-Dibutylaniline
N-2: Trioctylamine
N-3: N,N-Dihydroxyethylaniline
N-4: 2,4,5-Triphenyl imidazole
N-5: 2,6-Diisopropylaniline
N-6: Hydroxyantipyrine
N-7: Trismethoxymethoxyethylamine
N-8: Triethanolamine

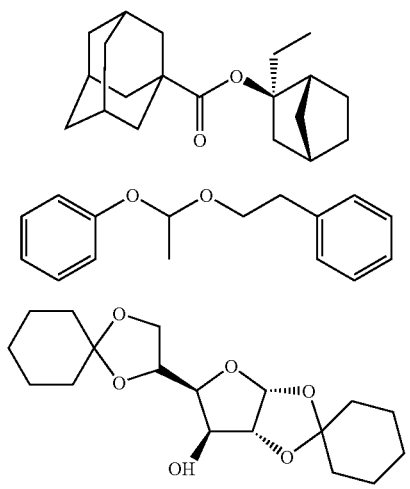

AD-1

AD-2

AD-3

W-1: MEGAFAC F176 (manufactured by Dainippon Ink and Chemicals, Incorporated) (fluorine based surfactant)

W-2: MEGAFAC R08 (manufactured by Dainippon Ink and Chemicals, Incorporated) (fluorine and silicon based surfactant)

W-3: Polysiloxane polymer, KP-341 (manufactured by Shin-Etsu Chemical Co., Ltd.) (silicon based surfactant)

W-4: TROYSOL S-366 (manufactured by Troy Chemical Corporation) (silicon based surfactant)

W-5: KH-20 (manufactured by Asahi Kasei Corporation)

W-6: PF6320 (manufactured by OMNOVA Solutions Inc.)

W-7: PF6520 (manufactured by OMNOVA Solutions Inc.)

Group a
SL-1: Propylene glycol monomethyl ether acetate
SL-2: Propylene glycol monomethyl ether propionate
SL-3: 2-Heptanone Group b
SL-4: Ethyl lactate
SL-5: Propylene glycol monomethyl ether
SL-6: Cyclohexanone Group c
SL-7: γ-Butyrolactone
SL-8: Propylene carbonate It is evident from Table 3 that the positive working photosensitive composition of the invention has high sensitivity as compared with that of the related art and is able to make pattern collapse properties and LWR compatible with each other on a high level.

Evaluation of Liquid Immersion Exposure:

This condition is one for forming a resist pattern by a liquid immersion exposure method using pure water.

An organic antireflection film, ARC29A (manufactured by Nissan Chemical Industries, Ltd.) was coated on a silicon wafer and baked at 205° C. for 60 seconds to form a 78 nm-thick antireflection film. Each of the positive working resist compositions as shown in Table 4 was coated thereon and baked at 120° C. for 90 seconds to form a 250 nm-thick resist film.

The obtained wafer was pattern exposed by using an ArF excimer laser liquid immersion scanner (NA: 0.75). Extra-pure water having not more than 5 ppb of impurities was used as the liquid immersion liquid. Thereafter, the resulting wafer was heated at 120° C. for 60 seconds, developed with a tetramethylammonium hydroxide aqueous solution (2.38% by mass) for 30 seconds, rinsed with pure water and then spin dried. It was thus confirmed that a resist pattern could be formed.

TABLE 4

| | Resin (parts by mass) | Acid generator (part by mass) | Basic compound (part by mass) | Additive (part by mass) | Hydrophobic resin (part by mass) | Surfactant (part by mass) | Solvent (part by mass) |
|---|---|---|---|---|---|---|---|
| Example 18 | A-1 (94.6) | z1 (4.5) | N-2 (0.35) | | HR-1 (0.7) | W-1 (0.50) | SL-1/SL-5 (1140/760) |
| Example 19 | A-2 (94.0) | z2 (4.7) | N-3 (0.40) | AD-1 (0.5) | HR-1 (0.7) | W-3 (0.50) | SL-1/SL-5/SL-8 (1354/531/15) |
| Example 20 | A-3 (92.8) | z1 (5.8) | N-5 (0.38) | AD-1 (0.5) | HR-1 (0.7) | W-6 (0.50) | SL-2/SL-6/SL-8 (1354/531/15) |
| Example 21 | A-4 (92.7) | z2 (6.1) | N-6 (0.25) | AD-3 (0.5) | HR-1 (0.7) | W-2 (0.50) | SL-1/SL-6 (1369/531) |
| Example 22 | A-5 (94.5) | z38 (4.2) z62 (2.5) | N-3 (0.40) N-5 (0.10) | | HR-8 (0.4) | W-1 (0.50) | SL-1/SL-6 (1369/531) |
| Example 23 | A-6 (92.5) | z55 (4.0) z60 (2.5) | N-8 (0.52) | | HR-8 (0.4) | W-6 (0.50) | SL-2/SL-5 (1656/244) |
| Example 24 | A-7 (92.7) | z65 (3.5) z1 (3.0) | N-1 (0.20) N-3 (0.10) | AD-2 (0.7) | HR-8 (0.4) | W-1 (0.50) | SL-1/SL-6/SL-8 (1641/244/15) |
| Example 25 | A-8 (91.9) | z70 (2.2) z62 (4.4) | N-3 (0.35) | | HR-8 (0.4) | W-4 (0.50) | SL-1/SL-6/SL-7 (1438/442/20) |

TABLE 4-continued

|  | Resin (parts by mass) | Acid generator (part by mass) | Basic compound (part by mass) | Additive (part by mass) | Hydrophobic resin (part by mass) | Surfactant (part by mass) | Solvent (part by mass) |
|---|---|---|---|---|---|---|---|
| Example 26 | A-9 (92.7) | z38 (3.5) z70 (3.0) | N-1 (0.20) N-2 (0.10) |  | HR-25 (0.3) | W-1 (0.50) | SL-1/SL-6 (1641/259) |
| Example 27 | A-10 (91.9) | z60 (2.2) z1 (4.4) | N-7 (0.35) | AD-2 (0.7) | HR-25 (0.3) | W-4 (0.50) | SL-3/SL-4 (1438/462) |
| Example 28 | A-11 (94.6) | z62 (4.5) | N-3 (0.40) |  | HR-25 (0.3) | W-1 (0.50) | SL-1/SL-5 (1354/531) |
| Example 29 | A-12 (94.4) | z40 (4.5) | N-3 (0.40) | AD-1 (0.2) | HR-37 (0.9) | W-1 (0.50) | SL-1/SL-5/SL-8 (1369/531/15) |
| Example 30 | A-13 (94.5) | z40 (4.7) | N-2 (0.35) |  | HR-37 (0.9) | W-3 (0.50) | SL-1/SL-5/SL-8 (1641/244/15) |
| Example 31 | A-14 (94.5) | z65 (4.7) | N-2 (0.35) |  | HR-45 (1.2) | W-3 (0.50) | SL-1/SL-5/SL-8 (1641/244/15) |
| Example 32 | A-15 (94.5) | z2 (4.7) | N-2 (0.35) |  | HR-45 (1.2) | W-3 (0.50) | SL-1/SL-5/SL-8 (1641/244/15) |
| Example 33 | A-16 (94.5) | z38 (4.7) | N-2 (0.35) |  | HR-50 (0.5) | W-3 (0.50) | SL-1/SL-5/SL-8 (1641/244/15) |
| Example 34 | A-17 (94.5) | z38 (4.7) | N-2 (0.35) |  | HR-50 (0.5) | W-3 (0.50) | SL-1/SL-5/SL-8 (1641/244/15) |

It has been confirmed from the foregoing results that the positive working photosensitive composition of the invention can also be suitably used for the pattern formation by means of ArF liquid immersion exposure.

According to the invention, a positive working resist composition to be used for the formation of a fine pattern in, for example, the manufacture of semiconductors, which has high sensitivity as compared with products of the related art and which is able to make pattern collapse properties and scattering properties in line width (LWR) compatible with each other and a pattern forming method using this positive working resist composition.

The entire disclosure of each and every foreign patent application from which the benefit of foreign priority has been claimed in the present application is incorporated herein by reference, as if fully set forth.

What is claimed is:

1. A positive working resist composition comprising:
  (A) a resin comprising: a repeating unit having a first group represented by any of general formulae (pI) to (pV); and a repeating unit having a second group represented by any of general formulae (pI) to (pV), the first group being different from the second group; and a structure represented by formula (1) in an end terminal of the resin, in which the resin decomposes by action of an acid to increase its solubility in an alkaline developer,
  (B) a compound capable of generating an acid upon irradiation with actinic rays or radiation; and
  (C) a solvent:

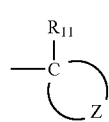
(pI)

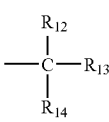
(pII)

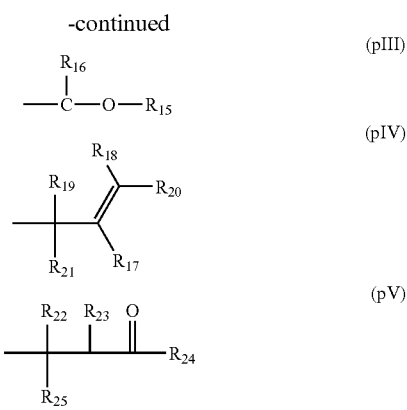

wherein $R_{11}$ represents an alkyl group or a cycloalkyl group,

Z represents an atomic group necessary for forming a cycloalkyl group together with a carbon atom, $R_{12}$ to $R_{16}$ each independently represents an alkyl group or a cycloalkyl group, provided that at least one of $R_{12}$ to $R_{14}$ represents a cycloalkyl group and that either $R_{15}$ or $R_{16}$ represents a cycloalkyl group, $R_{17}$ to $R_{21}$ each independently represents a hydrogen atom, an alkyl group or a cycloalkyl group, provided that at least one of $R_{17}$ to $R_{21}$ represents a cycloalkyl group and that either $R_{19}$ or $R_{21}$ represents an alkyl group or a cycloalkyl group, and $R_{22}$ to $R_{25}$ each independently represents a hydrogen atom, an alkyl group or a cycloalkyl group, provided that at least one of $R_{22}$ to $R_{25}$ represents a cycloalkyl group and that $R_{23}$ and $R_{24}$ may be taken together to form a ring,

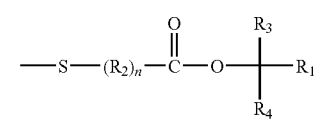
(1)

wherein
- $R_1$ represents an alkyl group, a cycloalkyl group or an aryl group,
- $R_2$ represents an alkylene group, a cycloalkylene group or an arylene group,
- $R_3$ and $R_4$ each independently represents a hydrogen atom, an alkyl group, a cycloalkyl group, an alkenyl group or an aryl group, provided that at least one of $R_3$ and $R_4$ is not a hydrogen atom and that $R_3$ or $R_4$ may be bound to adjacent $R_1$ to form a ring structure, and
- n represents 0 or 1.

2. The positive working resist composition according to claim 1,
wherein the resin (A) further has a lactone group-containing repeating unit.

3. The positive working resist composition according to claim 1,
wherein the resin (A) further has a repeating unit having a polar group-substituted alicyclic hydrocarbon structure.

4. The positive working resist composition according to claim 1,
wherein the resin (A) further has an alkali-soluble group-containing repeating unit.

5. A pattern forming method comprising:
forming a film by the positive working resist composition according to claim 1; and
exposing and developing the film.

* * * * *